United States Patent
Ozdoganlar et al.

(10) Patent No.: US 11,805,597 B2
(45) Date of Patent: Oct. 31, 2023

(54) LIQUID METAL CIRCUITS AND METHODS OF MAKING THE SAME

(71) Applicant: Carnegie Mellon University, Pittsburgh, PA (US)

(72) Inventors: O Burak Ozdoganlar, Sewickley, PA (US); Carmel Majidi, Pittsburgh, PA (US); Kadri Bugra Ozutemiz, Pittsburgh, PA (US); James Wissman, Hyattsville, MD (US)

(73) Assignee: CARNEGIE MELLON UNIVERSITY, Pittsburgh, PA (US)

( * ) Notice: Subject to any disclaimer, the term of this patent is extended or adjusted under 35 U.S.C. 154(b) by 289 days.

(21) Appl. No.: 16/817,176

(22) Filed: Mar. 12, 2020

(65) Prior Publication Data
US 2020/0296825 A1    Sep. 17, 2020

Related U.S. Application Data

(60) Provisional application No. 62/919,401, filed on Mar. 12, 2019.

(51) Int. Cl.
*H05K 3/12* (2006.01)
*H05K 1/02* (2006.01)
*H01L 23/498* (2006.01)
*H01Q 1/36* (2006.01)
(Continued)

(52) U.S. Cl.
CPC ....... *H05K 1/0283* (2013.01); *H01L 21/4846* (2013.01); *H01L 23/4985* (2013.01); *H01Q 1/364* (2013.01); *H05K 3/1208* (2013.01); *H05K 3/1216* (2013.01); *H05K 3/1241* (2013.01); *H05K 3/1258* (2013.01); *H05K 3/388* (2013.01)

(58) Field of Classification Search
CPC .. H05K 1/0283; H05K 3/1208; H05K 3/1258; H05K 3/1216; H05K 3/388; H05K 3/1241; H01L 23/4985
See application file for complete search history.

(56) References Cited

U.S. PATENT DOCUMENTS 6,937,038 B2 *  8/2005  Maruyama ......... G01R 1/06733
                                                324/754.04
7,557,367 B2 *  7/2009  Rogers ............. H01L 21/02628
                                                257/40
(Continued)

FOREIGN PATENT DOCUMENTS

CN        108076591 A  *  5/2018  ..... H01L 31/022425

OTHER PUBLICATIONS

Cheng, S. et al., Microfluidic stretchable RF electronics, Lab Chip, 2010, 10, 3227-3234.
(Continued)

*Primary Examiner* — Jeffrey T Carley
(74) *Attorney, Agent, or Firm* — Dentons Cohen & Grigsby P.C.

(57) ABSTRACT

A high-throughput method of manufacturing a liquid metal circuit may include applying a liquid metal to an alloying metal pattern on an elastic substrate to form the liquid metal circuit. The elastic substrate may have a surface area greater than 1 square inch. The liquid metal circuit may include a plurality of liquid metal circuits on the elastic substrate. Methods of using the liquid metal circuit are also described.

17 Claims, 33 Drawing Sheets

(51) Int. Cl.
  H05K 3/38    (2006.01)
  H01L 21/48   (2006.01)

(56) References Cited

U.S. PATENT DOCUMENTS

| | | | | |
|---|---|---|---|---|
| 8,097,926 | B2* | 1/2012 | De Graff | H01L 27/14618 257/419 |
| 9,872,390 | B1* | 1/2018 | Holbery | H01L 23/49872 |
| 10,985,446 | B1* | 4/2021 | Baur | H01Q 3/01 |
| 2005/0205136 | A1* | 9/2005 | Freeman | A01K 11/006 137/554 |
| 2008/0157235 | A1* | 7/2008 | Rogers | H05K 1/0283 257/415 |
| 2010/0238636 | A1* | 9/2010 | Mascaro | H05K 3/143 361/749 |
| 2012/0135660 | A1* | 5/2012 | Sekiya | H01L 51/524 445/23 |
| 2016/0366760 | A1* | 12/2016 | Lee | H05K 1/0283 |
| 2018/0002786 | A1* | 1/2018 | Freydina | C25D 11/04 |
| 2019/0110363 | A1* | 4/2019 | Bao | H01R 12/00 |
| 2020/0413533 | A1* | 12/2020 | Majidi | G06F 1/1658 |
| 2021/0391190 | A1* | 12/2021 | Ohashi | H01L 21/68728 |

OTHER PUBLICATIONS

Lu, T. et al.l, Soft Anisotropic Conductors as Electric Vias for Ga-Based Liquid Metal Circuits, ACS Appl. Mater. Interfaces 2015, 7, 26923-26929.
Lu, T. et al., Soft-Matter Printed Circuit Board with UV Laser Micropatterning, ACS Appl. Mater. Interfaces 2017, 9, 22055-22062.
Dickey, M., Stretchable and Soft Electronics using Liquid Metals, Adv. Mater. 2017, 29, 1606425.
Gates, B. et al., New Approaches to Nanofabrication: Molding, Printing, and Other Techniques, Chem. Rev. 2005, 105, 1171-1196.
Kim, D. et al., Flexible and Stretchable Electronics for Biointegrated Devices, Annu. Rev. Biomed. Eng. 2012. 14:113-28.
Khang, D. et al., Mechanical Buckling: Mechanics, Metrology, and Stretchable Electronics, Adv. Funct. Mater. 2009,19, 1526-153.
Krammer, O., Modelling the self-alignment of passive chip components during reflow soldering, Microelectronics Reliability 54 (2014) 457-463.
Dickey, M., Emerging Applications of Liquid Metals Featuring Surface Oxides, ACS Appl. Mater. Interfaces 2014, 6, 18369-18379.
Zhang, Y. et al., Experimental and Theoretical Studies of Serpentine Microstructures Bonded To Prestrained Elastomers for Stretchable Electronics, Adv. Funct. Mater. 2014, 24, 2028-2037.
Hammock, M. et al., 25th Anniversary Article: The Evolution of Electronic Skin (E-Skin): A Brief History, Design Considerations, and Recent Progress, Adv. Mater. 2013, 25, 5997-6038.
Dickey, M. et al., Eutectic Gallium-Indium (EGain): A Liquid Metal Alloy for the Formation of Stable Structures in Microchannels at Room Temperature, Adv. Funct. Mater. 2008, 18, 1097-1104.
Kaltenbrunner, M. et al., An ultra-lightweight design for imperceptible plastic electronics, Jul. 25, 2013 , vol. 499, Nature, 458-463.
Martinez, V. et al., Stretchable Silver Nanowire-Elastomer Composite Microelectrodes with Tailored Electrical Properties, ACS Appl. Mater. Interfaces 2015, 7, 13467-13475.
Takahashi, T. et al., Carbon Nanotube Active-Matrix Backplanes for Conformal Electronics and Sensors, Nano Lett. 2011, 11, 5408-5413.
Ozutemiz, K. et al., EGaln-Metal Interfacing for Liquid Metal Circuitry and Microelectronics Integration, Adv. Mater. Interfaces 2018, 5, 1701596, 1-13.
Lipomi, D. et al., Skin-like pressure and strain sensors based on transparent elastic films of carbon nanotubes, Nature Nanotechnology, vol. 6, Dec. 2011, 788-792.
Abbati, G. et al., Polyurethane-Polyaniline Conducting Graft Copolymer with Improved Mechanical Properties, Journal of Applied Polymer Science, vol. 89, 2516-2521 (2003).
Carone, E. et al., New Conducting Thermoplastic Elastomers. I.Synthesisand Chemical Characterization, Journalof AppliedPolymerScience, vol. 83, 857-867 (2002).
Kim, D. et al., Epidermal Electronics, Aug. 12, 2011, vol. 333, Science, 838-843.
Xu, S. et al., Stretchable batteries with self-similar serpentine interconnects and integrated wireless recharging systems, Nat. Commun. 4:1543 doi: 10.1038/ncomms2553 (2013).
Kim, D. et al., Materials and noncoplanar mesh designs for integrated circuits with linear elastic responses to extreme mechanical deformations, PNAS, Dec. 2, 2008, vol. 105, No. 48, 18675-18680.
Lacour, S. et al., Stretchable Interconnects for Elastic Electronic Surfaces, Proceedings of the IEEE, vol. 93, No. 8, Aug. 2005, 1459-1467.
Zhu, S. et al., Ultrastretchable Fibers with Metallic Conductivity Using a Liquid Metal Alloy Core, Adv. Funct. Mater. 2013, 23, 2308-2314.
Liu, T. et al., Characterization of Nontoxic Liquid-Metal Alloy Galinstan for Applications in Microdevices, Journal of Microelectromechanical Systems, vol. 21, No. 2, April 201, 443-450.
Lu, Y. et al., Transformable liquid-metal nanomedicine, Nature Communications | 6:10066 | DOI: 10.1038/ncomms10066 | www.nature.com/naturecommunications (2015).
Zheng, Y. et al., Personal electronics printing via tapping mode composite liquid metal ink delivery and adhesion mechanism, Sci. Rep. 4, 4588 (2014).
Wang, Q. et al., Fast Fabrication of Flexible Functional Circuits Based on Liquid Metal Dual-Trans Printing, Adv. Mater. 2015, 27, 7109-7116.
Boley, J. et al., Direct Writing of Gallium-Indium Alloy for Stretchable Electronics, Adv. Funct. Mater. 2014, 24, 3501-3507.
Zheng, Y. et al., Direct Desktop Printed-Circuits-on-Paper Flexible Electronics, Scientific Reports, 3 : 1786, DOI: 10.1038/srep01786.
Ladd, C. et al., 3D Printing of Free Standing Liquid Metal Microstructures, Adv. Mater. 2013, 25, 5081-5085.
Gannarapu, A. et al., Freeze-Printing of Liquid Metal Alloys for Manufacturing of 3D, Conductive, and Flexible Networks, Adv. Mater. Technol. 2016, 1, 1600047.
Park, Y. et al., Hyperelastic pressure sensing with a liquid-embedded elastomer, J. Micromech. Microeng. 20 (2010) 125029 (6pp).
Fassler, A. et al., 3D structures of liquid-phase Gain alloy embedded in PDMS with freeze casting, Lab Chip, 2013, 13, 4442.
Fassler, A. et al., Soft-matter capacitors and inductors for hyperelastic strain sensing and stretchable electronics, Smart Mater. Struct. 22 (2013) 055023 (8pp).
Kim, D. et al., Gallium-Based Liquid Metal Inkjet Printing, MEMS 2014, San Francisco, CA, USA, Jan. 26-30, 201, IEEE, 967-970.
Li, G. et al., A galinstan-based inkjet printing system for highly stretchable electronics with self-healing capability, Lab Chip, 2016, 16, 1366.
Lu, T. et al., Rapid Prototyping for Soft-Matter Electronics, Adv. Funct. Mater. 2014, 24, 3351-3356.
Tabatabai, A. et al., Liquid-Phase Gallium-Indium Alloy Electronics with Microcontact Printing, Langmuir 2013, 29, 6194-6200.
Gozen, B. et al., High-Density Soft-Matter Electronics with Micron-Scale Line Width, Adv. Mater. 2014, 26, 5211-5216.
Jeong, Y. et al., A skin-attachable, stretchable integrated system based on liquid GaInSn for wireless human motion monitoring with multi-site sensing capabilities, NPG Asia Materials (2017) 9, e443.
Li, G. et al., Selectively plated stretchable liquid metal wires for transparent electronics, Sensors and Actuators B 221 (2015) 1114-1119.
Hirsch, A. et al., Intrinsically Stretchable Biphasic (Solid-Liquid) Thin Metal Films, Adv. Mater. 2016, 28, 4507-4512.
Kim, H. et al., A Biaxial Stretchable Interconnect With Liquid-Alloy-Covered Joints on Elastomeric Substrate, Journal of Microelectromechanical Systems, vol. 18, No. 1, Feb. 2009, 138-146.
Kramer, R. et al., Masked Deposition of Gallium-Indium Alloys for Liquid-Embedded Elastomer Conductors, Adv. Funct. Mater. 2013, 23, 5292-5296.

(56) References Cited

OTHER PUBLICATIONS

Kim, M. et al., Size-Scalable and High-Density Liquid-Metal-Based Soft Electronic Passive Components and Circuits Using Soft Lithography, Adv. Funct. Mater. 2017, 27, 1604466.
Moon, Y. et al., Freely Deformable Liquid Metal Grids as Stretchable and Transparent Electrodes, IEEE Transactions On Electron Devices, vol. 64, No. 12, Dec. 2017, 5157-5162.
Jeong, S. et al., Liquid alloy printing of microfluidic stretchable electronics, Lab Chip, 2012, 12, 4657-4664.
Wissman, J. et al., Soft-Matter Electronics with Stencil Lithography, Proc. IEEE Sensors, pp. 3-6, 2013.
Jeong, S. et al., Tape Transfer Atomization Patterning of Liquid Alloys for Microfluidic Stretchable Wireless Power Transfer, Scientific Reports, 5:8419.
Khan, M. et al., Localized Instabilities of Liquid Metal Films via In-Plane Recapillarity, Adv. Mater. Interfaces 2016, 3, 1600546.
Koo, H. et al., Towards All-Soft Matter Circuits: Prototypes of Quasi-Liquid Devices with Memristor Characteristics, Adv. Mater. 2011, 23, 3559-3564.
So, J. et al., Ionic Current Rectification in Soft-Matter Diodes with Liquid-Metal Electrodes, Adv. Funct. Mater. 2012, 22, 625-631.
Huang, Y. et al., Microfluidic serpentine antennas with designed mechanical tunability, Lab Chip,2014, 14,4205.
So, J. et al., Reversibly Deformable and Mechanically Tunable Fluidic Antennas, Adv. Funct. Mater. 2009,19, 3632-363.
Diebold, A. et al., Electrowetting-actuated liquid metal for RF applications, 2017 J. Micromech. Microeng. 27 025010.
Zhang, B. et al., Flexible packaging of solid-state integrated circuit chips with elastomeric microfluidics, Scientific Reports, 3:1098, DOI: 10.1038/srep01098.
Park, C. et al., Photolithography-Based Patterning of Liquid Metal Interconnects for Monolithically Integrated Stretchable Circuits, ACS Appl. Mater. Interfaces 2016, 8, 15459-15465.

\* cited by examiner

| | | Yaw (deg) | Pitch (deg) | Roll (deg) | Height (um) | Ecc X (um) | Ecc Y (um) |
|---|---|---|---|---|---|---|---|
| Before | Mean | 6.79 | 2.62 | 4.96 | 568.52 | 54.11 | 153.34 |
| | Std.dev. | 4.63 | 2.10 | 3.57 | 27.71 | 46.98 | 61.83 |
| After | Mean | 1.56 | 0.59 | 0.42 | 455.13 | 35.03 | 39.69 |
| | Std.dev. | 1.96 | 0.44 | 0.37 | 7.41 | 42.25 | 42.83 |

| Parameter | Sum of Squares | Degree of Freedom | Mean Squares | F-value | p-value | $\eta^2$ | $\omega^2$ |
|---|---|---|---|---|---|---|---|
| Orientation | 2180.3 | 2 | 1090.17 | 1018.24 | 1.72×10$^{-126}$ | 0.142 | 0.142 |
| Width | 6129 | 2 | 3064.48 | 2862.28 | 1.73×10$^{-182}$ | 0.399 | 0.399 |
| Speed | 3444.7 | 5 | 688.94 | 643.49 | 1.05×10$^{-147}$ | 0.224 | 0.224 |
| Orientation x Width | 1401.5 | 4 | 350.37 | 327.25 | 3.2×10$^{-102}$ | 0.091 | 0.091 |
| Orientation x Speed | 208.4 | 10 | 20.84 | 19.46 | 7.11×10$^{-27}$ | 0.0136 | 0.0129 |
| Width x Speed | 1536.8 | 10 | 153.68 | 143.54 | 6.51×10$^{-102}$ | 0.1 | 0.099 |
| Orientation x Width x Speed | 168.7 | 20 | 8.43 | 7.88 | 9×10$^{-18}$ | 0.011 | 0.0096 |
| Error | 289.1 | 270 | 1.07 | | | | |
| Total | 15358.5 | 323 | | | | | |

Table A.1: ANOVA table for average peak height. Statistically significant p-values (p<0.05) are designated with bold font.

FIG. 37

| Parameter | Sum of Squares | Degree of Freedom | Mean Squares | F-value | p-value | $\eta^2$ | $\omega^2$ |
|---|---|---|---|---|---|---|---|
| Orientation | 0.588 | 2 | 0.2942 | 0.42 | 0.657 | 0.002 | -0.0028 |
| Width | 62.986 | 2 | 31.4931 | 45.05 | 0 | 0.221 | 0.216 |
| Speed | 10.206 | 5 | 2.0411 | 2.92 | 0.0138 | 0.036 | 0.0235 |
| Orientation x Width | 0.534 | 4 | 0.1335 | 0.19 | 0.943 | 0.0019 | -0.008 |
| Orientation x Speed | 10.79 | 10 | 1.079 | 1.54 | 0.1239 | 0.0378 | 0.0133 |
| Width x Speed | 3.286 | 10 | 0.3286 | 0.47 | 0.9085 | 0.0115 | -0.013 |
| Orientation x Width x Speed | 7.892 | 20 | 0.3946 | 0.56 | 0.9345 | 0.0276 | -0.0213 |
| Error | 188.757 | 270 | 0.6991 | | | | |
| Total | 285.039 | 323 | | | | | |

Table A.2: ANOVA table for peak height variation. Statistically significant p-values (p<0.05) are designated with bold font.

FIG. 38

| Orientation (deg) | Width ($\mu$m) | Slope ($\frac{\partial log(h_p)}{\partial log(U)}$) |
|---|---|---|
| 0 | 50 | 0.118 (0.025) |
| 0 | 100 | 0.273 (0.012) |
| 0 | 200 | 0.264 (0.018) |
| 45 | 50 | 0.202 (0.048) |
| 45 | 100 | 0.291 (0.016) |
| 45 | 200 | 0.31 (0.015) |
| 90 | 50 | 0.189 (0.045) |
| 90 | 100 | 0.28 (0.023) |
| 90 | 200 | 0.261 (0.016) |

Table A.3: Estimated slopes for the logarithmic relationship between withdrawal speed and average peak height for withdrawal speeds larger than 10 mm/s. The values in parentheses are the standard error (one standard deviation) for slope estimation. ANOVA table for peak height variation. Statistically significant p-values (p<0.05) are designated with bold font.

FIG. 39

| Orientation (deg) | Width (um) | Withdrawal Speed (mm/s) | Ratio ($h_p/W$) |
|---|---|---|---|
| 0 | 50 | 0.1 | 0.0313 (0.0062) |
| 0 | 50 | 1 | 0.0337 (0.0037) |
| 0 | 100 | 0.1 | 0.0261 (0.0074) |
| 0 | 100 | 1 | 0.025 (0.0074) |
| 0 | 200 | 0.1 | 0.0225 (0.0034) |
| 0 | 200 | 1 | 0.025 (0.0034) |
| 45 | 50 | 0.1 | 0.0285 (0.0068) |
| 45 | 50 | 1 | 0.0326 (0.0013) |
| 45 | 100 | 0.1 | 0.0219 (0.0075) |
| 45 | 100 | 1 | 0.026 (0.0019) |
| 45 | 200 | 0.1 | 0.023 (0.0029) |
| 45 | 200 | 1 | 0.025 (0.0057) |

Table A.4: Average peak height to width ratios for constant liquid metal deposition height region where the withdrawal speed is smaller than 10 mm/s for 0 and 45 degree orientations. The values in parentheses are the standard error (one standard deviation) for ratio estimation. The average ratio is computed from the values in the table as 0.0267 with a standard deviation of 0.0038.

FIG. 40

LIQUID METAL CIRCUITS AND METHODS OF MAKING THE SAME

CROSS REFERENCE TO RELATED APPLICATION

This application claims the benefit of U.S. Provisional Application No. 62/919,401, filed Mar. 12, 2019, the entire contents of which is incorporated herein by reference.

GOVERNMENT RIGHTS

This invention was made with government support under grant numbers N00014-16-2301 and N00014-14-10778 awarded by the Office of Naval Research (ONR) and N000141812843 awarded by the National Oceanographic Partnership Program (NOPP). The U.S. government has certain rights in the invention.

TECHNICAL FIELD

This disclosure generally relates to liquid metal circuits, and in particular, soft, stretchable and/or deformable electronics as well as methods of making and using the same.

BACKGROUND

Soft electronics generally refers to flexible and stretchable devices (e.g., circuits and circuit components) that may be bent, stretched, or twisted without losing mechanical and electrical functionality. As such, these devices may have the capability to match the elasticity of biological tissue and conform to the human body without hindering motion. Thanks to these capabilities, soft electronics have recently drawn considerable attention as a complementary technology to conventional rigid electronics for a broad range of emerging applications from wearable computing to soft robotics, for example. Such soft electronics may provide increased robustness and better mechanical impedance matching with the host material or structure. For instance, they may be integrated into clothing or mounted on the skin without constraining natural body motion or causing discomfort.

A conventional approach for making stretchable electronics may be to create microfluidic channels within an elastomer matrix with a liquid-metal. Gallium-based liquid metal circuits may offer certain advantages over alternative approaches. However, stretchable electronics based on soft-elastomers embedded with percolating networks of rigid metallic particles, carbon allotropes, and/or conductive polymers may suffer from low conductivity (e.g., three orders of magnitude lower than metals) or poor electromechanical properties. Micro/nanoscale geometries of ultrathin conductive elements (e.g., serpentine and "wavy" electronics) represent a promising alternative that achieves stretchable functionality through flexure or twisting on a pre-strained elastomer substrates. However, obtaining stretchability with deterministic architectures may require conductive traces to be patterned into specific geometries (e.g., prebuckled waves, planar serpentines) that are only deformable in certain directions. Moreover, the power-carrying capacity of these traces may be severely limited when the conductor traces are ultrathin (e.g., smaller than 200 nanometers).

Accordingly, it may be desirable to manufacture multi-functional and soft, stretchable and deformable electronics having a high level of reproducibility and throughput.

BRIEF DESCRIPTION OF THE FIGURES

The devices and processes described herein may be better understood by considering the following description in conjunction with the accompanying drawings; it being understood that this disclosure is not limited to the accompanying drawings.

FIG. 37 includes Table A.1 describing ANOVA table for average peak height variation; and FIG. 38 includes Table A.2 describing ANOVA table for peak height variation.

FIG. 39 includes Table A.3 describing estimated slopes for the logarithmic relationship between withdrawal speed and average peak height for withdrawal speeds larger than 10 mm/s; and FIG. 40 includes Table A.4 describing average peak height to width ratios for constant liquid metal deposition height region where the withdrawal speed is smaller than 10 mm/s for 0 and 45 degree orientations.

DETAILED DESCRIPTION

Figure 1:
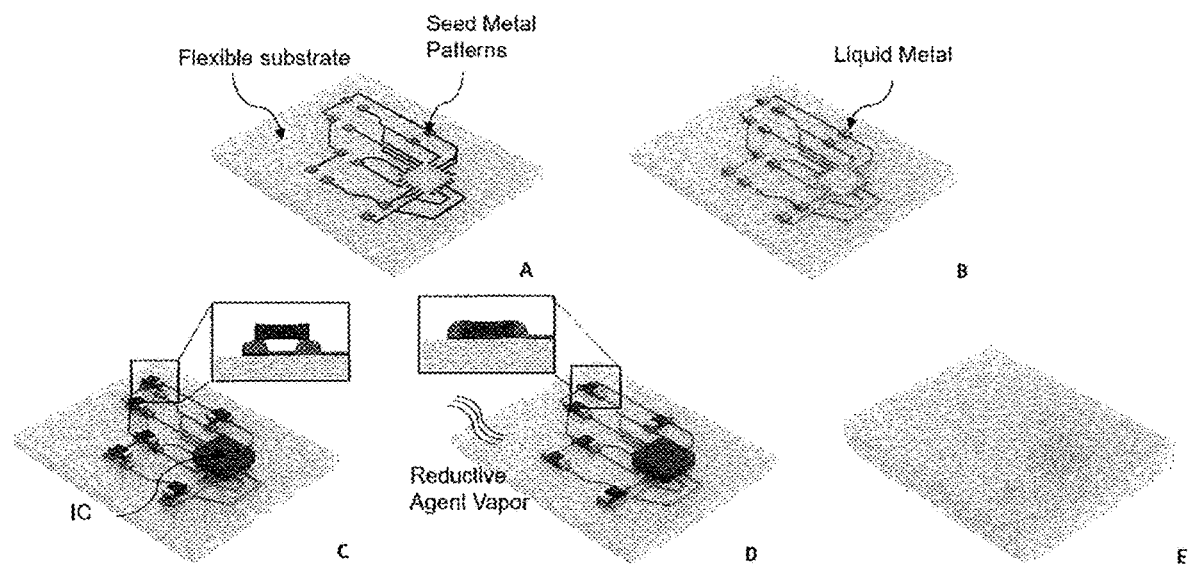
FIG. 1 illustrates a method of making a liquid metal circuit according to the present invention.

This disclosure generally describes soft, stretchable and/or deformable electronics and integrated electronic circuits as well as methods of making and using the same. It is understood, however, that this disclosure also embraces numerous alternative features, aspects, and advantages that may be accomplished by combining any of the various features, aspects, and/or advantages described herein in any combination or sub-combination that one of ordinary skill in the art may find useful. Such combinations or sub-combinations are intended to be included within the scope of this disclosure. As such, the claims may be amended to recite any features, aspects, and advantages expressly or inherently described in, or otherwise expressly or inherently supported by, this disclosure. Further, any features, aspects, and advantages that may be present in the prior art may be affirmatively disclaimed. Accordingly, this disclosure may comprise, consist of, consist essentially or be characterized by one or more of the features, aspects, and advantages described herein. As used herein, the term "and/or" includes any and all combinations of one or more of the associated listed items.

All numerical quantities stated herein are approximate, unless stated otherwise. Accordingly, the term "about" may be inferred when not expressly stated. The numerical quantities disclosed herein are to be understood as not being strictly limited to the exact numerical values recited. Instead, unless stated otherwise, each numerical value stated herein is intended to mean both the recited value and a functionally equivalent range surrounding that value. At the very least, and not as an attempt to limit the application of the doctrine of equivalents to the scope of the claims, each numerical value should at least be construed in light of the number of reported significant digits and by applying ordinary rounding techniques. Notwithstanding the approximations of numerical quantities stated herein, the numerical quantities described in specific examples of actual measured values are reported as precisely as possible. Any numerical values, however, inherently contain certain errors necessarily resulting from the standard deviation found in their respective testing measurements.

All numerical ranges stated herein include all sub-ranges subsumed therein. For example, a range of "1 to 10" or "1-10" is intended to include all sub-ranges between and including the recited minimum value of 1 and the recited maximum value of 10 because the disclosed numerical ranges are continuous and include every value between the minimum and maximum values. Any maximum numerical limitation recited herein is intended to include all lower numerical limitations. Any minimum numerical limitation recited herein is intended to include all higher numerical limitations.

All compositional ranges stated herein are limited in total to and do not exceed 100 percent (e.g., volume percent or weight percent) in practice. When multiple components may be present in a composition, the sum of the maximum amounts of each component may exceed 100 percent, with the understanding that, and as those skilled in the art would readily understand, that the amounts of the components may be selected to achieve the maximum of 100 percent.

In the following description, certain details are set forth in order to provide a better understanding of various features, aspects, and advantages the invention. However, one skilled in the art will understand that these features, aspects, and advantages may be practiced without these details. In other instances, well-known structures, methods, and/or techniques associated with methods of practicing the various features, aspects, and advantages may not be shown or described in detail to avoid unnecessarily obscuring descriptions of other details of the invention.

The terminology used herein is for the purpose of describing particular examples only and is not intended to be limiting. As used herein, the singular forms "a", "an", and "the" may be intended to include the plural forms as well, unless the context clearly indicates otherwise. The terms "comprises", "comprising", "including", "having", and "characterized by", are inclusive and therefore specify the presence of stated features, elements, compositions, steps, integers, operations, and/or components, but do not preclude the presence or addition of one or more other features, integers, steps, operations, elements, components, and/or groups thereof. Although these open-ended terms are to be understood as a non-restrictive term used to describe and claim various aspects set forth herein, in certain aspects, the term may alternatively be understood to instead be a more limiting and restrictive term, such as "consisting of" or "consisting essentially of" Thus, for any given embodiment reciting compositions, materials, components, elements, features, integers, operations, and/or process steps, described herein also specifically includes embodiments consisting of, or consisting essentially of, such recited compositions, materials, components, elements, features, integers, operations, and/or process steps. In the case of "consisting of", the alternative embodiment excludes any additional compositions, materials, components, elements, features, integers, operations, and/or process steps, while in the case of "consisting essentially of", any additional compositions, materials, components, elements, features, integers, operations, and/or process steps that materially affect the basic and novel characteristics are excluded from such an embodiment, but any compositions, materials, components, elements, features, integers, operations, and/or process steps that do not materially affect the basic and novel characteristics can be included in the embodiment.

Any method steps, processes, and operations described herein are not to be construed as necessarily requiring their performance in the particular order discussed or illustrated, unless specifically identified as an order of performance. It is also to be understood that additional or alternative steps may be employed, unless otherwise indicated.

When a component, element, or layer is referred to as being "on", "engaged to", "connected to", or "coupled to" another element or layer, it may be directly on, engaged, connected or coupled to the other component, element, or layer, or intervening elements or layers may be present. In contrast, when an element is referred to as being "directly on", "directly engaged to", "directly connected to", or "directly coupled to" another element or layer, there may be no intervening elements or layers present. Other words used to describe the relationship between elements should be interpreted in a like fashion (e.g., "between" versus "directly between", "adjacent" versus "directly adjacent", etc.).

Although the terms first, second, third, etc. may be used herein to describe various steps, elements, components, regions, layers and/or sections, these steps, elements, components, regions, layers and/or sections should not be limited by these terms, unless otherwise indicated. These terms may be only used to distinguish one step, element, component, region, layer or section from another step, element, component, region, layer or section. Terms such as "first", "second", and other numerical terms when used herein may not imply a sequence or order unless clearly indicated by the context. Thus, a first step, element, component, region, layer or section discussed below may be termed a second step, element, component, region, layer or section without departing from the teachings herein.

Spatially or temporally relative terms, such as "before", "after", "inner", "outer", "beneath", "below", "lower", "above", "upper", and the like, may be used herein for ease of description to describe one element or feature's relationship to another element(s) or feature(s) as illustrated in the figures. Spatially or temporally relative terms may be intended to encompass different orientations of the device or system in use or operation in addition to the orientation depicted in the figures. As used herein, "top" means furthest away from the substrate, while "bottom" means closest to the substrate. Where a first layer is described as "disposed over", "provided over", or "deposited over" a second layer, the first layer is disposed further away from substrate. There may be other layers between the first and second layer, unless it is specified that the first layer is "in contact with", "disposed on", "provided on", or "deposited on" the second layer.

The present invention is directed to techniques to provide multifunctional and practical soft and stretchable electronics with higher level of reproducibility and throughput, which may be referred to as scalability or high-rate manufacturing or rapid manufacturing.

The techniques may be characterized as an overall high-throughput manufacturing approach for liquid metal based soft and stretchable circuits with and without integrated solid integrated circuit (IC) chips. Since the techniques may be integrated with conventional microfabrication processes used for microelectronics, a very high throughput may be established. The techniques may also be applied at the wafer scale, thereby enabling simultaneous fabrication of a very large number of devices.

The present invention is directed to methods to manufacture liquid metal (LM) traces, created by coating non-liquid-metal traces, patterns, or surfaces through metallic alloying, on elastic (also referred to as soft and flexible) substrates.

Figure 4:
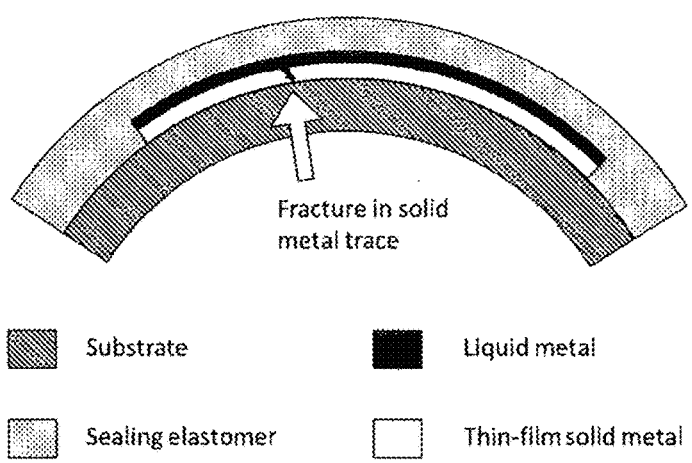
FIG. 4 illustrates a self-healing liquid metal circuit according to the present invention.

The present invention is directed to LM coated metallic traces that may provide increased robustness of flexible circuits and stretchable circuits relative to conventional circuits. Without wishing to be bound to any particular theory, it is believed that the failure of flexible circuits may be due to the mechanical fracturing of the thin conductive traces. While capable of enduring modest bending curvatures, limitations arise from material properties (e.g., low yield strains) and geometric design (i.e., particularly the neutral axis placement and thickness). Cracks in the conductive material may form due to excessive bending/stretching or due to fatigue from cyclic stresses. By coating the metal traces with LM, the circuit may acquire a self-healing property. Referring to FIG. 4, when the solid metal trace fractures, the void may be filled with LM, maintaining the conductivity and functionality of the system.

Stretchable circuits created with deterministic geometries of thin film metals on elastomers may also experience failure due to the material properties of the conductive traces. Again, the traces, despite being buckled or wavy, may be coated with liquid metal via alloyed wetting. While still limited in stretch by the geometric constraints of the deterministic structures, self-healing via the flow of LM may increase the overall robustness. The mostly constant electrical conductivity as a function of stretch may be maintained under this design. Even with the coating of LM, the inextensibility of the thin film metal traces may maintain a relatively constant overall length and cross-section regardless of strain.

The present invention is directed to methods of liquid metal dip-coating to deposit LM onto patterned metallic traces on a substrate.

The present invention is directed to methods to integrate LM-based circuits with traditional electronic materials and components for increased functionality of flexible and stretchable circuits. The combination of conventional rigid electronics, flexible and stretchable electronics with deterministic geometries and LM-based electronics on a single flexible circuit may provide the merits and functionality of each system on a single device. Rigid electronic component may be used to provide functionalities (e.g., power management), a sensing modalities (e.g., orientation, range, acceleration, magnetic field strength, speed, pressure, altitude, deformation, humidity sensing), communication (e.g., radio frequency (RF), WiFi, BLUETOOTH), and/or on-board digital processing. Flexible and stretchable electronics may provide soft and stretchable sensing (e.g., pressure, strain, tactile), communications (e.g., antennas), analog circuit elements (e.g., capacitors, resistors, inductors and diodes), and/or soft and stretchable interconnects (i.e., wiring) among the rigid and flexible elements to maintain electrical functionality under mechanical deformation (e.g. bending, twisting, stretching or compression).

The present invention is directed to methods to manufacture LM interconnect interfaces having decreased electrical contact resistance between circuit and rigid component pins. The method may utilize a vapor state reduction agent (e.g., HCl vapor) to initiate soldering and self-alignment of the component pins with respect to LM pads. This may increase the contact area at the interface between component pins and LM interconnects (see FIG. 6) resulting in a low electrical contact resistance (see FIG. 5) similar to a conventional solder contacts.

Figure 5:
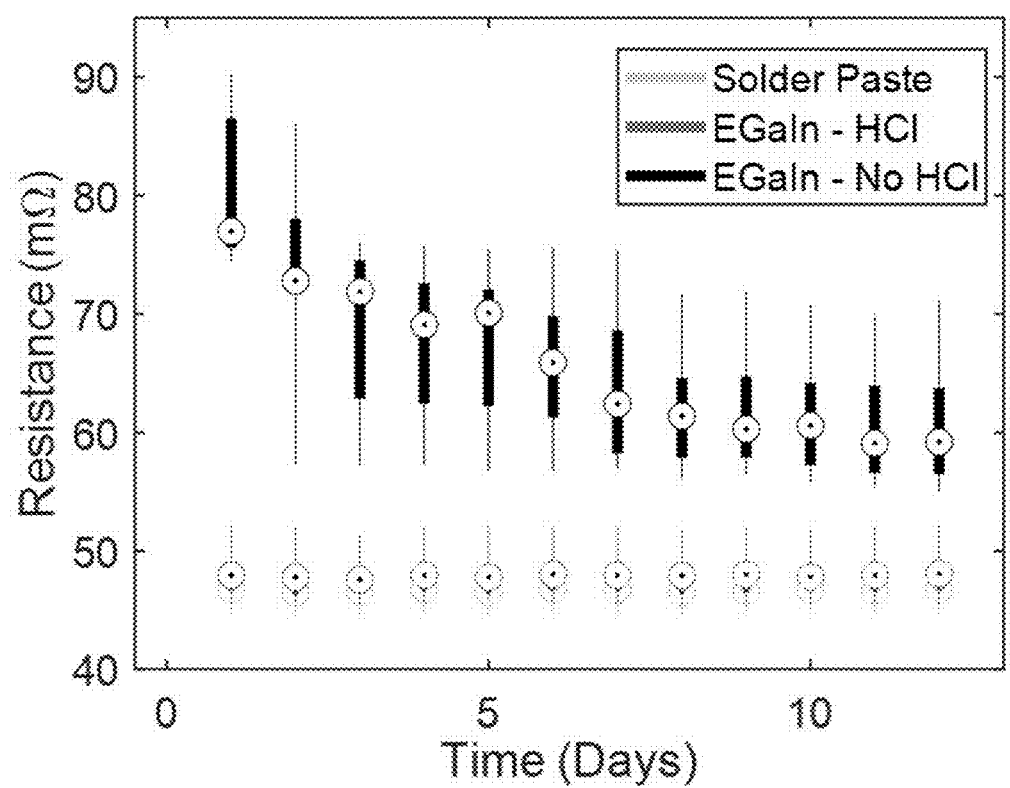
FIG. 5 illustrates a plot of resistance (milliohm) v. time (days) for a liquid metal circuit according to the present invention.
Figure 6:
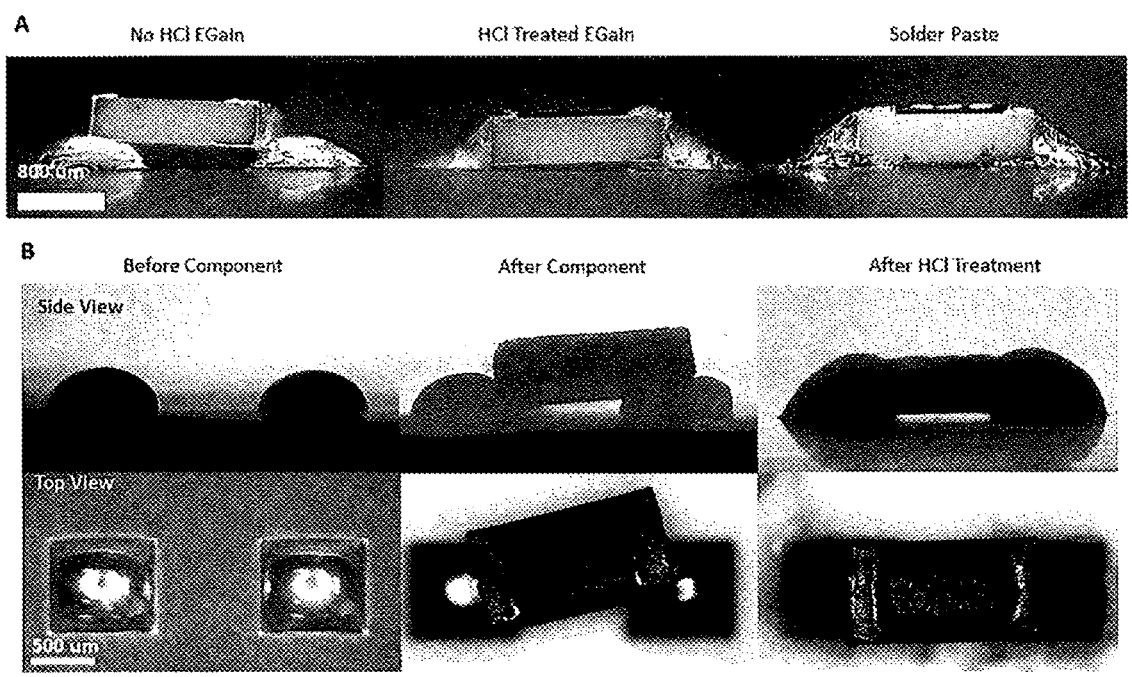
FIG. 6 illustrates a liquid metal circuit lacking HCl treatment and a liquid metal circuit having HCl treatment according to the present invention.
Figure 7:
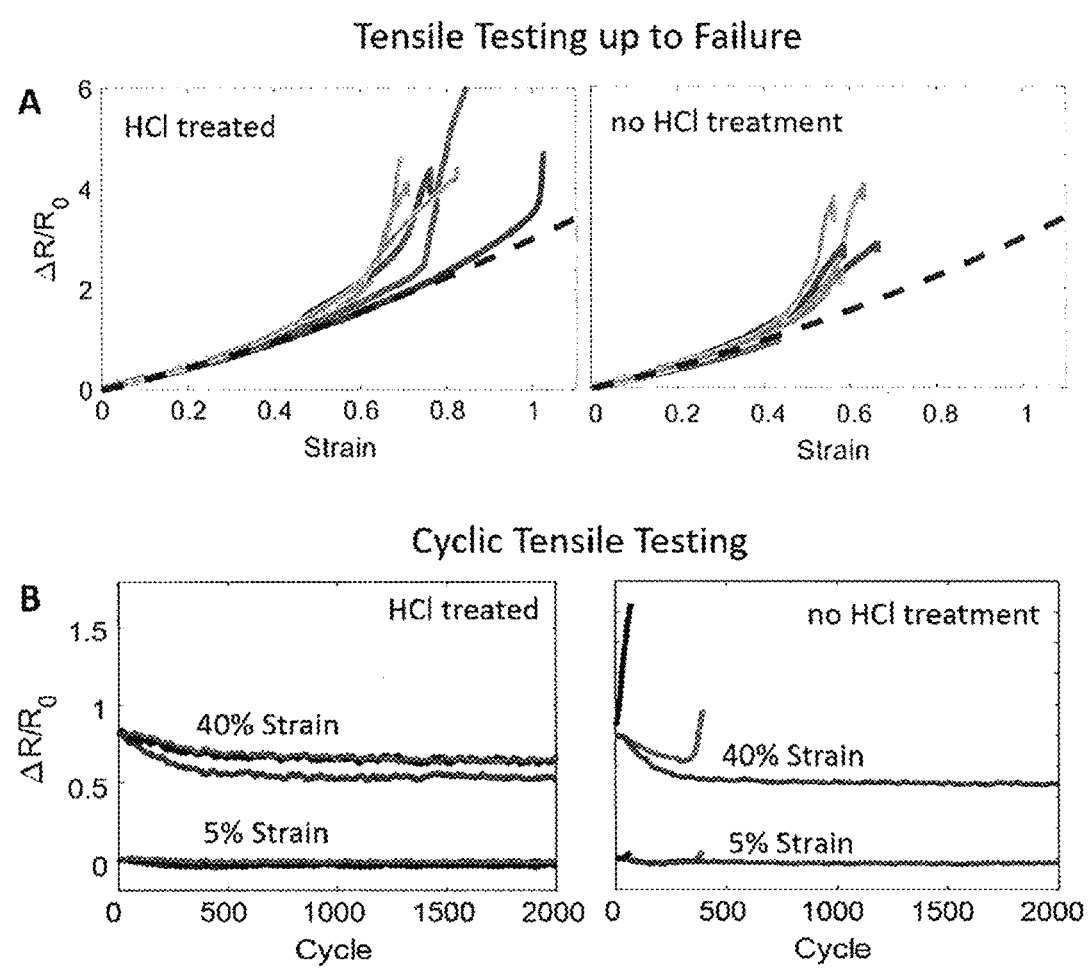
FIG. 7 illustrates normalized resistance of tensile strength v. strain for a liquid metal circuit lacking HCl treatment (left) and a liquid metal circuit having HCl treatment according to the present invention (right).

The present invention is directed to LM interconnects having repeatable, reproducible and stable interface between circuit and rigid component pins and methods of making and using the same. Referring to FIG. 5, the method may utilize the application of a vapor state reduction agent to make the electrical contact repeatable, reproducible and stable over time similar to a conventional solder contact. Referring to FIG. 7A, the application of a vapor state reduction agent may increase the maximum strain at failure under tensile loading for LM circuits containing a rigid electronic component. For example, the maximum strain at failure may be measured as 82.6±13.3% for HCl treated samples and 57.7±7.9% for non-treated samples. Referring to FIG. 7B, the application of a vapor state reduction agent may increase the reliability of LM circuits having a rigid electronic component that operate under cyclic loading. Each of the three HCl-treated samples completed the 2000-cycle test without failure. In contrast to HCl-treated samples, only one non-treated sample completed the 2000-cycle test out of seven samples. Four samples failed within the first 20 cycles (not shown in FIG. 7B), one failed at the 47th cycle and another one failed at the 374th cycle.

The present invention is directed to LM deposited on ultrathin (non-liquid) metallic traces through metallic alloying for creating fully stretchable circuits as well as methods of making the same. The present invention may be an alternative to fabricating stretchable circuits. The method according to the present invention may comprise using a substrate having extremely thin metal (e.g., 10 nanometer to 1 micrometer thickness) on an elastomer or other flexible substrate. The metal traces may act as a sacrificial wetting layer. LM deposited on the metallic wetting layer may act as the primary conductive component. During stretching, the wetting layer may be fractured or lose its material integrity.

The present invention is directed to methods for patterning LM-coated metallic circuits to enable a range of feature sizes also used in conventional electronics and microelectronics. The LM may be coated on existing metal traces such that the dimensions may be determined by the substrate fabrication methods, including, but not limited to, photolithography, wet chemical etching, plasma etching, and laser patterning.

The present invention may comprise a series of directed methods for patterning LM-coated metallic circuits that mitigate excess LM or LM oxide residue. Without wishing to be bound to any particular theory, and by taking advantage of the high surface tension of its oxide-free state, eutectic gallium-indium (EGaIn) or gallium-indium-tin (Galinstan) are LM alloys that may be selectively adhered to patterned metallic traces through alloyed wetting. The free surface of the substrate may remain free of LM and oxide contamination during fabrication. This may alleviate electrical shorting and breakdown issues. In general, the LM alloys may comprises metal and metal alloys that are liquid below their melting points, e.g., liquid at room temperature.

According to the present invention, a high-throughput method of manufacturing a liquid metal circuit may generally comprise applying a liquid metal to an alloying metal pattern on an elastic substrate to form the liquid metal circuit, wherein the high-throughput method of manufacturing the liquid metal circuit is characterized by at least one of wherein the elastic substrate comprises a surface area greater than 1 square inch, such as greater than 10 square inches, greater than 100 square inches, greater than 144 square inches, greater than 256 square inches and greater than 400 square inches; and wherein the liquid metal circuit comprises a plurality of liquid metal circuits on the elastic substrate, such as greater than 1, greater than 10, greater than 100, greater than 250, greater than 500, and greater than 1000.

The method may comprise fabricating the alloying metal pattern using at least one of photolithography, stencil lithography, chemical etching, and laser micromachining.

The method may comprise providing a patterned adhesive surface on a surface of the elastic substrate by at least one of chemical surface modification, mechanical surface modification. The method may comprise applying an adhesion material in a pattern to a surface of the elastic substrate by at least one of photolithography, stencil lithography, sputter deposition, physical vapor deposition, and chemical vapor deposition to provide the patterned adhesive surface.

The method may comprise applying an alloying metal material to the patterned adhesive surface by at least one of photolithography, stencil lithography, chemical etching, laser micromachining, chemical surface modification of the elastic substrate, and mechanical surface modification of the elastic substrate, wherein the alloying metal material adheres to the patterned adhesion surface to form the alloying metal pattern on the elastic substrate.

The method may comprise exposing the alloying metal pattern to a liquid metal, such as rolling the liquid metal, jetting the liquid metal, brushing the liquid metal, spray deposition, and dipping in a reservoir comprising the liquid metal. For example, the method may comprise liquid-metal dip coating of the alloying metal pattern into a reservoir comprising the liquid metal. The reservoir may comprise the liquid metal and an oxide-removing solvent comprising sodium hydroxide, hydrochloric acid, and mixtures thereof. The method may comprise agitating at least one of the reservoir, the liquid metal, and the elastic substrate when the alloying metal pattern is exposed to the liquid metal.

The alloying metal pattern may be immersed into and removed from the reservoir at a dipping orientation independently selected from up to 90 degrees with respect to the alloying metal pattern on a surface of the elastic substrate. The dipping orientation may be from 0-90 degrees, greater than zero up to 90 degrees, 0-45 degrees, and 45-90 degrees. The dipping orientation for one or more of the at least one linear portion of the liquid metal trace may be the same or different. For example, the liquid metal trace may comprise a plurality of linear portions each having a dipping orientation independently selected from 0-90 degrees. For the example, the dipping orientation during immersion may be 0 degrees and the dipping orientation during removal may be 90 degrees, or vice versa. The elastic substrate may comprise at least one liquid metal trace having at least one linear portion. A dipping angle may comprise the angle between the at least one linear portion and an plane perpendicular to a surface of the liquid metal.

According to the present invention, a liquid metal circuit may comprise at least one liquid metal trace having a height to width ratio up to 1, wherein the liquid metal trace comprises the liquid metal. The height to width ratio may have a maximum value of 0.1, 0.2, 0.25, 0.3, 0.4, 0.5, 0.6, 0.7, 0.75, 0.8, 0.9, 0.95, 0.98, 0.99, and 1.0. The height to width ratio may have a minimum value of 0.1, 0.2, 0.25, 0.3, 0.4, 0.5, 0.6, 0.7, 0.75, 0.8, 0.9, 0.95, 0.98, 0.99, and 1.0. The height to width ratio may be 0.1-1, 0.25-1, 0.5-1, 0.75-1, 0.1-0.5, 0.25-0.75, less than 0.5, and less than 0.25.

According to the present invention, the adhesion material may comprise at least one of chromium, titanium and nickel, the alloying material may comprise at least one of copper, gold, platinum, palladium, tin, zinc, and iridium, and the liquid metal may comprise at least one of gallium, indium, and tin.

According to the present invention, the liquid metal circuit may comprise a self-healing liquid metal circuit.

An integrated circuit may comprise the liquid metal circuit manufactured according to a high-throughput comprising: applying a liquid metal to an alloying metal pattern on an elastic substrate to form the liquid metal circuit, wherein the high-throughput method of manufacturing the liquid metal circuit is characterized by at least one of wherein the elastic substrate comprises a surface area greater than 1 square inch, such as greater than 10 square inches, greater than 100 square inches, greater than 144 square inches, greater than 256 square inches and greater than 400 square inches; and wherein the liquid metal circuit comprises a plurality of liquid metal circuits on the elastic substrate, such as greater than 1, greater than 10, greater than 100, greater than 250, greater than 500, and greater than 1000.

A high-throughput method of manufacturing a liquid metal circuit may generally comprise forming a liquid metal trace on an elastic substrate by exposing an alloying metal pattern on the elastic substrate to a liquid metal; positioning a microelectronic component proximate to the liquid metal trace; and exposing the microelectronic component and the liquid metal trace to a solvent gas to remove oxide from at least one of the microelectronic component and the liquid metal trace, wherein the microelectronic component is substantially aligned with the liquid metal trace after exposing the microelectronic component and the liquid metal trace to the solvent gas; wherein the high-throughput method of manufacturing the liquid metal circuit is characterized by at least one of wherein the elastic substrate comprises a surface area greater than 1 square inch, such as greater than 10 square inches, greater than 100 square inches, greater than 144 square inches, greater than 256 square inches and greater than 400 square inches; and wherein the liquid metal circuit comprises a plurality of liquid metal circuits on the elastic substrate. The solvent gas may comprise at least one of hydrochloric acid, sodium hydroxide, sulfuric acid, and potassium hydroxide. The microelectronic component may comprise a vertical distance between the microelectronic component and the liquid metal trace that is reduced after exposing the microelectronic component and the liquid metal trace to the solvent gas. For example, a first vertical distance between the microelectronic component and the liquid metal trace prior to exposing the microelectronic component and the liquid metal trace to the solvent gas may be greater than a second vertical distance between the microelectronic component and the liquid metal trace after exposing the microelectronic component and the liquid metal trace to the solvent gas.

A high-throughput method of manufacturing a liquid metal circuit may generally comprise liquid-metal dip coating an alloying metal pattern on an elastic substrate into a reservoir comprising a liquid metal, wherein the high-throughput method of manufacturing the liquid metal circuit is characterized by at least one of wherein the elastic substrate comprises a surface area greater than 1 square inch; and wherein the liquid metal circuit comprises a plurality of liquid metal circuits on the elastic substrate. The alloying metal pattern may comprise at least one of copper, gold, platinum, palladium, tin, zinc, and iridium, and the liquid metal comprises at least one of gallium, indium, and tin. The liquid metal circuit comprises a liquid metal trace having a height to width ratio up to 1, such as 0.1-1, 0.25-1, 0.5-1, 0.75-1, 0.1-0.5, 0.25-0.75, less than 0.5, less than 0.25.

Introduction

Liquid metal based designs may have the advantage of extreme mechanical stretchability and flexibility limited by the substrate not by the LM (up to 1000% strain) while maintaining high conductivity. Gallium and Ga-based LM alloys, such as eutectic Ga-ln (EGaln; 75% Ga and 25% In, by weight) and Ga-ln-Sn (Galinstan; 68% Ga, 22% In, 10% Sn), may be incorporated into elastomers and preserve their elastic properties at all length scales and in all loading conditions without requiring specialized geometries. The room temperature liquid-metals commonly used in these devices may include a binary eutectic alloy of gallium and indium (EGaln) ($T_m$ about 15.5° C.) and a ternary alloy of gallium-indium-tin (Galinstan) ($T_m$ about −19° C.). The popularity of these gallium-based liquid alloys over other liquid-metals may be due to their low-toxicity and negligible vapor pressure. EGaln and Galinstan may function as intrinsically stretchable and deformable conductors that are not subject to the limitations of conductive polymers or deterministic architectures. As such, LM-based electronics may provide a unique combination of metallic conductivity ($\sigma=3.4\times10^6$S/m, $\frac{1}{20}^{th}$ of Cu) and elastomeric deformability.

Methods for EGaln and Galinstan pattern fabrication may include direct-writing, injection, inkjet printing, laser patterning, contact printing, imprinting, selective wetting, screen printing, spray painting, and reductive patterning. Microfluidic channels of EGaIn embedded in a soft elastomer, e.g., polydimethylsiloxane (PDMS), or other soft and elastic materials (e.g., spandex, natural latex, etc.) may function as highly stretchable wires and passive circuit elements. Such architectures have also been used for diodes and memristors, deformation sensors, and mechanically or electrochemically tunable antennas. There has also been increasing focus on the direct and indirect integration of integrated circuits ("IC") chips and other microelectronics to form multifunctional stretchable circuit assemblies. Conventional techniques to provide LM-based electronic may lack scalable manufacturing techniques that may be integrated in the standard process flow of traditional lithographic microfabrication techniques and effective electrical interfaces between liquid metal traces and conventional rigid microelectronics (such as integrated circuits (IC) or surface-mount device (SMD) components) may be desirable to create multifunctional and practical soft and stretchable electronics with high level of reproducibility and throughput.

Methodology

A method to manufacture liquid metal circuits with or without integrated IC or SMD components, in particular, soft, stretchable and deformable electronics, may generally comprise at least one of (1) patterning metallic wetting layers on elastic (i.e., flexible/stretchable/soft) substrates to form circuit, mounting pad and device designs, using various processes, including but not limited to photolithography, stencil lithography, wet etching, plasma etching, and laser patterning and micromachining; (2) selective deposition of gallium-based liquid metals (LM) on the wetting layers through alloying using various processes, including but not limited to dip-coating, stencil printing/lithography, spray deposition or rolling processes; (3) interfacing and integration of rigid components to the circuit using a vapor form of a reduction agent (also referred to as solvent vapor), such as hydrogen chloride (HCl) vapor, to cause improved electrical connection and self-alignment, and (4) sealing the entire hybrid flex circuitry into an elastic medium. An overview of the fabrication method is illustrated in FIG. 1.

Substrate Preparation

As shown in FIG. 1A, a method to manufacture integrated liquid metal circuits may comprise patterning of wetting layers on flexible substrate. The wetting layers patterned on the substrate may retain the treated LM by alloying. The surfaces lacking such patterns of an alloying metal, therefore, would not be wetted by the bulk LM due to its high surface tension against non-metal surfaces.

The wetting layer material may alloy with oxide-free LM. Sample wetting layer materials may include, but are not limited to, Cu, Ag, Au, Ga, In, Sn, and Zn. Cu, Ag, Au and Sn may also be used in printed circuit board (PCB) and flex-PCB manufacturing. The wetting layer may also be referred to an alloying layer The elastic substrate may be characterized by at least one of the abilities and/or characteristics of stretchability, flexibility, bendability, softness, and twistability. These materials may include, but are not limited to, elastomers (such as polyurethanes (PU), silicone rubbers) and flexible plastics (such as polyimide (PI), polyethylene naphthalate (PEN), polyether ether ketone (PEEK), polyester (PET), polyetherimide (PEI)), flexible resins, and natural rubber.

Patterning of metal wetting layers may be achieved through singly or a combination of various techniques, including but not limited to: conventional methods such as photolithography and wet etching for feature sizes as small as less than 1 micrometer up to 10 cm; microcontact printing; electronic UV laser patterning of thin films of metal coated (e.g., sputtered or evaporated) on UV transparent/resistant material, e.g., polydimethylsiloxane, which remains undamaged under low powered UV lasers; thin films of metal, however, may be patternable at this level, allowing clean fabrications of wetting layers, e.g., features down to 30 micrometers may be achieved, limited by the laser beam width and the mechanical resolution of the system; spray coating and stencil printing; and methods to create wetting layers with deterministic morphologies.

Liquid Metal Application

The method to manufacture integrated liquid metal circuits may comprise treating the LM with a reduction agent to remove its oxide skin. The LM alloy may comprise Eutectic gallium-indium alloy (EGaIn) and/or gallium-indium-tin (Galinstan). The reduction agent may be in solid, liquid or vapor phase as well as in the form of aqueous solution. In order to achieve high resolution, the reactivity of reduction agent may be absent or very low against the wetting layer patterns and the substrate but may be able to reduce the oxide skin of the LM. The reduction agent may comprise aqueous solutions or vapor phase of potassium hydroxide (KOH), sodium hydroxide (NaOH), hydrochloric acid (HCl). A person having ordinary skill in the art may appreciate that when this approach is applied in a controlled, oxygen-free environment, the reduction agent may be eliminated completely.

Before the deposition of LM to the wetting layers, the connections/patterns or other regions of the substrate where deposits of LM are not desired may be masked to avoid wetting layer-LM contact. This mask may be patterned via photolithography for size ranges down to 0.7 micrometers. Mask material may not react with the reduction agent, substrate material, wetting layer material and/or the LM itself. Mask materials may comprise at least one of negative photoresists and positive photoresists. When LM is deposited to the entire circuitry, no mask may be required.

As shown in FIG. 1B, the method to manufacture integrated liquid metal circuits may comprise applying oxide-free LM to the preferred wetting layer patterns for the deposition. LM deposition to the patterns may be achieved by ensuring a physical contact between wetting layer patterns and the treated liquid metal. Techniques to apply the oxide-free LM include, but are not limited to, the following: rolling or jetting treated LM on wetting layer patterns; rolling with a compliant (rubber) roller or squeegee; and dipping patterned substrate into treated LM bath.

Figure 2:
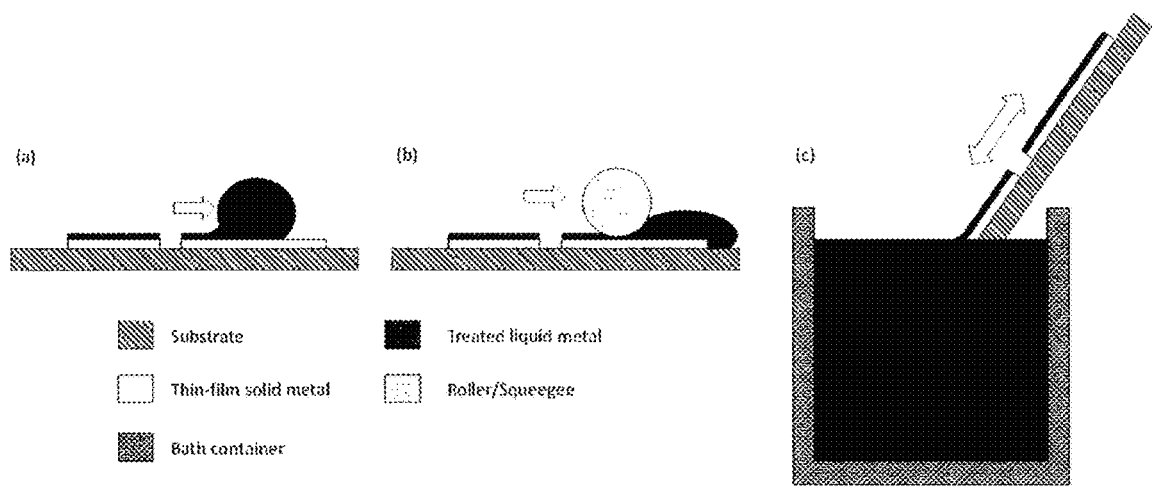
FIG. 2 illustrates methods of making a liquid metal circuit according to the present invention: (a) liquid metal jetting, (b) liquid metal layer formed by rolling with a roller or squeegee, (c) liquid metal dipping in bath.

FIG. 2A illustrates rolling or jetting treated LM on wetting layer patterns. A drop of treated LM may be rolled over the surface using gravity, jetted via a dropper or an airbrush, or by outside manipulation (e.g., by manual probe). FIG. 2B illustrates rolling with a compliant (rubber) roller or squeegee. FIG. 2C illustrates dipping a patterned substrate into a treated LM bath. While dipping, the LM bath may be agitated, stirred, or shaken to cause contact between LM and wetting layer.

Figure 3:
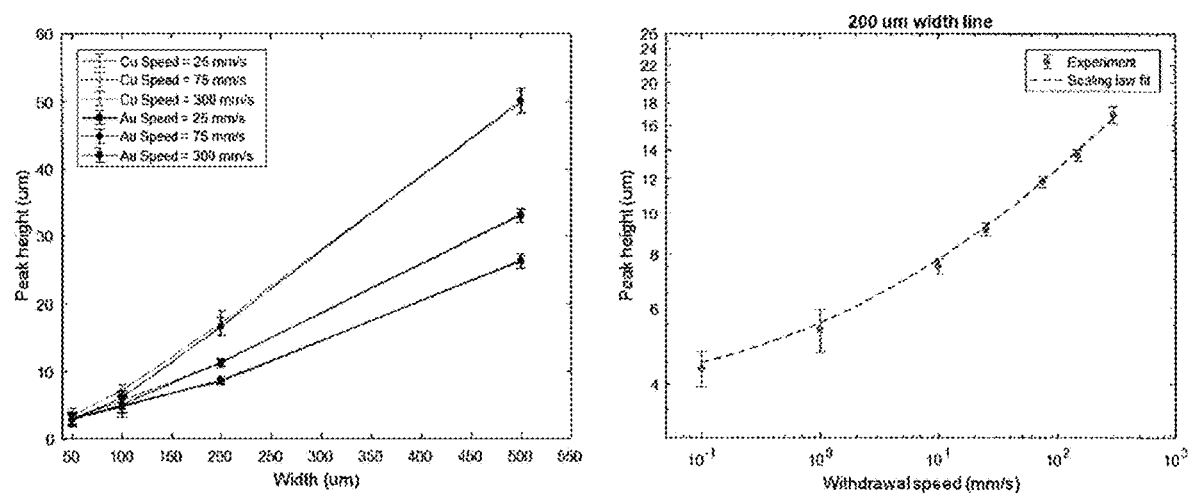
FIG. 3 illustrates a relationship between deposited liquid metal peak height and the alloying layer geometry and dipping withdrawal speed of a method of making a liquid metal circuit according to the present invention.

Without wishing to be bound to any particular theory, dip-coating parameters, including but not limited to, the insertion speed into the bath, the withdrawal speed from the bath, the dipping orientation, and/or the wetting layer geometry, may affect the amount of LM deposited on the wetting layer. FIG. 3 (Left) shows the relationship between peak deposited height vs withdrawal speed, wetting layer width, and wetting layer material. As shown in FIG. 3, there is no significant difference in deposited liquid metal height observed between copper (Cu) and gold (Au) as wetting layer materials. FIG. 3, (Right) shows the relationship between withdrawal speed and deposited peak liquid metal height ($h_p$) in a finer scale. Without wishing to be bound to any particular theory, assuming the surface tension ($\gamma$) and the viscosity ($\mu$) of the liquid are known, the scaling law describing the relationship between withdrawal speed (U) and wetting layer width (W) may be written as follows:

$$h_p \propto W\left(\frac{\mu U}{\gamma}\right)^{1/3} \tag{1}$$

After LM deposition, the patterns may be rinsed first with deionized (DI) water and then with isopropyl alcohol (IPA) and dried to clean the excess reduction agent left on the surface. During rinsing and cleaning of the reduction agent, the oxide layer may grow back on LM patterns allowing them to keep their patterned shape. The oxide layer may provide the patterned LM with structural integrity so that the patterns hold their shape.

When a mask layer is used, the mask layer may be removed with a solvent that does not significantly damage the patterned and coated conductive traces. The solvent may comprise aqueous solutions or vapor phase of potassium hydroxide (KOH), sodium hydroxide (NaOH), hydrochloric acid (HCl), isopropyl alcohol (IPA), AZ® developer (Microchemicals GmbH, Germany), and other solvents that reduce or prevent oxidation of gallium-indium without causing a chemical reaction with it.

Component Placement and Interfacing

Referring to FIG. 1C, the method to manufacture integrated liquid metal circuits may comprise coupling rigid components including, but not limited to, integrated circuit (IC) chips, surface mount devices (SMD) and cable connectors, to designated LM-coated pads.

Referring to FIG. 1D, a vapor phase reduction agent may be applied to the substrate having the rigid components. The application of a reducing agent may create an interface having low electrical contact resistance between the rigid component pins and liquid metal interconnects. The reduction agent may remove the oxide on component pins and LM interconnects and bring materials in better contact to initiate soldering between them. Some examples of the reduction agent include, but are not limited to, vapor phase of hydrochloric acid (HCl) and sulfuric acid ($H_2SO_4$). The reducing agent may dissolve the oxide "skin" covering the liquid metal and thereby cause a dramatic increase in LM surface. The non-oxidized liquid metal may apply force on the rigid components and cause it to orient in alignment with the LM-coated contact pads. In some instances, this behavior may cause self-alignment of the rigid components.

The patterns may be rinsed with deionized (DI) water and then isopropyl alcohol (IPA) and dried to clean the excess reducing agent and reaction byproducts from the surface. During rinsing and cleaning of the reducing agent, the oxide layer may grow back on the surface of the patterned LM. The oxide layer may provide the patterned LM with structural integrity so that the patterns may hold their shape.

Referring to FIG. 1E, lastly, the entire hybrid circuit may be sealed in a flexible carrier medium. The elastic carrier medium may be characterized by at least one of stretchability, flexibility, bendability, twistability, and softness. The elastic carrier medium may include, but are not limited to, elastomers (such as polyurethanes, silicone rubbers), elastic resins, and other synthetic and natural polymeric materials.

Alternative Approaches

LM application may also be performed by removing oxide and working in an oxygen-free environment (e.g., argon or nitrogen environment). In such an environment, the oxide may not grow back and alloying may be enabled without continued need for corrosive fluids.

EXAMPLES

The liquid-metal ("LM") based soft, flexible, and/or stretchable electronics (LM-based SSEs) and methods of making and using the same described herein may be better understood when read in conjunction with the following representative examples. The following examples are included for purposes of illustration and not limitation.

Example 1

Materials:

The PDMS used in the fabrication of circuits and test samples was prepared with Sylgard 184 (Dow Corning, USA) using a 10:1 oligomer to curing agent ratio. A 3% w/w NaOH solution was prepared by diluting 30% w/v NaOH solution (BDH Chemicals) with deionized (DI) water (100%, McMaster-Carr, USA). DI water and isopropyl alcohol (IPA) (2-propanol ACS 99.5% min, Alfa Aesar, USA) were used to the clean surface of samples after liquid metal deposition and hydrochloric acid (HCl) vapor treatment. Eutectic gallium-indium alloy (EGaIn) was prepared by mixing Ga (Gallium Source, USA) and In (Gallium Source, USA) at a 3:1 ratio by mass and heating and homogenizing at 190° C. on a hot plate overnight. The circuit designs were made in CircuitMaker (Altium Limited, Australia). HCl vapor was obtained from a one-gallon bottle of 36% w/w aqueous HCl solution (Alfa Aesar, USA).

Figure 9:
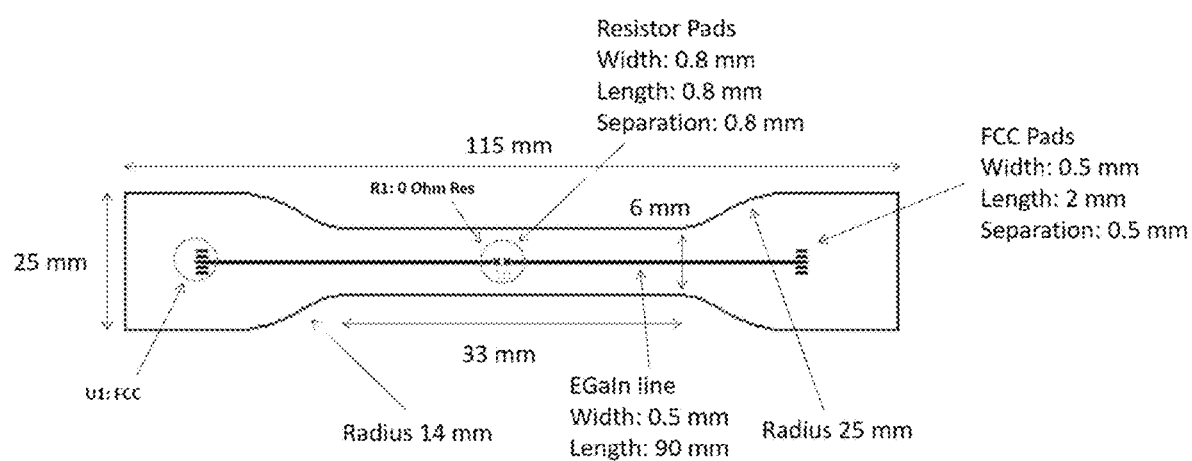
FIG. 9 illustrates a tensile test specimen of a liquid metal circuit according to the present invention.

Fabrication of Tensile Test Specimens:

The geometry of the tensile test specimens conformed to ASTM D412 to concentrate strain uniformly at the center portion of the geometry. The mold for the specimen had two portions, one portion to prepare the substrate and the other for sealing. Two parts were cut from 1.5 mm thick poly (methyl methacrylate) (PMMA) using a carbon dioxide ($CO_2$) laser system in the shape of a dog bone (dimensions shown in FIG. 9). The first component of the mold was prepared by gluing one of the cut parts to an 8 mm thick PMMA plate. Both components of the mold were drilled to be aligned during sealing. After creating the mold pieces, the substrate portion was treated with a releasing agent (Ease Release 200, Reynolds Advanced Materials, USA), and PDMS was poured inside, degassed under vacuum for 30 min, and cured on a hotplate with 65° C. for 10 hours. Next, a 100 nanometer metal alloying layer of copper was sputter deposited (30 W power, 5 mTorr pressure; Perkin-Elmer 8L, USA) on the PDMS substrate along with a 20 nanometer adhesion layer of chromium (30 W power, 20 mTorr pressure). The circuit design was made in CircuitMaker and patterned into the Cr/Cu layer using a commercial UV-laser based PCB prototyping tool with 0.3 W power and 400 mm/s marking speed. Next, the elastomeric substrate having the copper wetting layer was immersed into 3% w/w NaOH solution while keeping the substrate horizontal with respect to the bath. Immediately after immersing, 3% w/w NaOH treated liquid metal droplets were applied to cover the wetting layer by placing/jetting liquid metal droplets on the substrate surface using a dropper. After the liquid metal was deposited onto the patterned copper circuit, the coated substrate was dipped horizontally into DI water and IPA to clean residual NaOH and then dried on a hotplate at 60° C. for 10 min. Next, FFC connectors (Amphenol FCI HFWSR-1STE1LF, purchased from Digikey) with FFC cables (Parlex USA LLC 100R5-51B, purchased from Digikey, USA) attached were placed at their designated places. On the test samples with components, a 1/10 W 0603 zero-Ohm resistor (Samsung Electro-Mechanics America Inc, purchased from Digikey, USA) was placed. Next, HCl vapor was applied to the sample surfaces manually using a dropper. HCl vapor was obtained from 36% w/w aqueous HCl bottle. HCl treated samples were dipped into DI water and IPA and then dried on a hotplate at 60° C. for 10 min. Then, the samples were placed inside the first part of the mold and oxygen plasma treated at 30 W for 45 seconds (Plasma Prep 3, SPI, USA) to activate the PDMS surface. Then, the second part of the mold was bolted to the first part, PDMS was poured, and the sample was degassed under vacuum for 30 min. Finally, the samples were cured on a hotplate at 65° C. for 10 h.

Tensile Testing:

Both tensile testing up to failure and cyclic tensile testing were performed on a commercial material testing device (5969 Dual Column Testing System, Instron, USA). The tests were conducted on specimens having an integrated microelectronic component (zero-ohm resistor) and specimens lacking a microelectronic component (i.e., LM-only) were also used for comparison. During the test, the load-displacement and the electrical resistance of the samples were measured. FFC connector cables coming from the samples were connected to a data acquisition board (NI USB-6002, National Instruments, USA) via a voltage divider circuit having a known resistor of 560 Ohms to measure the resistance of the samples during testing. Strain was also measured simultaneously by placing markers with a pen on the samples and taking the video of the test with a stationary camera. The videos were processed with a free video analysis tool (Tracker v4.96). The loading rate for the testing up to failure was 15 mm/min while the loading frequency for the cyclic testing was 0.1 Hz. The number of cycles applied for cyclic tensile test was 2000 and the applied strain amplitude was 35% with 5% prestrain applied to accommodate slacking during testing. As such, each cycle included strains between 5% and 40%. The cyclic strain was applied in Instron's preset sawtooth pattern. Acquired data were filtered using a moving average filter of a window size of 100 and plotted using MATLAB (R2016b, MathWorks, USA).

Figure 30:
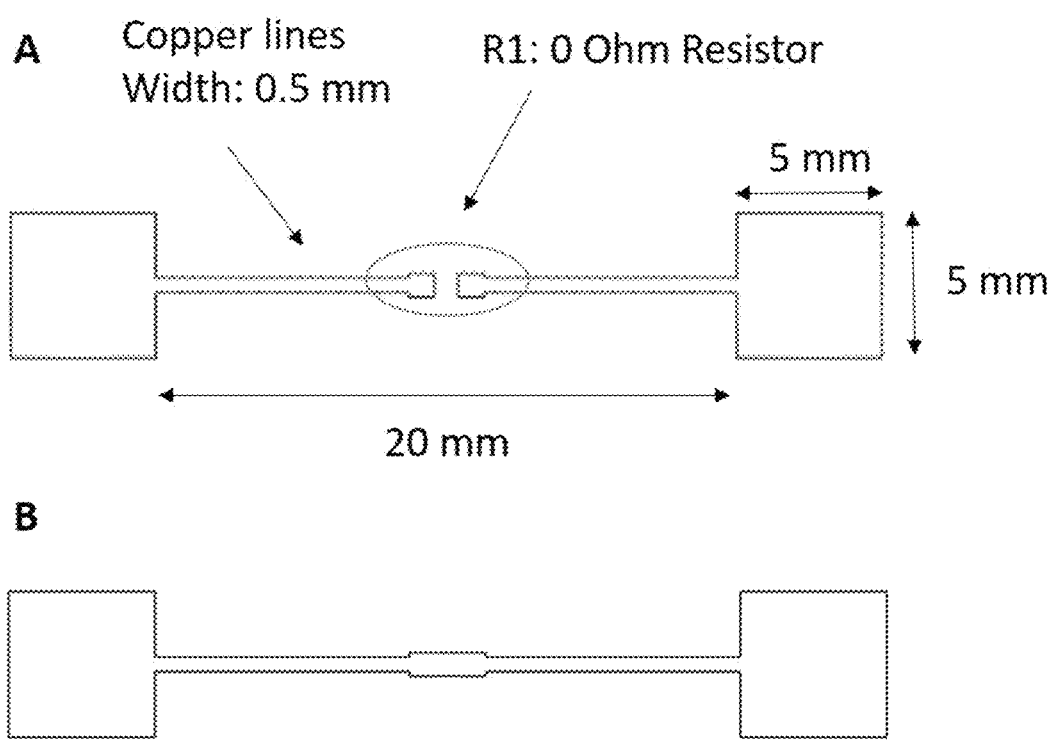
FIG. 30 illustrates an electrical interface test specimen of liquid metal circuits according to the present invention.

Test Circuits for Electrical Interface Characterization on Rigid PCB:

The circuit design for the electrical interface characterization is shown in FIG. 30 and was made in CircuitMaker software. The design was patterned using a commercial UV-laser based PCB prototyping system on a 0.5 oz single-sided copper laminate (Fab-in-a-box, PulsarProFX USA). To deposit solder paste or liquid metal only on the component pads, a stencil made from laser mask tape (Orange Laser Mask, Ikoniks Imaging, USA) was patterned using the UVLM system to expose only the component pads. The stencil was then laid down on the patterned PCB. The component contact pads were treated with a water-soluble solder flux pen (Kester #2331-ZX, Kester, USA) to remove the thick oxide on the copper pads. For the liquid metal deposited PCBs, masked PCB was immersed horizontally into 3% w/w sodium hydroxide (NaOH) treated EGaIn resulted in liquid metal deposition only on the component contact pads, then the mask was removed. Next, the PCB was immersed horizontally into DI water and then IPA to clean the surface. Following that, the PCB was dried on a hotplate at 60° C. for 10 min. Wires were soldered on the wire contact pads where the measurements to be taken using 0.16±0.01 gr commercial 15 mil flux core solder (Sn63Pb37 #50/245, Kester, USA). Finally, a 1/10 W 0603 zero-Ohm resistor (RC 1608 Samsung Electro-Mechanics America Inc, purchased from Digikey, USA) was aligned and placed on the liquid metal on the component contact pads using a custom-made manual pick and place setup that contains a vacuum chuck. After the alignment, the component was released from a distance of about 500 micrometers from the board surface. For the sample sets where HCl vapor was applied, 20 mL HCl vapor was applied using a syringe pump (PHD 220, Harvard Apparatus, USA) with a flow rate of 42 mL/min by placing syringe needle on top of the component with a stand-off distance of about 2.5 mm away from the PCB. The HCl vapor deposition setup was placed under a fume hood with 100 ft/min flow rate. After HCl vapor treatment, the PCB was immersed horizontally into DI water and then IPA to clean the surface. Following that, the PCB was dried on a hotplate at 60° C. for 10 min. For the PCBs where solder paste was used as the solder material, solder paste (SMD291AX250T3, Chipquik Inc, USA) was deposited on the component contacts. Next, the mask was removed, a 0603 package 1% zero-Ohm resistor was aligned and placed on the liquid metal on the component contact pads using a custom made manual pick and place setup that contains a vacuum chuck. After the alignment, the component was released from a distance of 500 micrometers from the contact pads. Next, solder paste was treated using a commercial reflow oven (T962, SMTHouse, Sweden). Then, wires were soldered on the contact pads where the measurements will be taken using a 0.16±0.01 gr commercial 15 mil flux core solder (Sn63Pb37 #50/245, Kester, USA). Finally, the board was rinsed with DI water and then with IPA to clean the surface. Following that, the PCB was dried on a hotplate at 60° C. for 10 min.

Figure 31:
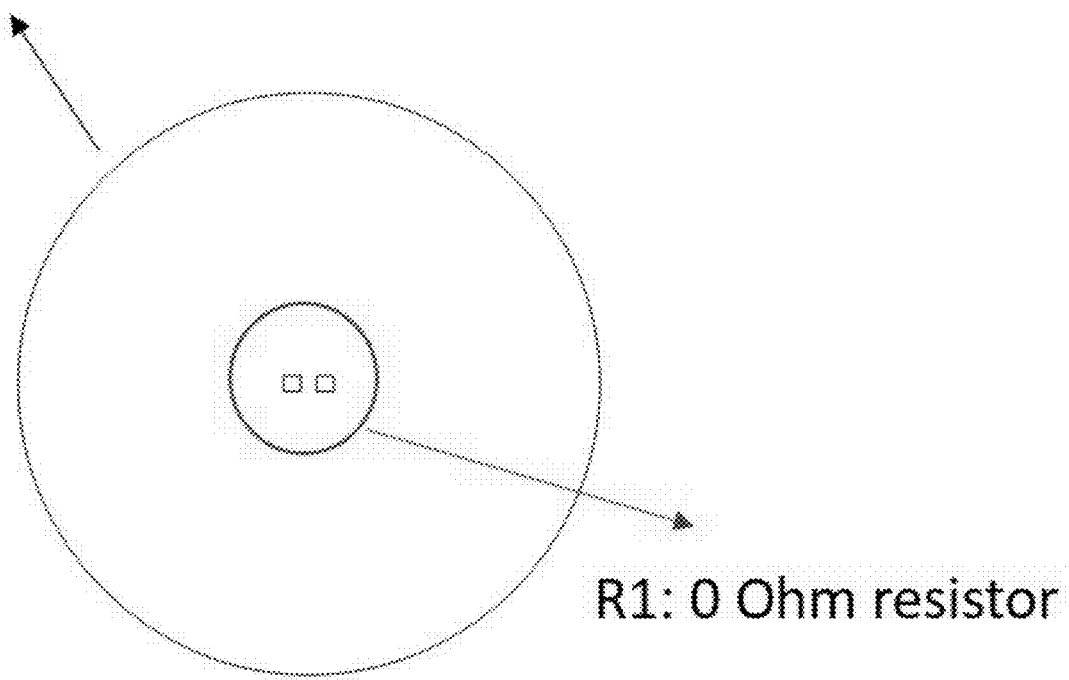
FIG. 31 illustrates a self-alignment test specimen of liquid metal circuits according to the present invention.

Self-Alignment Test Samples and Data Processing:

The circuit design for the self-assignment study is shown in FIG. 31 and was made in CircuitMaker. About 2 g of PDMS was poured and cured on a 1-inch diameter Si wafer (purchased from Polishing Corp of America, USA) at 65° C. for 10 h. A 20 nanometer chromium layer was sputter coated on PDMS substrate. Then, a 100 nanometer copper layer was sputter coated on chromium layer. The chromium layer may provide adhesion between the copper and the PDMS. The metal wetting layers were then patterned, and EGaIn was deposited on the wetting layer and the specimens were cleaned. Next, a 1/10 W 0603 zero-Ohm resistor was placed manually on the contact pads. Profilometry measurements (using NewView, Zygo, USA) and top view photos of the samples before HCl treatment were taken (using Infinitefocus, Alicona, Austria). Next, the samples were treated with 2 mL HCl vapors using a syringe pump (PHD 220, Harvard Apparatus, USA) at a flow rate of 42 mL/min by placing a syringe needle on top of the component with a stand-off distance of 2.5 mm away from the surface. The entire HCl vapor deposition setup was placed under a fume hood with a 100 ft/min flow rate. After HCl vapor treatment, the circuit was dipped into DI water and then IPA was used to clean the surface. Following that, the circuit was dried on a hotplate at 60° C. for 10 min. Profilometry measurements and top view photos of the samples after HCl treatment were taken. Using profilometry measurements, the height of the geometric center of the component, roll, and pitch angles relative to the substrate were computed using the profilometry device's native software (MetroPro, Zygo, USA). Using the top view microscopy images of the samples, yaw angle of the component with respect to component pads, eccentricity of component geometric center with respect to the geometric center of the pads in in-plane axes were calculated using a free image editing software (IrfanView 4.44).

Figure 14:
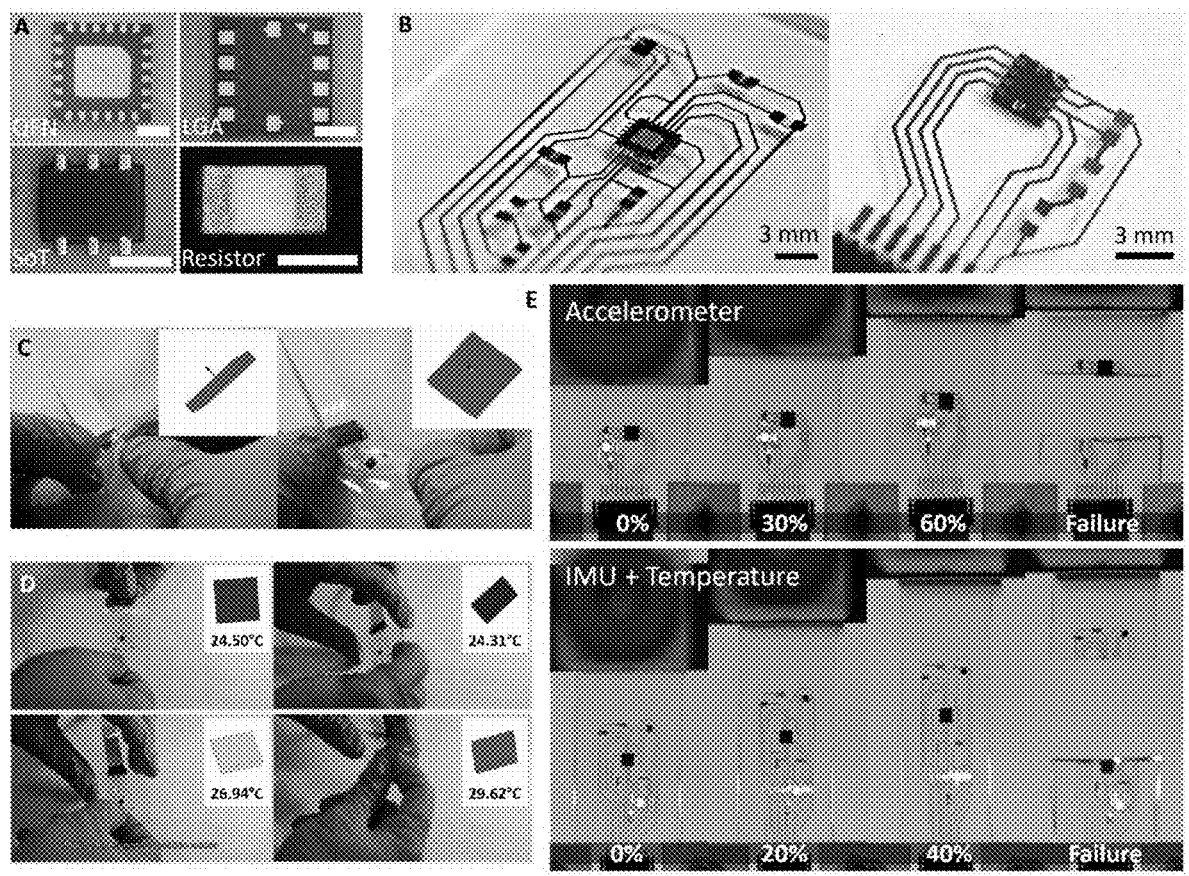
FIG. 14 illustrates component package architectures and functional of liquid metal circuits according to the present invention.
Figure 32:
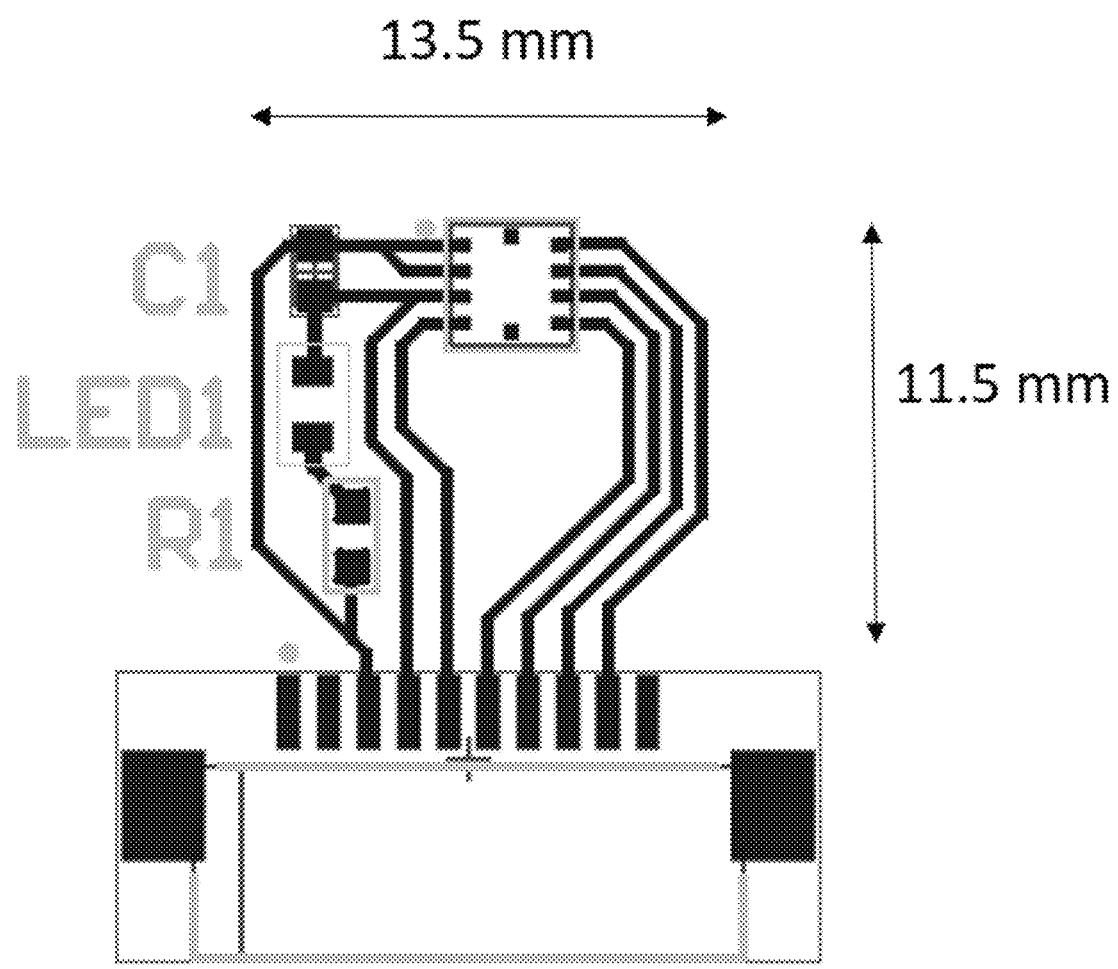
FIGS. 32 and 33 illustrate an integrated circuit comprising a liquid metal circuit according to the present invention.
Figure 33:
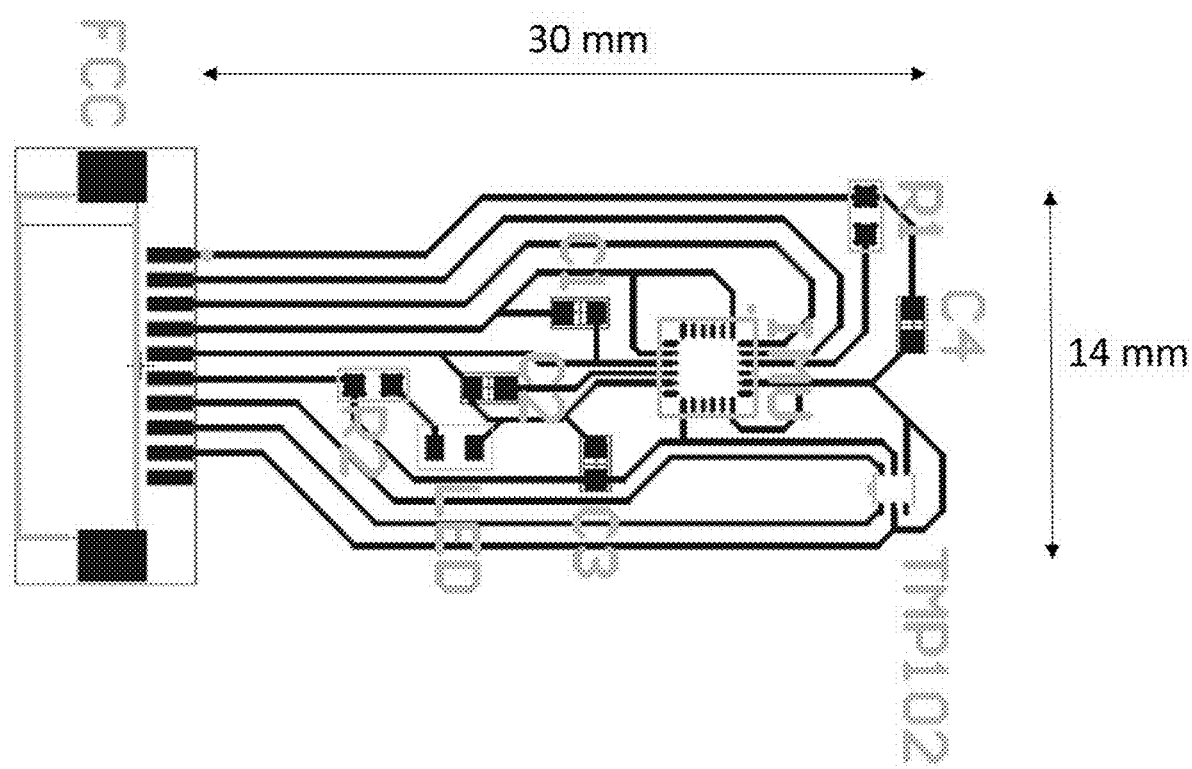

Implementations and Testing of IMU Circuits:

The circuit designs for the sensor demonstrations are shown in FIG. 32 and FIG. 33 and were made in CircuitMaker. PDMS was poured and cured on standard 1 inch×3 inch glass microscope slides (206B2, Karter Scientific, USA). Patterning of the Cu wetting layer, liquid metal deposition, HCl vapor application, and sealing were performed as described below. Sensitive components were placed using custom made manual pick and place setup (see FIG. 23) and passive components were placed with the help of a tweezer manually. Referring to FIG. 14D, to test the performance of the first circuit, the circuit was rotated in three Euler angles manually with and without mechanical deformation, and the 3-axis linear acceleration, 3-axis angular rotation, and 3-axis magnetic field strength were measured from the IMU. As shown in FIG. 14D, in addition, the change in circuit temperature due to contact with the user was recorded from the temperature sensor. The data from the digital IMU were transformed into the three Euler angles of absolute orientation, and those angles were illustrated in MATLAB (R2016b) as rotations on a rectangular block. Similarly, the temperature sensor data was used to change the color of the animated block in real-time. Referring to FIG. 14C, the performance of the second circuit was demonstrated by applying tilt and pitch to the circuit manually with and without mechanical deformation, while measuring the gravitational acceleration from the sensor. Using the measured acceleration signal, the tilt and pitch angles were calculated, and the tilt and pitch angles were used to move an animated block in MATLAB (R2016b) in real-time. Data coming from the circuits were acquired using a microcontroller board (Arduino Due, Arduino, USA) and processed and plotted in MATLAB in real-time. The goniometers (ANT 20G-90 and ANT 20G-50, Aerotech, USA) used were rotated with constant speed of 2 degree/second and 0.5 degree/second, respectively, between 0° and 5° and 0° and −5° in pitch and roll angles. As shown in FIG. 14E, the sample circuits tested under tensile loading up to failure had a thickness of 1.9±0.05 mm.

Metallurgical Sample Preparation:

EGaIn treated KXTC9-2050 analog accelerometer chip and MPU9250 digital IMU chips were salvaged from prepared LM-based circuits after 6 months. The excess EGaIn was thoroughly cleaned from the component pin surfaces with IPA. After cleaning the chips were mounted on a custom made stainless steel jig using Crystalbond 509 (Aremco Products Inc, US). The samples were first ground down starting from 240 grit paper to 4000 grit SiC papers. Then polished with 1 micrometer and 0.5 micrometer diamond papers, respectively. All the samples were investigated using a scanning electron microscope (Quanta 600, FEI Company, US) and elemental maps were obtained using EDS up to 40 keV range.

Results and Discussion

Electrical Contact Between Liquid Metal and the Component Pins

The electrical connection between liquid metal interconnects and the component pins with and without HCl vapor soldering was investigated using EGaIn. A test circuit design on a conventional PCB board, including two Cu interconnects that is connected by a zero-ohm surface-mount resistor was prepared. Circuit resistance was measured using a microohmmeter with 4-point contact probes to isolate the properties of liquid metal-component interface from mechanical and electrical effects of the LM leads (interconnects). LM was deposited only on the portion of the Cu pads where the component was connected. In total, three sets of 10 test samples were fabricated. In one set, conventional solder paste was used to connect the component with the interconnect pads using reflow soldering (the conventional solder paste (CSP) set). This set was considered as the reference, since it was produced with conventional PCB fabrication methods. In the other two sets, EGaIn was used as the solder material. One of the EGaIn soldered sets was treated with HCl (the HCl set) while the other was not treated (the non-HCl set). Another set of samples with the same trace dimensions (FIG. 30B) but without any microelectronic component (the no-component (NC) set) was also prepared.

For the cases with EGaIn, the conductivity was measured immediately after placing the microelectronic component onto the applied drops (before the HCl treatment for the HCl set). 9 out of 20 samples had no immediate electrical conductivity. The HCl treatment was then applied to a subset of 10 samples, and the conductivities of all samples (including the soldered samples) were subsequently tested. The resistances of the conductive samples are shown in FIG. 5.

At hour zero, 4 out of 10 of the non-HCl samples had no conductivity: 2 of those gained conductivity after 15 min, one gained conductivity after 2 days, and one failed to gain conductivity within the 12 day test period. Furthermore, the 6 samples that were conductive exhibited very large variations in conductivity values. The resistance from the functional non-HCl samples reduced steadily after day one. On day 12, the resistance was stable at 60.6±4.9 mΩ Immediately after the application of HCl vapor, all samples from the HCl-treated set showed a high level of conductivity, similar to those from the CSP set. The resistance remained about constant in time, with a very small amount of variability. On average, the resistances of the HCl-set and the CSP set were 48.2±2.0 mΩ and 47.2±0.4 mΩ, respectively. The resistance measured from the NC set was 40.9±0.3 mΩ The resistance measured from the NC set showed that about 40.9 mΩ of the resistance measured corresponds to the copper interconnects while the remaining value corresponds to the solder-component interface and the component itself. HCl treatment resulted in more than 2.5 times less resistance at the interface and more than 50% reduction in variability at the interfacial resistance.

Figure 10:
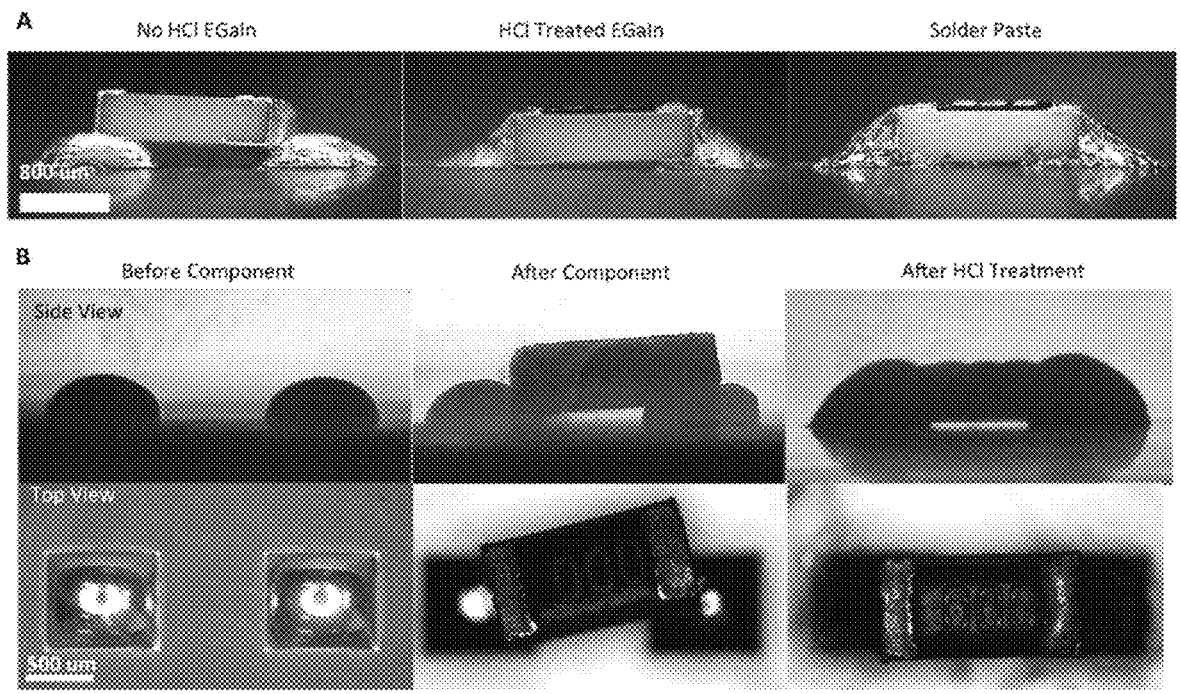
FIG. 10 illustrates a liquid metal circuit lacking HCl treatment and a liquid metal circuit having HCl treatment according to the present invention.

FIG. 10B shows the shape of the liquid metal at the component-liquid metal interface before and after HCl vapor application. FIG. 10A shows the side views of a surface-mount resistor in contact with LM-coated Cu contact pads with and without HCl treatment. As a reference, a side view of a surface mount device-copper connection was obtained using conventional solder paste. Before the HCl treatment, the component rested on the LM-coated Cu pads and had a limited contact area. When HCl vapor was applied, liquid metal surrounded the component pins (composed of Sn-plated Cu). This not only increased the interfacial contact area, potentially reducing the contact resistance, but also produced a better mechanical connection between the LM and microelectronic component. As shown in FIGS. 10A and 10B, the HCl treated LM-component interface resembles the conventional solder-component interface.

FIG. 5 shows certain benefits to using HCl vapor to solder the packaged components to the terminals of the LM circuit to make immediate and reliable electrical connectivity. When HCl vapor is not applied, the electrical contact may take hours or days to form. Without wishing to be bound to any particular theory, considering that the component pins are tin coated, the time-dependent connectivity in the absence of HCl vapor may be related to the reactive wetting observed between EGaIn and Sn.

Without wishing to be bound to any particular theory, it is believed that the present invention provides one or more of the following advantages relative to existing fabrication methods: (i) the HCl treatment provides more reliable fabrication of robust LM-component interfaces, i.e., higher yield (20/20 work, versus only 11/20 without HCl treatment), more reliable conductivity in time, and less variations in conductivity; (ii) when treated with HCl, LM-component interfaces become conductive immediately and maintain a stable contact resistance, with very low variability over time; and (iii) with HCl treatment, the interface conductance is similar to or better than that of a conventional solder joint. Referring to FIGS. 10A and 10B, the interfacial contact area is larger in the treated versus nontreated case, and this may relate to a lower contact resistance between the component pins and the LM leads.

Self-Alignment of Components Through HCl Treatment

FIG. 10B shows the top and side views of the EGaIn drops applied on the Cu pads, initial placement of a component on the pads, and the component after the HCl treatment. Although the component was placed in a misaligned manner with respect to the layout of contact pads, without wishing to be bound by any particular theory, it is believed that the HCl vapor exposure caused the component to self-align itself with respect to the contact pads dur to the high surface tension of the liquid metal. FIG. 10B shows self-alignment for the EGaIn-microelectronic interfacing.

The self-alignment was evaluated by the placement of nine components. For this purpose, the misalignment of the components both before and after the application of the HCl vapor was measured. The test design included two LM-contact pads patterned on a Si-wafer backed PDMS substrate. The component (zero-ohm resistor) was placed on these pads manually.

Figure 11:
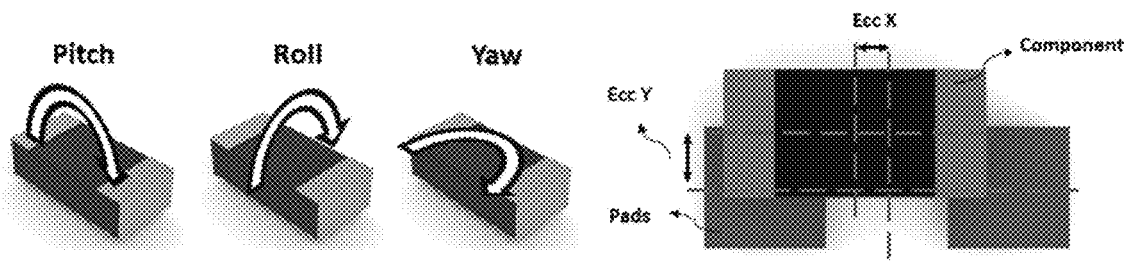
FIG. 11 illustrates results of self-alignment quantification of liquid metal circuits according to the present invention.

FIG. 11 shows a schematic description of the angular and translational misalignment of a component with respect to the contact pads. The angular misalignments are represented by three Euler angles (roll, pitch, and yaw), and the in-plane translational misalignments are described by the eccentricity (Ecc X and Ecc Y) of the component geometric center with respect to the geometric center of the connection pads on circuit. The average values of these quantities are presented in the table in FIG. 11. As shown in FIG. 11, the HCl treatment reduced the misalignment and associated standard deviation in each Euler angle. Although to a lesser extent, the eccentricity along the in-plane translational axes was also reduced by the HCl treatment. As also shown in FIG. 10B, the vertical distance between the substrate surface and the component surface decreased by the HCl treatment from 568±28 micrometers to 455±7 micrometers, which is approximately equal to the component thickness (450 micrometers according to the manufacturer's datasheet). This means that the gap between the substrate and the component was almost completely closed after the treatment. By reducing the misalignment, such behavior may allow for the fabrication of high density circuits without violating minimum clearances between component pins and between components dictated by printed circuit board manufacturing standards. For prototyping purposes, self-alignment may reduce or eliminate the use for expensive, high-accuracy tools for precision component placement.

Strain Limit and Electromechanical Response

Figure 12:
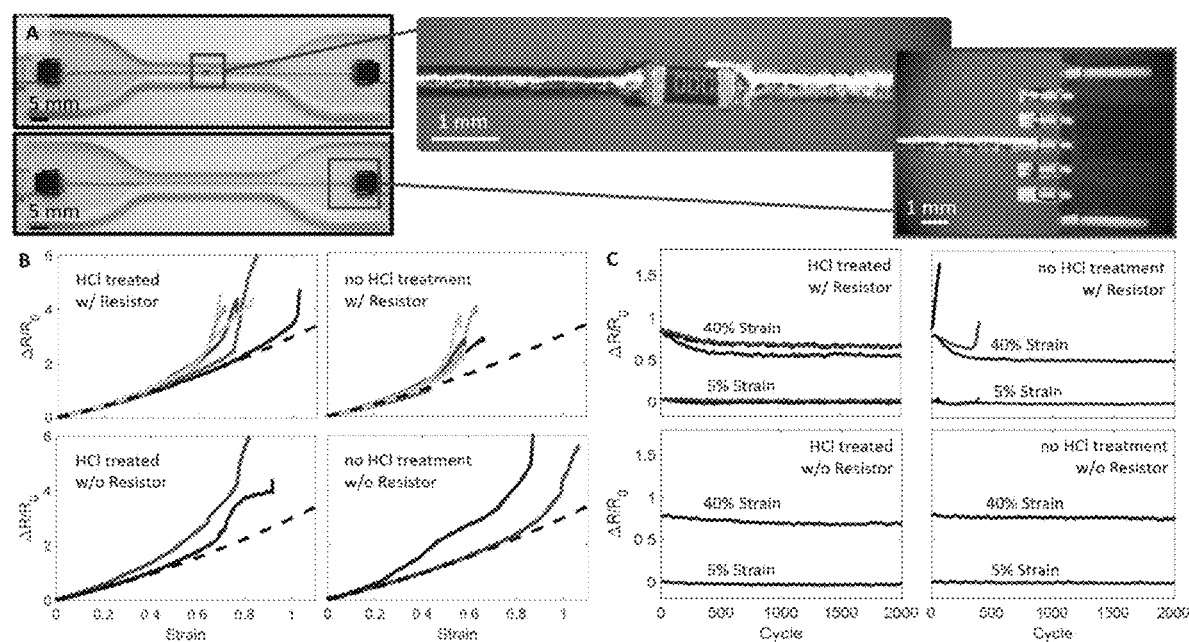
FIG. 12 illustrates results of tensile testing of liquid metal circuits according to the present invention.

To obtain a quantitative assessment of the electromechanical behavior of the LM-based circuits and component-LM interfaces, quasistatic tensile tests were conducted on specimens containing a zero-ohm surface-mount resistor and LM interconnects. Referring to FIG. 12A, two sets of six test samples were fabricated, with one of the sets treated with HCl vapor. Referring to FIG. 12A, measurements were also performed on an additional pair of two test samples that only had an LM trace with no surface-mount resistor. Similarly, one of the sets in the LM-only samples was treated with HCl vapor.

FIG. 12B shows the relative change in electrical resistance ($\Delta R/R_0$) with the applied strain (E) and the associated theoretical predictions. The theory is derived from Ohm's Law and assumes that the change in electrical resistance is governed by the change in conductivity of the LM leads. Referring to FIG. 12B, the highest strain values at failure—84.5±9.4% with HCl treatment and 86.3±12.6% with no treatment—were observed for the LM-only circuits, i.e., when there is no micro-electronic component integrated in the circuit. For the circuits with a microelectronic component, the maximum strain values of 82.6±13.3% and 57.7±7.9% were observed with and without HCl treatment, respectively. These results may indicate that the HCl treatment may enable LM-microelectronic interfaces with similar stretchability as that of the LM-only circuits. Further, HCl treatment increased the mean strain at failure by about 25% for circuits with microelectronics components.

Figure 34:
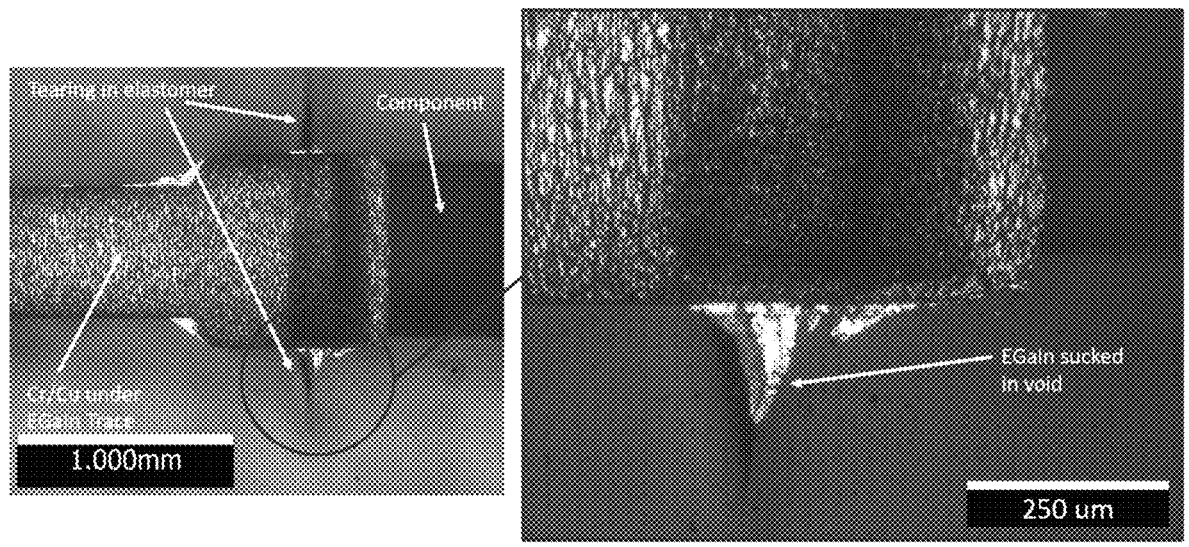
FIGS. 34 and 35 illustrate ruptures at the interface of a liquid metal and lead-component interface.

As shown in FIG. 12B, the strain-resistance behavior agrees with the theoretical estimation in HCl-treated case for up to about 60% strain and in nontreated case for up to about 40% strain. Beyond these strains, the strain-resistance behavior deviated significantly from theory. Without wishing to be bound to any particular theory, the LM, lead-component interface showed the rupturing of the elastomer at the interface and the formation of the voids in which the liquid metal infiltrates (see FIG. 34). As the sample is stretched, the voids grew larger and more LM leaks into the voids until the sample completely failed. Comparing the geometry of LM on the leads (length, width, height were 45 mm, 0.6 mm, 30 micrometers, respectively) with the LM on the contact pads at the component pin interface (length, width, height were 0.8 mm, 0.8 mm, 500 micrometers, respectively), the volumes of the LM on these two regions were comparable. However, assuming LM-pin interface was formed properly, the resistance of the LM at the leads was two orders of magnitude higher than the resistance of the LM at the component pads, and thus, dominated the measured resistance. Therefore, the flow of LM from the leads and pin interface and into the voids may have an effect on the measured resistance. The difference between the theoretical approximation and the experimental results may be likely related to the theoretical approximation that ignores this flow of liquid metal at the onset of the mechanical failure and only considers the strain-controlled electromechanical response of the LM leads.

Figure 35:
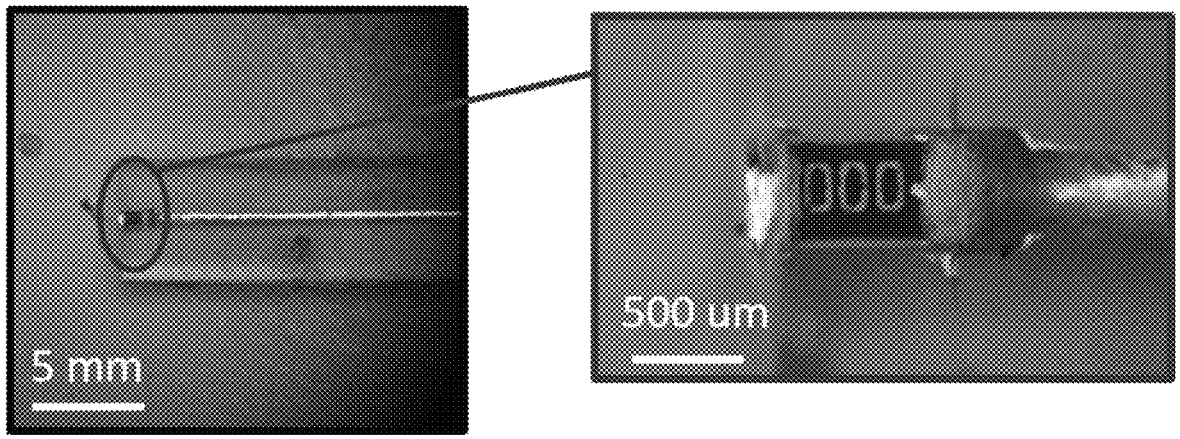

Finally, without wishing to be bound to any particular theory, the loss of conductivity may be related to the mechanical rupture of the elastomer rather than electrical failure of the LM leads or LM-pin connections. Referring to FIG. 35, the samples having embedded components may show failure at the LM-component interface. When loaded to beyond 80% strain, test circuits having embedded rigid components failed due to tearing at the interface between the LM lead and component pin. This location of failure may be expected since the mechanical mismatch may lead to stress concentrations. FIG. 10B shows the geometry of the LM connection with and without HCl treatment. With HCl treatment, the interface has a smooth transition that fully encapsulates the ends of the component. By contrast, the nontreated samples exhibit an abrupt transition that connects mainly at the bottom edges of the components. Referring to FIG. 10B, the top views of the HCl treated and nontreated samples showed characteristics similar to the side views. Furthermore, in nontreated circuits, the component had an arbitrary orientation while in HCl treated circuits, the component was aligned along the axis of interconnects. Such a misalignment that exposes the corners of the components and the cusp-like LM-component interface may result in stress-concentrations and points of premature delamination that drive the system into mechanical failure. Factoring this additional contribution to electromechanical coupling may benefit from 3D computation modeling of the "three-body" liquid-component-elastomer interface using finite element analysis (FEA).

Electromechanical Response During Cyclic Loading

The fabricated circuits were functional under various loading conditions and associated strains. The electromechanical behavior was examined for specimens by loading 2000 cycles between 5% and 40% strain. As with strain limit testing, measurements were performed on four types of specimens: (i) zero-ohm chip with LM leads and HCl treatment, (ii) zero-Ohm chip with LM leads and no HCl treatment, (iii) LM trace with HCl treatment and no chip, and (iv) LM trace with no HCl treatment or chip.

FIG. 12C shows the change of normalized resistance at maximum (upper line) and minimum (lower line) strains with increasing number of cycles. None of the three HCl-treated samples failed during the 2000-cycle test. The initial three nontreated samples, on the other hand, failed within the first 20 cycles (not shown in FIG. 12C). Out of another four new samples, only one survived the 2000-cycle test, and the other three failed before the completion of the test. The six nontreated samples failed prematurely and ruptured in the vicinity of LM-component interface. The crack at the interface grew with each cycle and resulted in failure.

The higher strain limit and endurance properties of HCl treated rigid component embedded samples to the reduced stress concentration may be achieved by one or more of the following: (i) at the component pin-LM lead interface, LM is fully encompassing the edge of the component pins such that there are no sharp corners; and (ii) the embedded component is aligned along the axis of interconnects. The results indicated that the electromechanical response is relatively repeatable and that there is no significant electrical hysteresis. All samples that survived 2000 cycles showed a slightly decreasing trend in electrical resistance with each cycle reaching a stable value after several hundred loading cycles. In samples with a microelectronic component, the amount of decrease with each cycle was more pronounced compared to the samples without a component. The observed decrease in resistance may be related to the component pin-LM lead interface. Although the normalized resistance values were very close at the initial cycles of the test, a small overall variation in the cyclic electromechanical behavior of the HCl treated samples having embedded component was observed. This variation may relate to the sample-to-sample variation in the deposited amount of LM to the LM-component interface.

Fabrication Method

Figure 8:
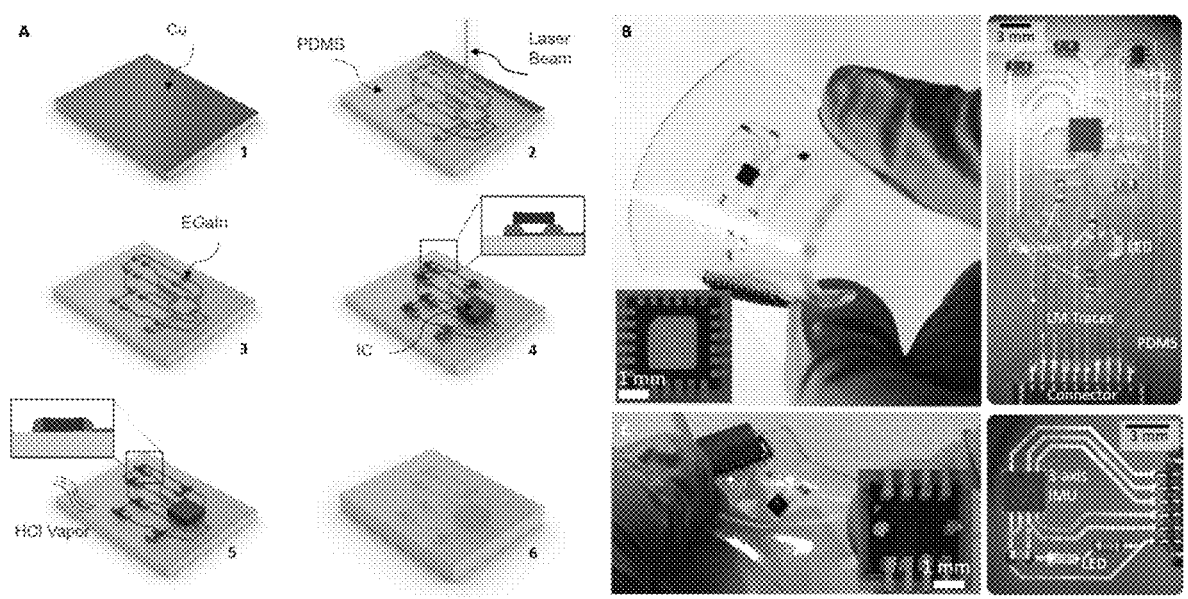
FIG. 8 illustrates a method of making a liquid metal circuit according to the present invention.
Figure 13:
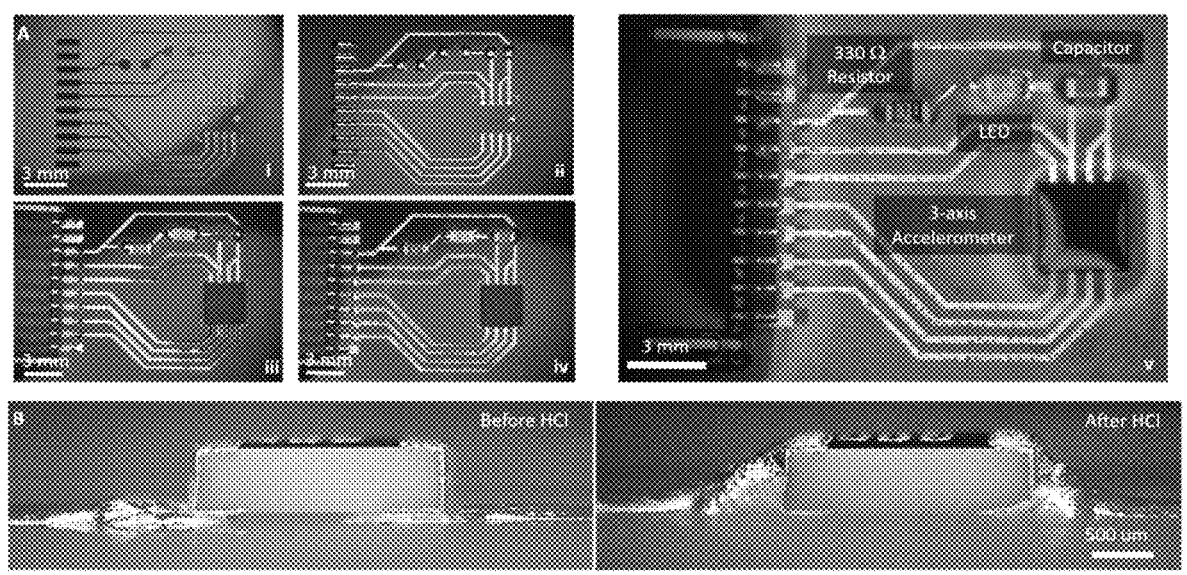
FIG. 13 illustrates a method of making a liquid metal circuit according to the present invention.

The method of circuit fabrication may generally comprise: (i) design of the circuit, (ii) fabrication of elastomeric circuit, (iii) electronics interfacing, and (iv) elastomer sealing. Certain steps of the fabrication method are shown in FIG. 8A. Analogous to PCB manufacturing and assembly, the first step may be to design the electronic circuit using a circuit design software (e.g., Autodesk EAGLE). The next step may be the fabrication of the circuit having liquid metal interconnects. Referring to FIG. 8A, the elastomeric substrate material (PDMS) may be obtained by molding and a Cu wetting layer may be sputter deposited directly on elastomeric substrate with a Cr adhesion layer between Cu and elastomer. Copper may be used as the wetting layer instead of Au since Cu is ubiquitous for electronics manufacturing, low-cost, alloys with EGaIn, and has better adhesion properties to the Cr adhesion layer than Au. Referring to FIG. 13A(i), the metal wetting layer may be patterned using a ultra-violet-laser micromachining (UVLM) system. As an alternative to direct patterning, the Cr/Cu layer may be patterned by using a stencil as a shadow mask during sputter deposition. The stencil may be produced by various methods, including, but not limited to, precision etching, DRIE, UV laser machining, precision micromachining, and carbon dioxide laser machining. As shown in FIG. 13A(ii), NaOH treated LM may be deposited on Cu wetting layer. NaOH treatment may reduce oxide that form on top of the Cu wetting layer and remove the oxide skin on the liquid metal surface, thus exposing the bulk EGaIn to Cu. As EGaIn readily wets the Cu wetting layer and does not adhere to the exposed PDMS surfaces, EGaIn may be selectively deposited onto the Cu traces. The liquid metal interconnects may have a linewidth as small as 10 micrometers, 20 micrometers, 30 micrometers, and 40 micrometers, for example. In regions where the gap between the traces are small, bridging between consecutive lines may occur due to excess liquid metal applied to the surface. To remove the excess liquid metal, the sample may be dipped into 3% w/w NaOH treated liquid metal bath vertically. Referring to FIG. 13A(iii)-(iv), the microelectronic components may be placed on their designated positions and may be exposed to HCl vapor to the locations where liquid metal contacts the electronic terminals. Gently blowing HCl vapor may remove the oxide layer on LM and on component pins, and bring materials in contact to initiate soldering between LM leads and component pins. The vapor-controlled removal of the gallium oxide may expose the bulk EGaIn alloy. Having a copper wetting layer on the substrate may provide alloying between the liquid metal and copper to prevent/reduce dewetting and removal of LM when exposed to HCl vapor. Without this wetting layer, applying the vapor may result in distortion of the circuit and degradation of the LM-substrate interface. Referring to FIG. 13A(v), the circuit may be sealed by pouring and curing the top elastomer layer, thereby entirely encapsulating the LM-based circuit.

Circuit Implementations

Functional circuits comprising the LM interconnects and microelectronics components were made and tested. The hybrid circuits included analog and digital sensors having surface-mount integrated circuit packages, including land grid array (LGA), quad flat no-leads (QFN), and small-outline transistor (SOT) architectures. The pin architecture of each package is shown in FIG. 14A. As shown in FIG. 14B, each circuit also included other surface-mount components such as an flexible flat cable (FFC) connector, a light-emitting diode (LED), and various passive components (capacitors and resistors).

Referring to FIG. 8B, the first circuit comprises a digital IMU (surface-mount with QFN packaging) and a digital temperature sensor (surface mount with SOT packaging) that are connected with LM interconnects. Referring to FIG. 8C, the second circuit comprises an analog 3-axis accelerometer (surface-mount with LGA packaging), surface-mount capacitors, and an FFC connector connected by LM interconnects. The IMU having QFN packaging has surface mount contacts having a 200 micrometer width and a 400 micrometer pitch, while the accelerometer with LGA packaging has a 350 micrometer width and a 650 micrometer pitch. The representative images of the functioning stretchable circuits are shown in FIGS. 13B-D.

To verify the electrical circuit performance quantitatively, the circuit measurements were compared to the motions of a precision two-axis goniometer. For this purpose, both circuits were loaded on a motorized goniometer and smoothly rotated in pitch and roll angles by ±5°. The rotation angles from the IMU followed those from the goniometers with less than 1% deviation. For the analog accelerometer, the difference was within 8%.

A set of quasistatic tensile tests was conducted to quantify the strain limit of these hybrid circuits. The electrical resistance and strain of the sensors were simultaneously recorded during tensile loading. Two samples for each circuit were made and tested up to failure. The circuits with IMU and temperature sensors mechanically failed at strains of 39% and 42%, and the circuits with the analog accelerometer failed at the strains of 55% and 60%. FIG. 14E shows representative images that show the circuits tested until failure at different applied strains. No electrical failure was observed in any test prior to mechanical failure, and the samples failed mechanically at the LM-pin interface of the largest circuit component. Without wishing to be bound to any particular theory, this failure mode may be related to the strain concentration at the circuit component/elastomer interfaces. The differences in the strain limits may arise from the circuit designs and component geometries. In the tested strain range, the standard deviations of the measured accelerations for the analog accelerometer circuit in the X, Y, Z directions were 0.011 g, 0.004 g, 0.007 g, respectively. For the digital IMU and temperature sensor circuit, the standard deviations of the measured accelerations in X, Y, Z directions were 0.005 g, 0.001 g, 0.008 g, respectively. The standard deviations of the measured rotational rates in X, Y, Z directions were 0.139 deg/s, 0.151 deg/s, and 0.071 deg/s, respectively, while the standard deviations of the measured magnetic field strengths in X, Y, Z directions were 0.01, 0.01, 0.016 Gauss, respectively. Finally, the standard deviation of the digital temperature sensor was 0.032° C. In general, the variation in the acceleration data from the analog accelerometer was higher than that from the digital IMU sensor. Since the applied strain changes the resistance of the LM interconnects, the data transmitted from the analog sensor may vary more than that transmitted from the digital sensors.

Example 2

Reproducible, controllable, and scalable manufacturing of LM-based SSEs may be useful for commercial adoption. The ability to control the deposited amount of LM, and to create precise and reproducible LM patterns may be used to obtain desired and consistent electrical characteristics that are useful for the commercialization of LM-based soft electronic circuits. A scalable manufacturing process for LM-based SSEs may comprise photolithographic patterning of copper wetting layer with a LM deposition process. This may be referred to as LM dip-coating. The manufacturing process for LM-based SSEs may comprise a LM dip-coating process wherein EGaIn may be selectively loaded without manual execution on the designed wetting layer patterns made of a thin metal layer.

A method of LM dip-coating may comprise exposing/immersing a substrate inside of a LM bath with little or no motion for a designated "dwell time" sufficient for to provide the LM enough time to wet the substrate surface. The substrate may be withdrawn from the LM bath at a constant speed. Without wishing to be bound to any particular theory, one or more of the following parameters of the LM deposition with dip-coating may be selected to achieve consistent LM pattern geometries: dwell time, line width, withdrawal speed (U), wetting layer geometry (width, Wand orientation, Θ). The statistical significance of each parameter may be described using an analysis of variance (ANOVA) technique.

Introduction

Figure 15:
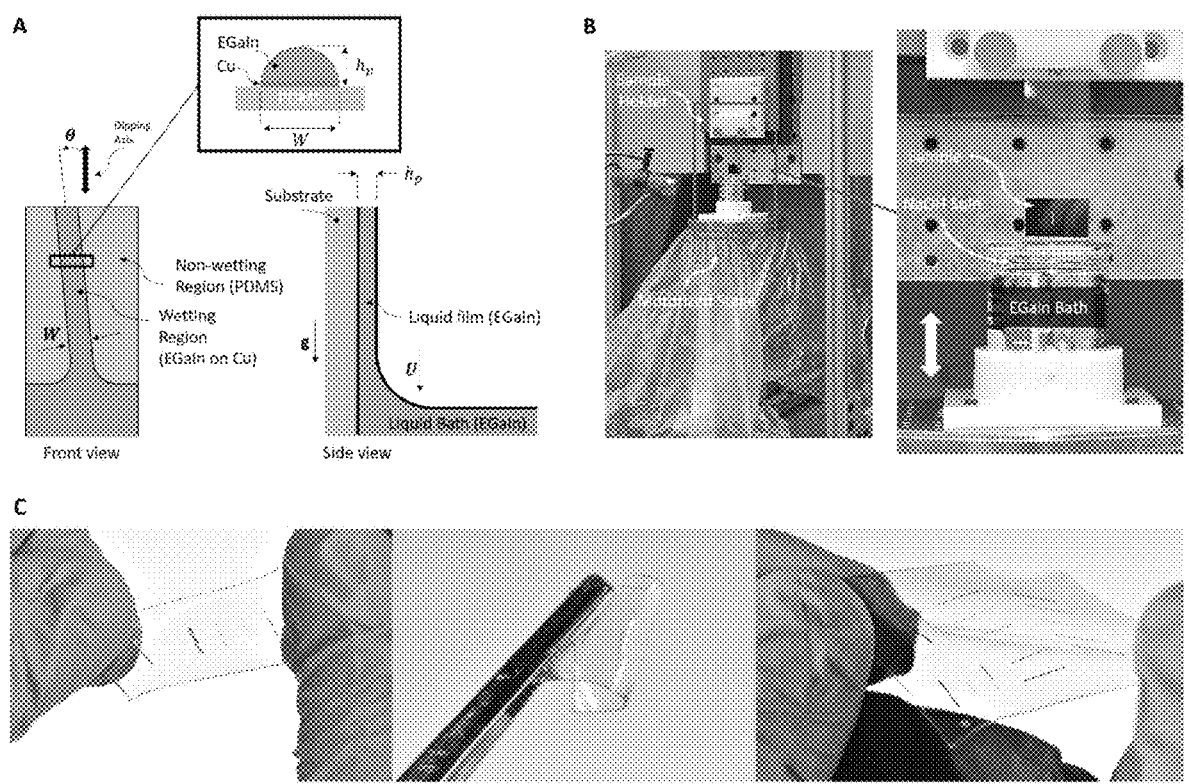
FIG. 15 illustrates a method of making a liquid metal circuit according to the present invention.

A schematic representation of dip-coating process is shown in FIG. 15A. A method of LM dip-coating may comprise vertical dip-coating of a wetting layer having width W and orientation Θ on a non-wetting plate that may be withdrawn from a bath (i.e., a reservoir) filled with the LM to be coated. The orientation Θ may be defined as the angle between the longitudinal axis of the wetting layer and the dipping axis (i.e., the direction of dipping). The plate may be withdrawn from the bath at a substantially constant velocity U. The capillary length ($l_c$) may be defined as the characteristic length scale of the liquid and it may scale the radius of curvature of the static capillary meniscus (meniscus shown in FIG. 15A) on a completely wetting surface and may be described as follows:

$$l_c = \sqrt{\frac{\gamma}{\rho g}} \quad (4.1)$$

where $\gamma$ and $\rho$ are the interfacial tension and density of the liquid, respectively, and g is the gravitational acceleration. For an infinite, homogeneous and flat plate (W>>$l_c$ and Θ=0) that is withdrawn at a constant speed U, the relationship for peak height or centerline thickness of the deposited liquid ($h_p$) may be described as follows:

$$h_p = 0.946 l_c Ca^{2/3} \quad (4.2)$$

where Ca is the capillary numbers and may be described as follows:

$$Ca = \frac{\mu U}{\gamma} \quad (4.3)$$

where $\mu$ is the viscosity of the liquid. When W<<$l_c$, there may be a second curvature in the direction transverse to the liquid adhering to the wetting layer. This transverse curvature may become the dominating length scale for the deposited film thickness and may result in much thinner liquid films. Far above from the bath surface, the peak height or centered thickness of the deposited liquid ($h_p$) may be constant along the vertical direction. The liquid may be only entrained on the wetting region. When it is deposited on the plate and removed from the bath, it may assume a cylindrical cap shape dictated by the liquid's interfacial tension and the substrate width. Assuming perfect wetting, viscous forces and gravity may affect the liquid motion in this region. At the bath surface, the shape of the meniscus may be governed by the balance between hydrostatic pressures and capillary forces. The overlap between those two regions may be referred to as the "dynamic meniscus" region and may be governed by the balance between viscous, capillary and inertial forces (if any). The flow in the dynamic meniscus may control the dynamics of the liquid film and its thickness.

Using this representation, the seeding relationship (for Θ=0) and showed that the deposited liquid thickness not only depends on Ca but also W:

$$h_p = KWCa^{1/3} \quad (4.4)$$

where the constant K is as 0.356. Both Equations 4.2 and 4.4 were derived for completely wetting Newtonian liquids using lubrication approximations. The assumptions of lubrication approximations may be summarized as: (i) negligible gravitational and inertial effects, (ii) non-evaporating liquid, and (iii) liquid height is smaller than substrate length ($h_p$<<L). The assumption may be valid when Ca<about $10^{-2}$, above which gravitational effects start to show up and contributes to less liquid entrainment on the substrate.

For EGaIn dip-coating on a copper wetting layer, EGaIn may be assumed to perfectly wet to the metallic surface (due to the alloying between EGaIn and Cu) and EGaIn may be assumed to not wet the PDMS surface. Furthermore, EGaIn has been shown to exhibit a Newtonian liquid behavior when the oxide skin was dissolved. Assuming NaOH treated EGaIn as a Newtonian liquid with a viscosity ($\mu$) about 1.99 mPa·s, interfacial tension ($\gamma$) of about 500 mN/m, and a density ($\rho$) of about 6250 kg/m$^3$, the capillary length may be about 2.8 mm. Furthermore, using the same values for liquid properties, the withdrawal speed at which the gravitational effects starts to show up may be about 2.5 m/s. Hence, for the withdrawal speed range less than 300 mm/s, no gravitational effect may be expected.

Materials

The substrate material used in test samples was polydimethylsiloxane (PDMS). It was prepared with Sylgard 184 (Dow Corning, USA) using a 10:1 oligomer to curing agent ratio. A 3% w/v NaOH solution was prepared by diluting 30% w/v NaOH solution (BDH Chemicals) with deionized water (100%, McMaster-Carr, USA). Deionized water (DI water) and isopropyl alcohol (IPA) (2-Propanol ACS 99.5% min, Alfa Aesar, USA) were used to clean the surface of samples after liquid metal deposition. Eutectic gallium-indium alloy was prepared by mixing Ga (Gallium Source, USA) and In (Gallium Source, USA) at a 75.5:24.5 ratio by mass, and heating and homogenizing at 190° C. on a hot plate for 12 hours.

Dipping Setup

A setup used in the dipping experiments is shown in FIG. 15B. The setup included a motorized stage that moves the EGaIn bath for dip-coating and a fixed sample holder. The bath containing 3% w/v NaOH treated EGaIn was attached to a 5-axis stage (AI-TRI-HR4, ALIO Industries, USA). The stage included rotational axes which may be employed. The vertical axis of the stage was used in the dipping while the horizontal axes of 5-axis stage were used for centering the sample with respect to the bath. The sample holder and the bath holder were 3D-printed (Objet30, Stratasys, USA). The experimental setup may accommodate constant withdrawal speeds up to 300 mm/s along about a 27 mm vertical dipping range while carrying the EGaIn bath.

Fabrication of Samples

A 4-inch single-crystal silicon wafer was cleaned by rinsing with acetone and IPA and blow dried with nitrogen. Then the silicon wafer was surface treated with four drops of trichloro(1H,1H,2H,2H-perfluorooctyl) silane (TFOCS, purchased from Sigma Aldrich, USA) under vacuum for 45 minutes to remove the PDMS. TFOCS vaporizes and deposits as a monolayer through siloxane bonding. Next, the silicon wafer was spin coated with PDMS (base and curing agent 10:1 weight ratio, Sylgard 184, Dow Corning, USA) at 800 rpm for 30 seconds and cured on a hotplate at 60° C. for 8 hours. Next, a 20 nanometer chromium (Cr) adhesion layer (30 W power, 20 mTorr pressure) was sputter deposited on the PDMS substrate. Then a 150 nanometer copper (Cu) alloying layer was sputter deposited (30 W power, 5 mTorr pressure; Perkin-Elmer 8L, USA) on the chromium (Cr) adhesion layer. The thickness of copper was selected as the minimum thickness that may be deposited without any cracks. Thinner copper layers may result in a cracked wetting layer. Moreover, as the copper thickness increased, the spatial frequency of the cracks decreased and diminished at about 150 nanometer thickness. Positive photoresist was spin coated on Cu surface at 4000 rpm for 30 seconds with a spreading run at 600 rpm for 6 seconds (AZ 4210, Microchemicals, Germany) resulting in a thickness of about 2.1 micrometers. Next, the photoresist was left to dry for 24 hours at room temperature since baking cracks metal and photoresist layers due to the thermal expansion coefficient mismatch between layers. The substrate was exposed to UV light using a contact mask aligner (MA6, Suss Microtec, Germany) for 170 seconds (UV300 filter, 320 nanometers at 5 mW/cm$^2$) through a transparency mask containing the desired sample design (purchased from CAD/Art Services Inc, USA). The photolithography masks were designed in Circuit-Maker (Altium Limited, Australia). Following the exposure the photoresist was developed for 1.5 minutes (AZ Developer 1:1 ratio, AZ Electronic Materials, Luxembourg). The substrate was exposed to UV light using a contact mask aligner for 400 seconds without a mask (i.e. flood exposure) (UV300 filter, 320 nanometers at 5 mW/cm$^2$). Next, Cu and Cr layers were wet etched. The Cu layer was wet etched for 120 seconds using a 1:15 volume ratio of Cu etchant (APS-100 Copper Etchant, Transene Company Inc, USA) to DI water solution. Likewise, the Cr layer was wet etched for 90 seconds using a 1:10 volume ratio of Cr etchant (Chromium Cermet Etchant TFE, Transene Company Inc, USA) to DI water solution. The photoresist mask was then stripped off by immersing the substrate into photoresist developer for 1.5 minutes (AZ Developer 1:1 ratio). The stripping was done using the photoresist developer since acetone may swell PDMS and result in cracks in the metal features. Before dicing, the substrate was spin coated again at 4000 rpm for 30 seconds with a spreading run at 600 rpm for 6 seconds and left to dry for 24 hours at room temperature. The substrate was exposed to UV light using a contact mask aligner for 400 seconds without a mask (i.e. flood exposure). After that the wafer was diced into final sample shape with a dicing saw (782-6 Dicing Saw, Kulicke and Soffa Industries Inc, US). Photoresist coating protects the Cu patterns from cracking and wafer dust during dicing. After dicing individual samples were attached to glass slides using a cyanoacrylate-based glue (Krazy Glue Home And Office Brush-On, Elmer's Products, USA). After that, the photoresist layer was stripped off by immersing the substrate into photoresist developer for 1.5 minutes (AZ Developer 1:1 ratio). Finally, the substrate was attached to the dip-coating experimental setup and immersed into 3% w/v NaOH treated EGaIn bath with the specified speed. The volume of aqueous NaOH solution on LM is 3.5 mL, which created an aqueous NaOH film about 8 mm thick. It was then kept in the bath for a desired dwell time to allow the LM wet to the copper surface and then withdrawn from the bath with a specified constant speed. Following the dip-coating the EGaIn coated substrate was immersed horizontally into DI water and IPA to clean residual NaOH and then dried on a hotplate with 60° C. for 10 minutes.

Characterization of Liquid Metal Patterns

The printed EGaIn geometries were measured with a white light interferometer (using NewView, Zygo, USA). The microscopy images were taken by using either a stereo microscope (purchased from McMaster Carr Inc, USA) or using the microscope of a 3D surface measurement system (Infinitefocus, Alicona, Austria). The obtained geometrical data were processed in MATLAB (MATLAB 2016, MathWorks, US) along with statistical analysis and modeling.

Results and Discussion

Dwell Time for Liquid Metal Dip-Coating

The time the substrate is kept inside the LM bath may be sufficient to achieve a consistent and successful LM deposition in dip-coating. In the solder dip-coating, for example, it was shown that when the dwell time was too short, incomplete or inconsistent wetting may occur. In order to determine the dwell time sufficient for successful liquid metal dip-coating, a randomized parametric study was conducted using two different experimental designs. The first set of samples were PDMS coated one inch silicon wafers that were completely coated with a thin film of copper, which may be referred to as the "blanket samples". The second set of samples had a wetting layer design shown in FIG. 16A, which may be referred to as the "line samples". Both set of samples had the same thickness of copper alloying/wetting layer (about 150 nanometers) sputter coated on PDMS using the same settings and same thickness of chromium adhesion layer (about 20 nanometers) between the PDMS and copper layers. The line samples were patterned using photolithography and wet etching on a PDMS coated Si wafer as described above and diced into specimen as shown in FIG. 15B and FIG. 16A. Each specimen included wetting layer strips of copper having widths of 10 micrometers, 30 micrometers, 50 micrometers, 100 micrometers, 200 micrometers and 500 micrometers, respectively, and a length of 5 mm. In total there were 6 strips (one per each line width). The gap between two adjacent lines along their width axis was about 3 mm (>$l_c$ of NaOH treated EGaIn) to minimize any potential areal effects between individual lines. The immersion and withdrawal speeds were kept constant at 1 mm/s and 75 mm/s, respectively.

The experiments were conducted as follows:

TABLE 1

The results for minimum dwell time for consistent dip-coating experiment.

| Line Width (μm) | Minimum Dwell Time (min) |
| --- | --- |
| 10 | N/A |
| 30 | N/A |
| 50 | 11 |
| 100 | 9 |
| 200 | 7 |
| 500 | 7 |
| Blanket samples | 1 |

The samples were first immersed in the bath with a constant immersion speed of 1 mm/s. Then, the samples were kept there for the desired dwell time. Lastly, the samples were withdrawn with a constant speed of 75 mm/s. The dwell times investigated were 1 minute and 3 minutes for the blanket sample set and 1 minute, 3 minutes, 5 minutes, 7 minutes, 9 minutes, 11 minutes, 13 minutes and 15 minutes, respectively, for the line sample set. To determine a dwell time that achieves successful and consistent coating between different samples, 3 different samples were used for each dwell time (24 specimens and 144 lines for line samples and 6 wafers for blanket samples in total). After the dipping was conducted, each sample was investigated visually under microscope to determine the percent of wetting layer area that was covered with LM.

Figure 16:
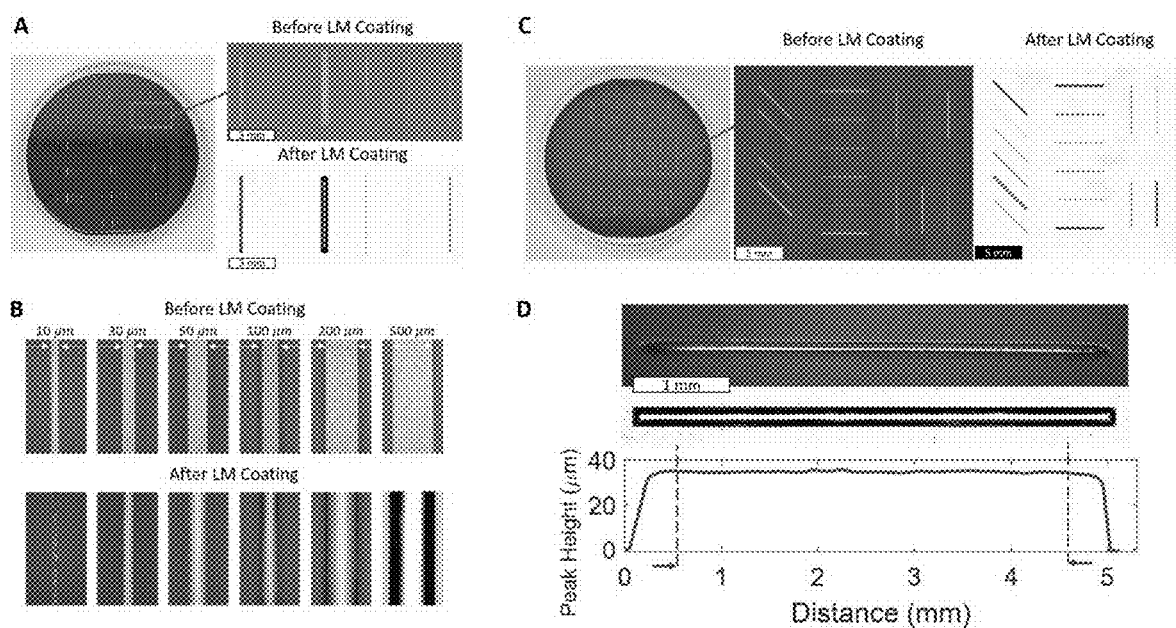
FIG. 16 illustrates liquid metal circuits according to the present invention and characteristics thereof.

FIGS. 16A and 16B show the wetting layer geometries before and after LM dip-coating. The wetting behavior of LM in dip-coating was binary within the dwell times for line samples. No partial wetting behavior in any of the lines was observed; for a given dwell time each individual line was either completely coated with LM or not coated at all. Furthermore, all the blanket samples were completely coated with LM within the dwell times.

Table 1 shows the results for minimum dwell time for consistent LM dip-coating. The minimum dwell times reported in the table were the minimum times that resulted in complete wetting for all three samples consistently. The blanket samples were completely loaded with EGaIn after 1 minute dwell time. In the second set, LM lines down to 50 micrometers width consistently. The results show that the dwell time sufficient for LM to wet the copper layer decreased with the increasing wetting layer line width or area.

Referring to Table 1, at 30 micrometer width, only one out of three samples successfully deposited LM having 11 minutes and 13 minutes of dwell times, respectively. In the remaining two samples, however, the wetting layers were peeled up from the PDMS surface either partially or completely. FIG. 16B shows at 10 micrometers width, either no wetting (in short dwell times), or complete or partial peeling of wetting layer from PDMS within the range of dwell times studied. Without wishing to be bound to any particular theory, it is believed that when the substrate is inside the LM bath and the LM is wetting to the Cu layer, a peeling force is applied on the wetting layer by the surface tension of LM. When the wetting layer area is small (e.g. for a line width of 10 micrometers), the adhesion between PDMS and the wetting layer may not be sufficient to prevent peeling against surface tension forces and may cause partial or complete peeling from PDMS. Alternatively, the inertial and viscous forces applied on the wetting layer during withdrawal from the bath combined with the surface tension may cause mechanical failure of the adhesion layer. As discussed in more detail below, however, when the immersion speed and dwell time is constant at 1 mm/s and 11 min, respectively, at a withdrawal speed less than 0.1 mm/s (such as 0.08 mm/s, for example), partial peeling of wetting layer geometries even with relatively large line widths of 50 micrometers, 100 micrometers and 200 micrometers may be achieved. Withdrawal speeds less than 0.1 mm/s caused the sample to stay in the bath for an additional time greater than 9 minutes, increasing the total immersion time to more than 20 minutes. Without wishing to be bound to any particular theory, it is believed that long immersion times may affect the adhesion of wetting layer to PDMS substrate (possibly due to the alloying between EGaIn and Cu), and cause peeling due to surface tension force since the inertial and viscous forces were negligible in such small withdrawal speeds.

TABLE 2

Experimental parameters investigated for LM dip-coating.

| Parameter | Levels |
| --- | --- |
| Orientation (deg) | 0, 45, 90 |
| Line Width (m) | 50, 100, 200 |
| Withdrawal Speed (mm/s) | 0.1, 1, 10, 25, 75, 300 |

4.4.2 Characterization of Liquid Metal Dip-Coating

The effects of the process parameter (withdrawal speed, U) and wetting layer geometry (width, W, and orientation, Θ) on the resulting LM geometries were studied via a full-factorial design of experiments. The experimental parameters are shown in Table 2. Six different levels of withdrawal speed (U), and three different levels of wetting layer width (W) and wetting layer orientation (Θ) with respect to withdrawal direction were mixed in a full factorial experimental design. Hence, the experiment included 54 sets of parameters.

The sample designs used for the dip-coating process characterization are shown in FIG. 16C. The samples were fabricated using photolithography on a PDMS coated Si wafer as explained above and diced into specimens (as shown in FIG. 15C). Each specimen included wetting layer strips of Cu with a combination of widths of 50 micrometers, 100 micrometers, and 200 micrometers, and orientations of 0 degrees, 45 degrees and 90 degrees. The location of each strip was assigned randomly within each orientation. In total there were 18 strips (2 per each line width—orientation combination). The gap between two adjacent lines along their width axis was about 3 mm and 5 mm (>$l_c$) along their length axis to minimize any potential areal effects. Three different samples were made for each withdrawal speed level (18 specimens and 216 lines in total). The lower limit of withdrawal speed was selected as 0.1 mm/s. The upper limit of withdrawal speed was selected as the maximum speed of the stage while carrying the LM bath. The withdrawal speed applied on each specimen was selected in random order.

The effects of aforementioned parameters on two process outputs were investigated: (1) average peak height along a line and (2) height variation along a line (one standard deviation of peak heights). The peak height ($h_p$) is defined as the height of the peak point for a cross-section along the width of the LM line and shown in the inset of FIG. 15A. Using this definition the two process outputs were calculated as follows: the surface profile of each LM line on a sample was measured along the longitudinal axis of the line (see FIG. 16D) leaving about 500 micrometers from both ends. Then the average and standard deviation of the peak points along line length were computed for each line. As a result, each line measurement was represented with average peak height and peak height variation.

ANOVA Results

To quantitatively analyze the importance of the factors on LM geometry, an ANOVA study was performed on the experimental data collected. To help in interpreting the ANOVA results beyond the statistical significance, relative contributions of experimental parameters and their interactions were also computed. The full ANOVA tables for average peak height and height variation are shown in Tables A.1 and A.2, respectively. The tables show the ANOVA results of individual effects as well as the two-way and three-way interactions between experimental factors.

TABLE 3

Summary of ANOVA results for process outputs. Statistically significant results (p < 0.05) are designated with bold font.

| Parameter | Peak Height | | Height Variation | |
|---|---|---|---|---|
| | p-value | % Contribution $(100 \times \vartheta^2)$ | p-value | Contribution $(100 \times \vartheta^2)$ |
| Orientation | 0 | 14.2 | 0.557 | 0.2 |
| Width | 0 | 39.9 | 0 | 22.1 |
| Speed | 0 | 22.4 | 0.0138 | 3.6 |
| Orientation × Width | 0 | 9.1 | 0.948 | 0.19 |
| Orientation × Speed | 0 | 1.36 | 0.1239 | 3.78 |
| Width × Speed | 0 | 10.0 | 0.9685 | 1.15 |
| Orientation × Width × Speed | 0 | 1.1 | 0.9345 | 2.76 |

Besides the ANOVA results, the tables also report the effect size measures $\eta^2$ and $\omega^2$ computed from ANOVA results. $\eta^2$ is the most commonly used measure and estimates the proportion of the variation in the output that is explained by different effects based on the sample. $\omega^2$ is an unbiased estimate of the effect size and estimates the proportion of the variation in the output that is explained by different effects based on the entire population instead of the sample. As shown in the table, the sample size increases, the bias in $\eta^2$ decreases and the difference between these two measures becomes very small. The difference between $\eta^2$ and $\omega^2$ is negligible and the p-value and contribution percent ($100 \times \eta^2$) as a summary of ANOVA results for process outputs in Table 3.

The p-values given in Table 3 show that within the range of experimental conditions all parameters and their interactions affected the height of the LM patterns. The fact that line width, withdrawal speed and their interactions affected the peak height of the LM patterns was in agreement with the Equation 4.4. Without wishing to be bound to any particular theory, considering the percent contribution shown in the table, line width had the largest effect on the deposited LM height, followed by withdrawal speed and orientation. The combination of line width and withdrawal speed had a slightly larger effect than the combination of orientation and line width. The interaction effect of orientation and speed was statistically significant but its contribution was only 1.36%. Lastly, the three-way interaction of all investigated parameters had a statistically significant effect on the average peak height, but their contribution was only 1.1%.

Referring again to ANOVA results reported in Table 3, the height variation along a line was affected by line width and withdrawal speed only. Even though withdrawal speed had a statistically significant effect on height variation, its contribution percent was only 3.6 and an order of magnitude lower than the effect of line width (22.1%). Orientation did not show any statistically significant effect on the height variation. The interaction of the studied parameters in different levels also did not show any statistically significant effect on the height variation.

Effect of Withdrawal Speed

FIG. 17A shows the relationship between average peak height of LM traces and withdrawal speed for different line widths and orientations along with Equation 4.4 plotted in logarithmic domain. The equation does not consider the effect of orientation, thus all the theoretical model predictions were same between different orientations. Overall, the results showed a positive correlation between withdrawal speed and the deposited LM height independent from orientation and line width. As the withdrawal speed increased, an increasing slope in the logarithmic domain approaching to the slope of Equation 4.4 for line widths of 100 micrometers and 200 micrometers at 300 mm/s withdrawal speed was observed. Referring to Equation 4.4, this slope was equal to ⅓ and was the exponent value of capillary number. For relatively larger withdrawal speeds (>about 10 mm/s), a clear log-linear trend was observed between peak height and withdrawal speed. The slope of this trend was qualitatively similar to that of the theoretical model. The slope values were estimated from the experimental data using linear regression for each line width and orientation combination in this relatively large withdrawal speed regime (>10 mm/s) and were reported in Table A.3. The table shows that the slopes estimated for line widths of 100 micrometers and 200 micrometers were in the range of 0.26-0.31 and very close to the exponent value of capillary number (⅓) in Equation 4.4. The slope values estimated for 50 micrometer line width, however, were significantly lower in all orientations (0.2 and lower). Hence, at this length scale the sensitivity of deposited LM height with respect to withdrawal speed was much lower.

Figure 36:
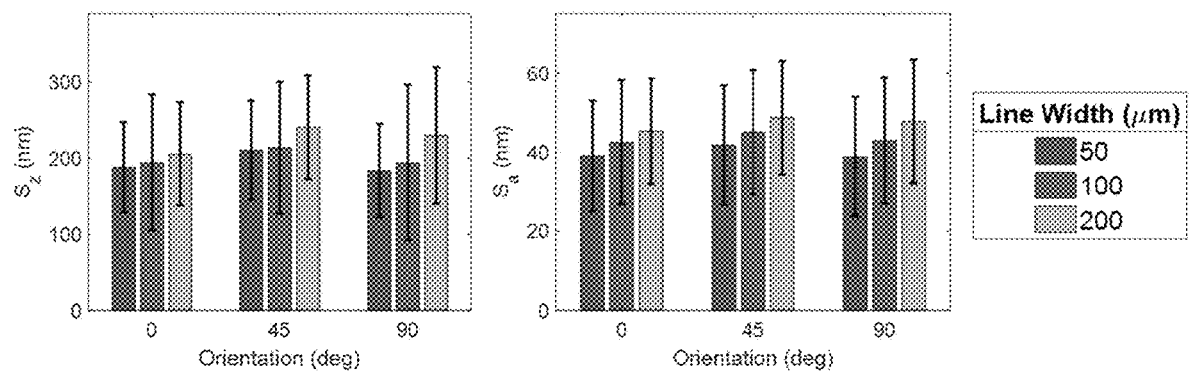
FIG. 36 illustrates characteristics of methods of making a liquid metal circuit according to the present invention.
Figure 36:
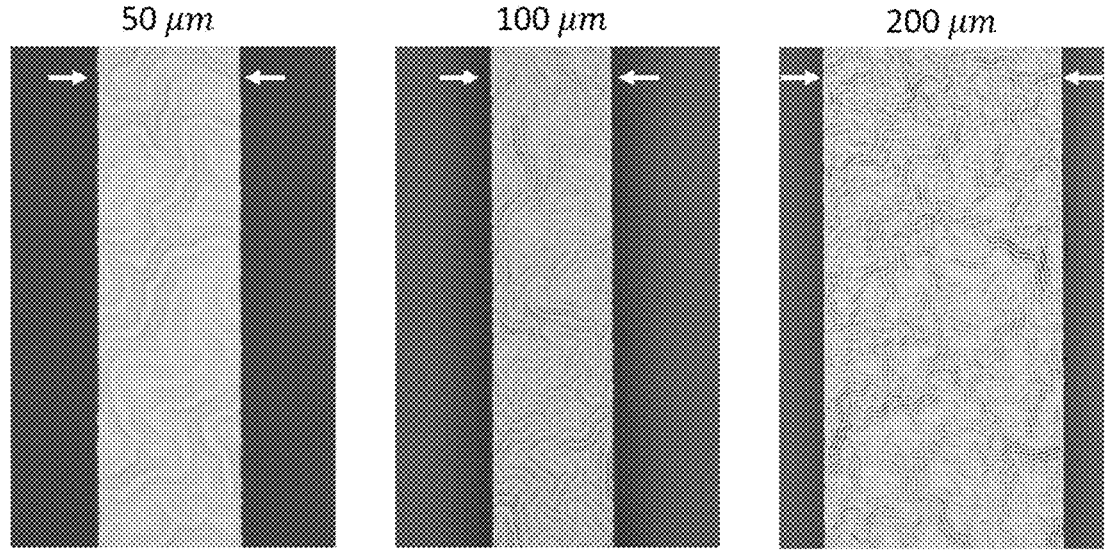

Referring to FIG. 17A, two deviations from Equation 4.4 were observed. The first was the diminished effect of withdrawal speed on average peak height for smaller withdrawal speeds (<about 10 mm/s), especially for orientations of 0 and 45 degrees. In this regime the average peak height seemed to be converging to a constant value as the withdrawal speed goes to 0. This constant value also seemed to depend on the line width. In low withdrawal speeds (or low capillary numbers) the effect of viscous forces become negligible and van der Waals interactions or surface roughness/topology become the dominant factor. Another dip-coating system where a similar behavior was observed was where surfactants were present. The presence of surfactants changes the boundary conditions at the liquid surface, resulting in deviations from Equation 4.4, where such boundary conditions were not considered in its derivation. Here, the NaOH layer may be acting similar to a surfactant by changing the surface properties and the boundary conditions of LM. Furthermore, the ratio of the deposition height to the dominant length scale was reported as a constant value in the literature. Using the data shown in FIG. 17A for orientations of 0 and 45 degrees, the average peak height to width ratios for this regime, where withdrawal speeds are smaller than 10 mm/s, and reported in Table A.4. An average constant ratio of 0.0267±0.0038 was found for this regime. Without wishing to be bound to any particular theory, it is believed that the behavior was not due to van der Waals forces. Considering the finite thickness and wrinkling of the copper wetting layer shown in FIG. 36B with an amplitude range of 100-350 nanometers (see FIG. 36A), and the presence of NaOH layer, the reason behind this behavior may be the combination of surface topology and the effects due to the presence of NaOH layer.

The second deviation from Equation 4.4 presented itself in the high withdrawal speeds (larger than 10 mm/s) where the slope was similar but with a vertical offset in the values. This vertical offset could again be a consequence of the surfactant's boundary effects and/or the inertial effects. The inertial effects become apparent if the Reynolds (Re=$\rho U h_p/\gamma$) number becomes larger than 1. Here, this regime corresponded to withdrawal speeds of 75 mm/s and larger for all orientations and line widths assuming the material parameters given in Section 4.2 for EGaIn. Without wishing to be bound to any particular theory, considering also the presence of NaOH layer, this vertical offset may be attributed to the combination of these two effects.

Figure 18:
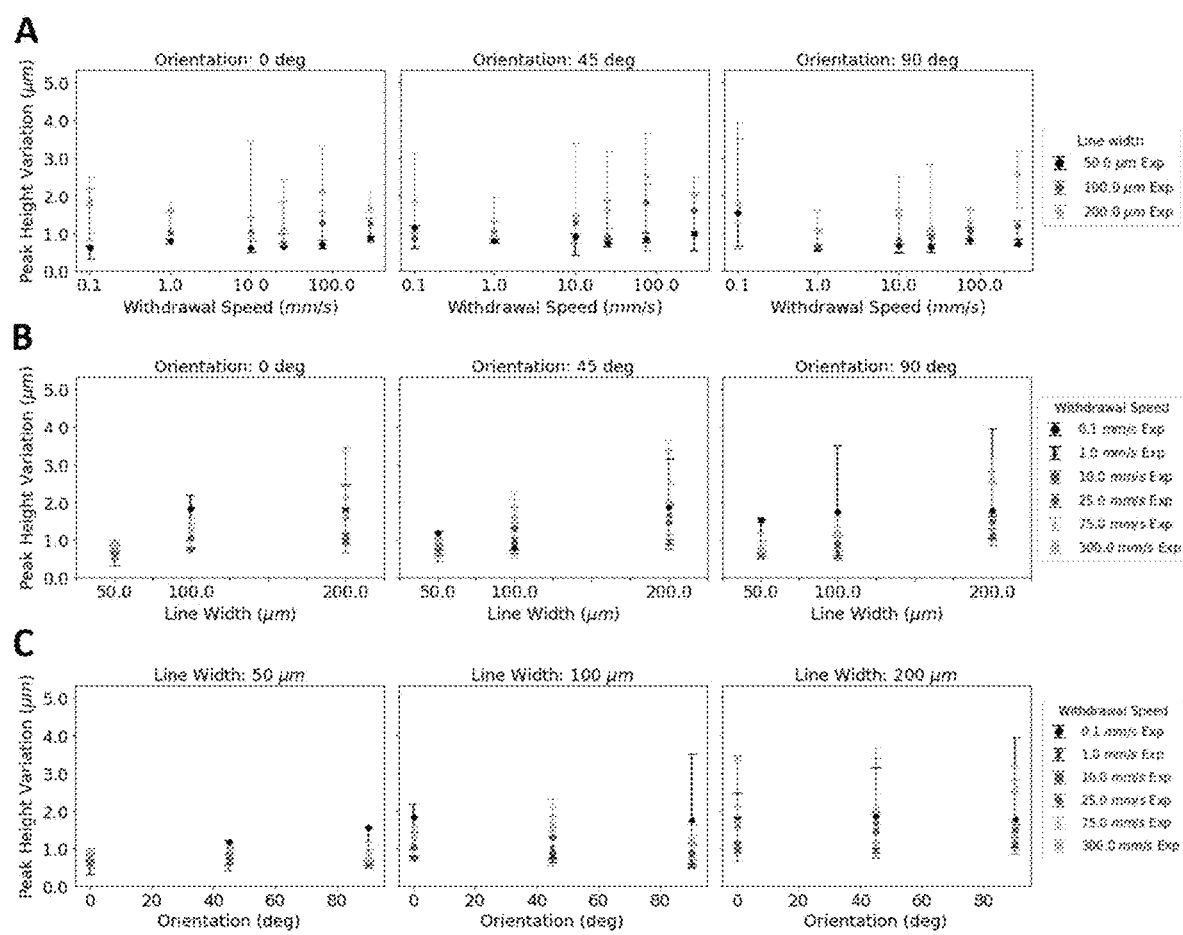

As shown in FIG. 18, no clear trend was observed between height variation along a line vs the withdrawal speed. Since the average peak height along a line increased with the increasing withdrawal speed the percent variation of the height decreased with the increased withdrawal speed. These results indicated that higher withdrawal speeds may be more desirable to obtain more uniform LM features.

Effect of Line Width

The relationship between average peak height of LM traces and line width for different withdrawal speeds and orientations along with Equation 4.4 are shown in FIG. 17B. In general, a log-linear trend between line width and average peak height for all withdrawal speeds and orientations. This observed log-linear trend was similar to the trend predicted by Equation 4.4. When the slope values were estimated from the experimental data using linear regression for each withdrawal speed and orientation combination, it was observed that the slope value changes in range between about 0.8 and about 1.15. These values were close to the slope of Equation 4.4 (which is 1). Even though the theoretical model captured the general trend, a vertical offset in the absolute values predicted by the model was apparent. Since Equation 4.4 did not consider the effect of orientation, the amount of vertical offset increased as the orientation parameter increased.

FIG. 18B shows the dependence of height variation along a line for LM traces to line width for different withdrawal speeds and orientations. According to the FIG. 18B, the height variation within a line increased with the increasing line width, overall.

Effect of Orientation

FIG. 17C shows the relationship between peak height of LM traces and the orientation of wetting layer geometry with respect to dipping direction for different line widths and withdrawal speeds. Since the theoretical model given in Equation 4.4 did not consider the effect of orientation, the theoretical predictions were not plotted in this figure. Despite the statistically significant effect of orientation found in ANOVA analysis, the dependence of deposited LM height on orientation was not uniform as shown in the figure. According to the experimental data, the dependence on orientation was rather weak for 0 and 45 degrees. A slight difference at the average peak height only at the highest withdrawal speed (300 mm/s) was observed. This plateau region may be highly advantageous for LM patterning purposes since the film thickness may be rather uniform across a broad range of angles. When the line orientation was 90 degrees, however, a thicker LM film was observed for all line widths and withdrawal speeds. Considering the dependence of the LM peak height on the line width, a sample withdrawn at an orientation of 0 may behave as a line with an effective width of about W/cos $\Theta$ with respect to dipping axis. This larger width was expected to result in more liquid deposition on the substrate.

Referring to FIG. 18C, no clear trend was observed between the orientation parameter and the variation of the deposited LM peak heights. This qualitative observation was in agreement with the ANOVA results.

Semi-Empirical Modeling

Figure 17:
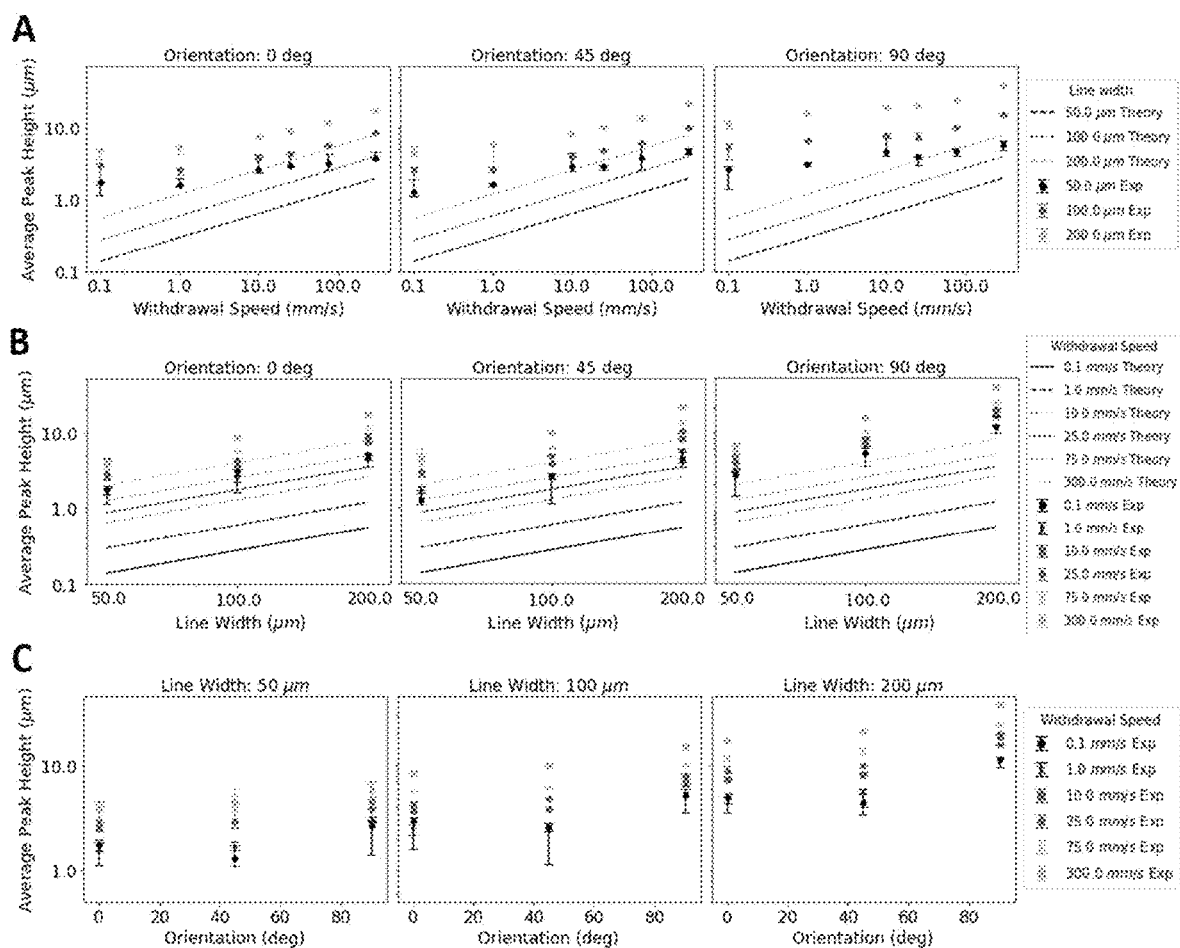
FIGS. 17-19 illustrate average peak height v. withdrawal speed, line width, and dipping orientation of liquid metal circuits according to the present invention.

The analytical model given in Equation 4.4 relates withdrawal speed and line width to the coating height. As discussed above, however, Equation 4.4 heavily underpredicted the experimental results (as shown in FIG. 17). Moreover, Equation 4.4 did not consider the diminishing effect of withdrawal speed in low capillary numbers and the effect of line orientation with respect to dipping axis. To capture the effects of line width, orientation and withdrawal speed on LM height, two different models may be considered: (1) a linear regression model, and (2) a nonlinear semi-empirical model. Considering the ANOVA results, all the parameters and their interactions in the linear regression model were used. The equation for linear regression model may be represented as $$h_p = \alpha_0 + \alpha_1 W + \alpha_2 \theta + \alpha_3 U + \alpha_4 W\theta + \alpha_5 WU + \alpha_6 U\theta + \alpha_7 WU\theta \quad (4.5)$$

$$h_p = \alpha_0 + \alpha_1 W + \alpha_2 \theta + \alpha_3 U + \alpha_4 W\theta + \alpha_5 WU + \alpha_6 U\theta + \alpha_7 WU\theta \quad (4.5)$$

where $\alpha_i$ were the calibration coefficients, and the units of $h_p$, W, U and $\Theta$ were micrometers, micrometers, m/s and radians, respectively.

The second model may be represented as $$h_p = K_0 W_{eff}^\alpha + K_2 W_{eff}^\alpha U^\beta \quad (4.6)$$

where $K_0$, $K_2$, $\alpha$ and $\beta$ were calibration coefficients and $W_{eff}$ was effective line width. Note that the first term in the summation modeled the behavior in the very low withdrawal speed region where the deposited liquid metal height seemed to only depend on the line width and orientation as discussed above. The second term, on the other hand, had a similar form to Equation 4.4 and modeled the process behavior in the high withdrawal speeds. The coefficients $K_0$ and $K_2$ defines the relative importance of these two terms. The effective line width $W_{eff}$ took the effect of orientation into account and defined as $$W_{eff} = W(2 - K_1 \cos \theta) \quad (4.7)$$

where K1 was also a calibration coefficient that defines the contribution of orientation to the effective width. This form for the effective width may be used instead of W/cos $\Theta$, since cos $\Theta$ went to zero as $\Theta$ went to 90 degrees and created a mathematical singularity.

The experimental data reported in FIG. 17 used to calibrate these two models. For the first model (Equation 4.5), linear regression was employed while non-linear regression was used to calibrate the coefficients for the second model (Equation 4.6). The coefficients found for these two models were reported in Table 4.

TABLE 4

Calibration coefficients found for two models (Equations 4.5 and 4.6) using experimental data.

| Linear Model (Model 1) | | Non-linear Model (Model 2) | |
| --- | --- | --- | --- |
| Coefficient | Value | Coefficient | Value |
| $\alpha_0$ | 1.3427 | $K_0$ | 0.0092 |
| $\alpha_1$ | 0.018 | $K_1$ | 1.0083 |

TABLE 4-continued

Calibration coefficients found for two models (Equations 4.5 and 4.6) using experimental data.

| Linear Model (Model 1) | | Non-linear Model (Model 2) | |
|---|---|---|---|
| Coefficient | Value | Coefficient | Value |
| $\alpha_2$ | −3.4195 | $K_2$ | 0.0388 |
| $\alpha_3$ | −1.4625 | $\alpha$ | 1.1747 |
| $\alpha_4$ | 0.202 | $\beta$ | 0.428 |
| $\alpha_5$ | 0.0376 | | |
| $\alpha_6$ | −6.5369 | | |
| $\alpha_7$ | 0.1468 | | |

Referring to the coefficients found for Model 2, the coefficient of cos Θ term (K1) was found very close to 1. This suggested the form of $W_{eff}$ about W(2−cos Θ). Furthermore, the exponents of width term (α) and withdrawal speed (β) were found as 1.1747 and 0.428, respectively. These exponents compared fairly well with the exponents of the theoretical model (given by Equation 4.4) which were 1 and ⅓, respectively. The deviations from the exponents of Equation 4.4 may be attributed to the additional effects included in Model 2 given by Equation 4.6.

TABLE 4.5

Parameters used for model validation.

| Parameters | Levels |
|---|---|
| Orientation (deg) | 15, 30, 75 |
| Line Width (um) | 75, 150, 250 |
| Withdrawal Speed (mm/s) | 50, 125, 225 |

Figure 19:
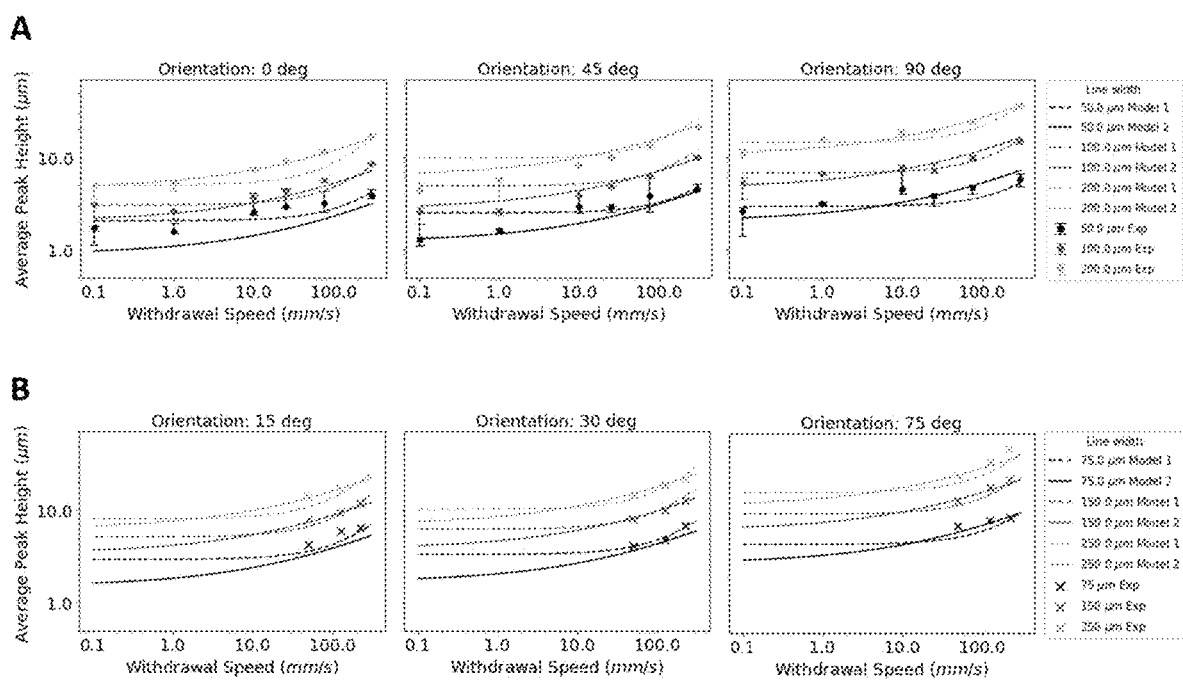

The predictions for both models were plotted with experimental data as shown in FIG. 19A. The figure shows that both models performed much better compared to the basic theoretical model (Equation 4.4). Between the two empirical models presented above, non-linear semi-empirical model seemed to capture the trend observed in the experimental data qualitatively better than the linear regression model, except for 50 micrometers line width and 0 orientation. In this particular case, linear regression model performed slightly better. Without wishing to be bound to any particular theory, the reason for this deviation may be due to the significantly lower sensitivity of peak height to withdrawal speed for 50 micrometers line width at 0 degree orientation discussed above. The experimental results for this parameter combination did not follow the same trend with the rest of the parameters. For a more quantitative comparison, root mean squared error (RMSE) between the experimental data and the model predictions was calculated for each model. RMSE values were found as 2.074 micrometers and 1.302 micrometers for Model 1 and 2, respectively.

Another set of measurements were conducted using the parameter set reported in Table 5. The orientation and withdrawal speeds used in this set were selected within the parameter range described above. Two of the line widths, line widths of 75 micrometers and 150 micrometers, were also selected within this range to be used for validation purposes. A third line width, 250 micrometers, was investigated to evaluate the extrapolation performance of the models.

The predictions for both models were plotted with validation and extrapolation data as shown in FIG. 19B. The prediction of Model 2 was in good agreement with both validation and extrapolation data and the agreement was better overall compared to Model 1. Similar to the case of 50 micrometers and 0 degree orientation, Model 2 underpredicted the peak height for 75 micrometers and 0 degree orientation slightly more than Model 1. Moreover, both models underpredicted the peak height value for 250 micrometers at the orientation of 75 degrees and the withdrawal speed of 225 mm/s. Since 250 micrometers was outside range of the data set used to tune the calibration coefficients, this deviation was not surprising. For a quantitative comparison, RMSE values were found as 1.34 micrometers and 1.06 micrometers for Model 1 and 2, respectively, for the validation data. For the extrapolation data, the RMSE values were found as 5.14 micrometers and 3.68 micrometers for Model 1 and 2, respectively. Overall, these results show that Equation 4.6 could be used for the prediction of deposited LM geometry given the parameters.

Variation in Liquid Metal Dip-Coating

In order to quantify the variation in the liquid metal dip-coating process, we conducted a statistical analysis on the two process outputs we considered: average peak height and peak height variation. For this analysis, 30 samples that only included a single line with 100 micrometers width and an orientation of 45 degrees with respect to dipping axis were used. All the samples were dip-coated with a withdrawal speed of 75 mm/s. The surface profiles of the LM patterns were measured using white light interferometry, and the average peak height and peak height variation for these samples were computed in the same way reported in the previous sections.

Figure 20:
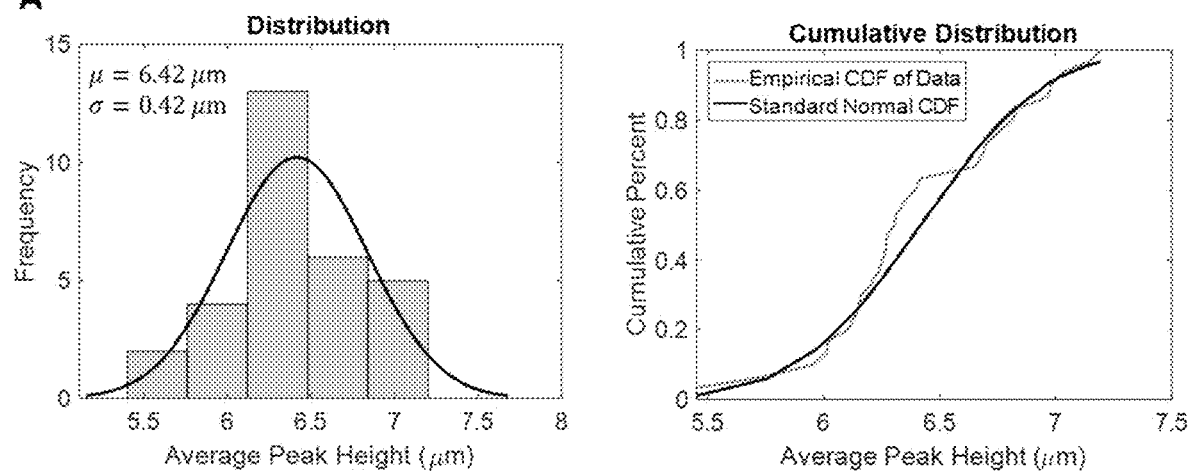
FIG. 20 illustrates characteristics of methods of making a liquid metal circuit according to the present invention.
Figure 20:
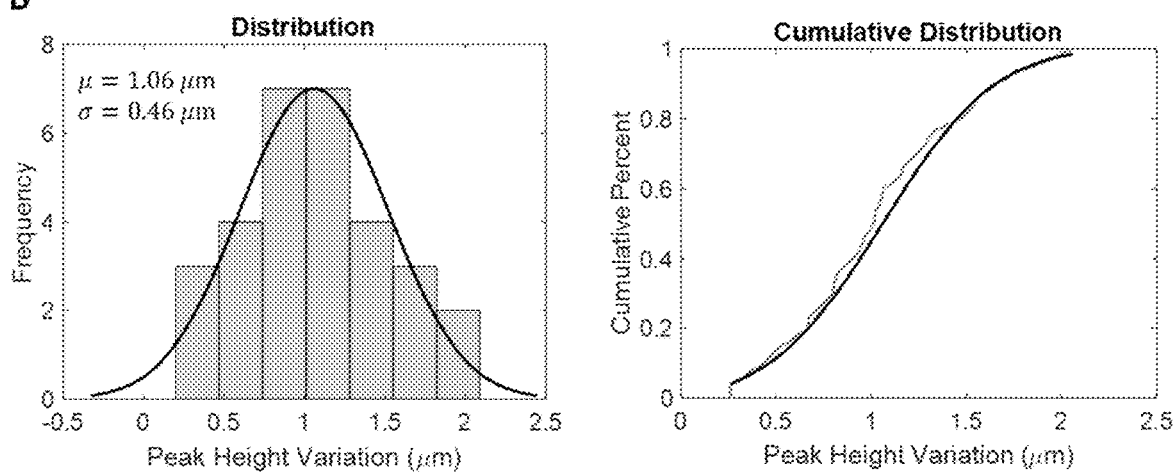

FIG. 20 provides the histograms and empirical cumulative distribution functions for the process outputs along with normal distribution curve fits. Kolmogorov-Smirnov test indicated that the distributions for both process outputs followed normal distributions with a p-value smaller than 0.05. Normal distributions suggested that there was no systematic error source and the observed variations were random in nature. Having normal distributions was also a fundamental assumption for ANOVA analysis and the results shown here assured validity of the ANOVA results provided in above. Lastly, for the line width of 100 micrometers, orientation of 45 degrees and withdrawal speed 75 mm/s, the average peak height was found as 6.42±0.42 μm while the peak height variation was found as 1.06±0.46 micrometers. Referring to FIGS. 17 and 18, these values were in agreement with the experimental results mentioned in the previous sections for these parameters.

Example 3

Materials

The substrate material used in the fabrication of demonstration circuits and test samples was polydimethyl-siloxane (PDMS). It was prepared with Sylgard 184 (Dow Corning, USA) using a 10:1 oligomer to curing agent ratio. A 3% w/v NaOH solution was prepared by diluting 30% w/v NaOH solution (BDH Chemicals) with deionized water (100%, McMaster-Carr, USA). Deionized water (DI water) and isopropyl alcohol (IPA) (2-Propanol ACS 99.5% min, Alfa Aesar, USA) were used to the clean surface of samples after liquid metal deposition and HCl vapor treatment. Eutectic gallium-indium alloy was prepared by mixing Ga (Gallium Source, USA) and In (Gallium Source, USA) at a 75.5:24.5 ratio by mass and heating and homogenizing at 190° C. on a hot plate overnight for 12 hours. HCl vapor was obtained from a one-gallon bottle of 36% w/w aqueous HCl solution (Alfa Aesar, USA).

LM Dip-Coating Setup

FIG. 20 shows the setup used in the wafer-scale dipping experiments. The setup consisted of two stages that move in a synchronized fashion to accommodate the range required for dipping 4-inch wafer. The bath that contains 3% w/v NaOH treated EGaIn was attached to a 5-axis stage (AI-TRI-HR4, ALIO Industries, USA). The rotational axes on this stage have not been employed. The sample holder was attached to another stage that has only a single axis (BMS60, Aerotech Inc, USA). The vertical axes of the two stages were used in the dipping while the horizontal axes of 5-axis stage was used for centering the sample with respect to the bath. The sample holder, the bath and the bath attachment were 3D-printed (Objet30, Stratasys, USA). The experimental setup may accommodate constant withdrawal speeds up to 300 mm/s along an about 40 mm vertical dipping range and 100 mm/s along about 110 mm while carrying the EGaIn bath.

Fabrication of Scalable Liquid Metal Circuits

A 4-inch single-crystal silicon wafer was cleaned by rinsing with acetone and IPA and blow dried with nitrogen. Then the silicon wafer was surface treated with four drops of trichloro(1H,1H,2H,2H-perfluorooctyl) silane (TFOCS, purchased from Sigma Aldrich, USA) under vacuum for 45 minutes for easy removal of PDMS in the final step. TFOCS vaporizes and deposits as a monolayer through siloxane bonding. Next, the silicon wafer was spin coated with PDMS (base and curing agent 10:1 weight ratio, Sylgard 184, Dow Corning, USA) at 800 rpm for 30 s and cured on a hotplate at 60° C. for 8 hours. Next, a 150 nanometer layer of Cu adhesion material was sputter deposited (30 W power, 5 mTorr pressure; Perkin-Elmer 8L, USA) on the PDMS substrate along with a 20 nanometer Cr adhesion material (30 W power, 20 mTorr pressure). Positive photoresist was spin coated on Cu surface at 4000 rpm for 30 sec with a spreading run at 600 rpm for 6 sec (AZ 4210, Microchemicals, Germany) resulting in a thickness of about 2.1 nanometer. Next, the photoresist was left to dry for 24 hours at room temperature since baking cracks metal and photoresist layers due to thermal expansion coefficient mismatch between layers. The substrate was exposed to UV light using a contact mask aligner (MA6, Suss Microtec, Germany) for 170 seconds (UV300 filter, 320 nanometer at 5 mW/cm$^2$) through a transparency mask containing the desired circuit design (purchased from CAD/Art Services Inc, USA). Following the exposure the photoresist was developed for 1.5 minutes (AZ Developer 1:1 ratio, AZ Electronic Materials, Luxembourg). The substrate was exposed to UV light using a contact mask aligner for 400 seconds without a mask (i.e. flood exposure) (UV300 filter, 320 nanometer at 5 mW/cm$^2$). Next, Cu and Cr layers were wet etched. The Cu layer was wet etched for 120 seconds using a 1:15 volume ratio of Cu etchant (APS-100 Copper Etchant, Transene Company Inc, USA) to DI water solution. Likewise, the Cr layer was wet etched for 90 seconds using a 1:10 volume ratio of Cr etchant (Chromium Cermet Etchant TFE, Transene Company Inc, USA) to DI water solution. The photoresist mask was then stripped off by immersing the substrate into photoresist developer for 1.5 minutes (AZ Developer 1:1 ratio). The stripping was done using the photoresist developer since acetone swells PDMS and results in cracks in the metal features. Finally, the substrate was attached to the dip-coating experimental setup and immersed into 3% w/v NaOH treated EGaIn bath with a constant speed of 0.16 mm/s. It was then kept in the bath for about 60 seconds to let the LM wet to the copper surface and then withdrawn from the bath with 1 mm/s constant speed. Following the dip-coating the EGaIn coated substrate was immersed horizontally into DI water and IPA to clean residual NaOH and then dried on a hotplate at 60° C. for 10 minutes. In the circuit designs with rigid components (i.e., an ultra high frequency (UHF) radio-frequency identification (RFID) patch) the rigid circuit components were inserted in their designated places. Next, HCl vapor was applied to the sample surfaces. HCl vapor was obtained from 36% w/w aqueous HCl bottle. HCl treated samples were immersed into DI water and IPA and then dried on a hotplate at 60° C. for 10 min. Then the sample was oxygen plasma treated with 30 W and 45 seconds to activate PDMS surface (Plasma Prep 3, SPI, USA). Then liquid PDMS was poured over the surface, and the sample was degassed under vacuum for 30 minutes. Lastly, the sample was cured on a hotplate at 60° C. for 8 hours.

Characterization of Liquid Metal Capacitors

The printed EGaIn geometries were measured with a white light interferometer (using NewView, Zygo, USA). The obtained geometrical data were processed in MATLAB along with statistical analysis and modeling. The capacitance values were measured with an LCR meter (889B, BK Precision, USA) at 1 V level and 200 kHz frequency (values were recommended by LCR meter datasheet).

Implementation and Testing of Liquid Metal UHF Patches

Figure 22:
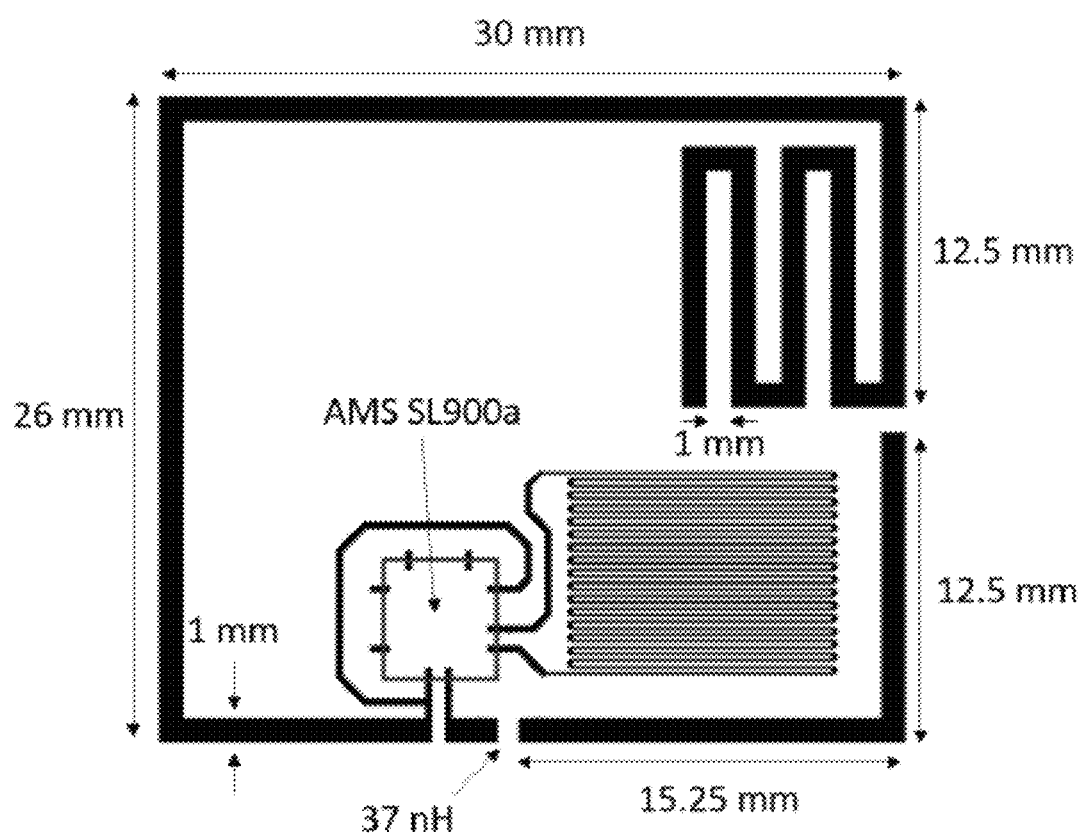
FIG. 22 illustrates liquid metal circuits according to the present invention.
Figure 23:
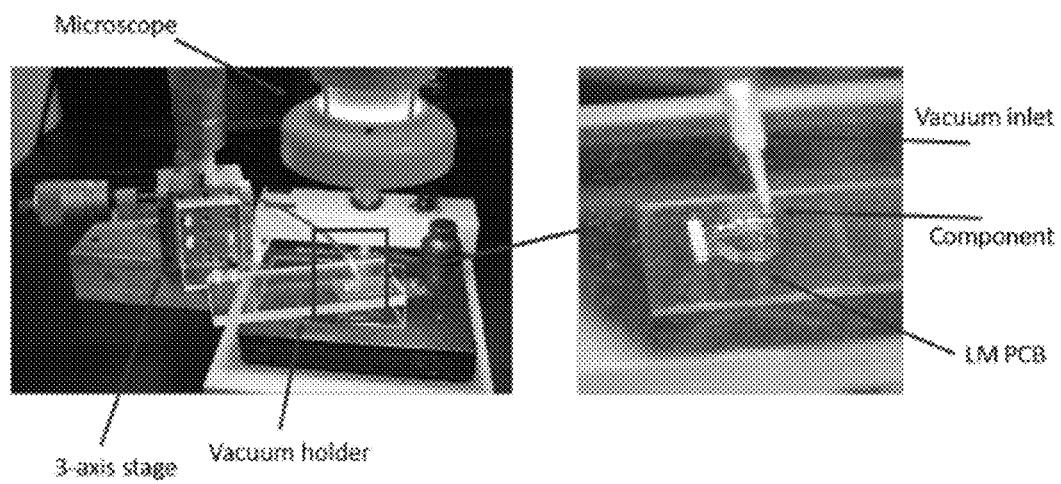
FIG. 23 illustrates a manual pick-and-place setup useful for method of making a liquid metal circuit according to the present invention

The circuit designs for the stretchable liquid metal ultra-high frequency patches are shown in FIG. 22 and were made in CircuitMaker (Altium Limited, Australia). Referring to FIG. 23, rigid chips were placed using a custom made manual pick and place setup. After the patches were fabricated, they were cut in the desired shape and peeled from the Si wafer backing layer. For easy attachment of the patches to the materials tester's grippers during tensile testing the fabricated UHF RFID patches were embedded in larger PDMS sheets. First, a sheet of PDMS was half-cured in a mold at 60° C. for 10 minutes. The patch was then oxygen-plasma activated and placed on half-cured PDMS. Then it was sealed by pouring and curing another PDMS layer. The final thickness of the samples was about 1.5 mm. Tensile testing was performed on a commercial material testing device (5969 Dual Column Testing System, Instron, USA). During the test, the load and displacement of the samples along with the voltage on the strain gauge sensor were measured simultaneously. Load and displacement were measured by using a data acquisition board (NI USB-6002, National Instruments, USA) connected to the material testing system and transmitted to the data collection computer. The strain gauge reading and the temperature was measured by the UHF chip and transmitted to the computer using an RFID reader (M6E Embedded RFID Reader Module, ThingMagic Inc, USA) operating in "North America" frequency band (902-928 MHz). The displacement rate for the testing was 80 mm/s. The temperature sensor on the patch was characterized using a hot plate (HS40, Torrey Pines Scientific Inc, USA). All data processing and visualization were done in MATLAB (R2016b, MathWorks, USA).

Results and Discussion

Fabrication Flow

Figure 21:
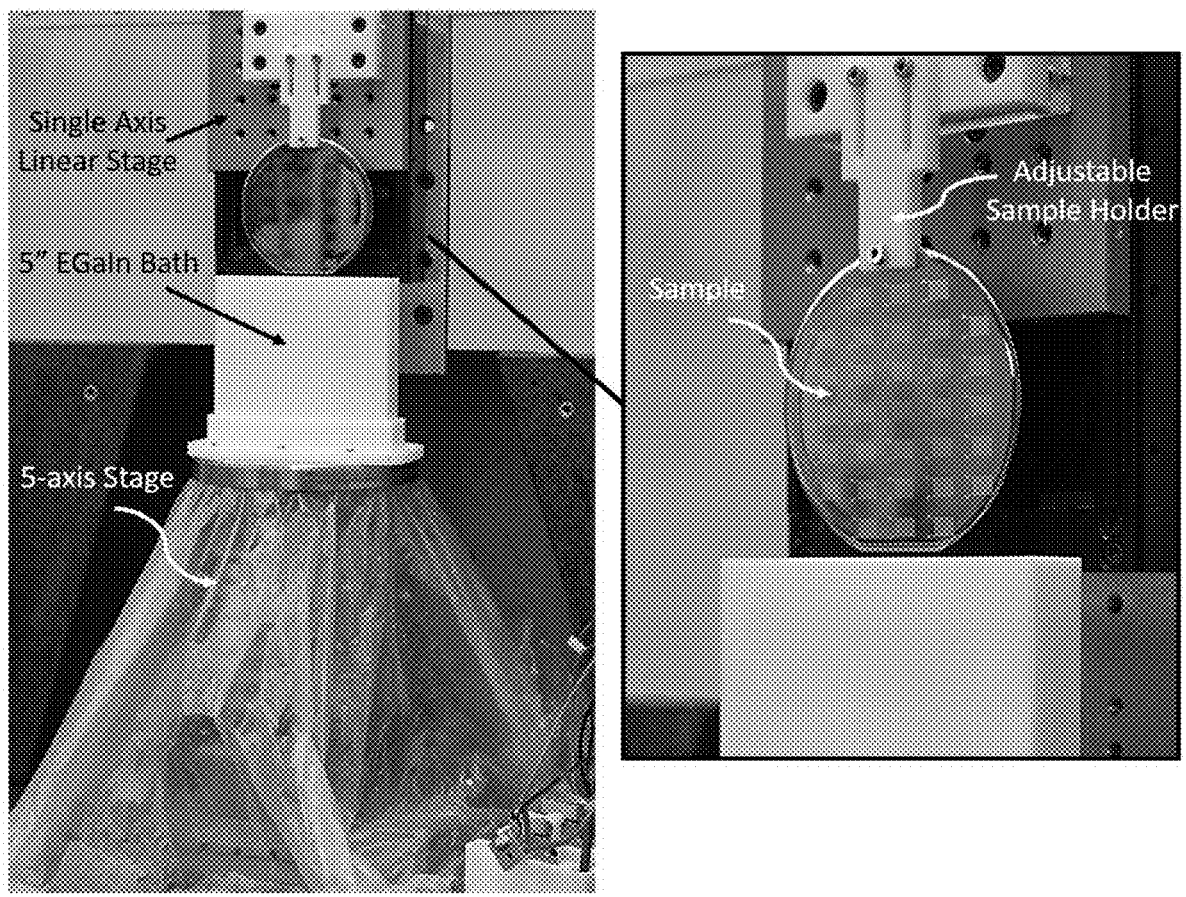
FIG. 21 illustrates a system and method of making a liquid metal circuit according to the present invention.
Figure 24:
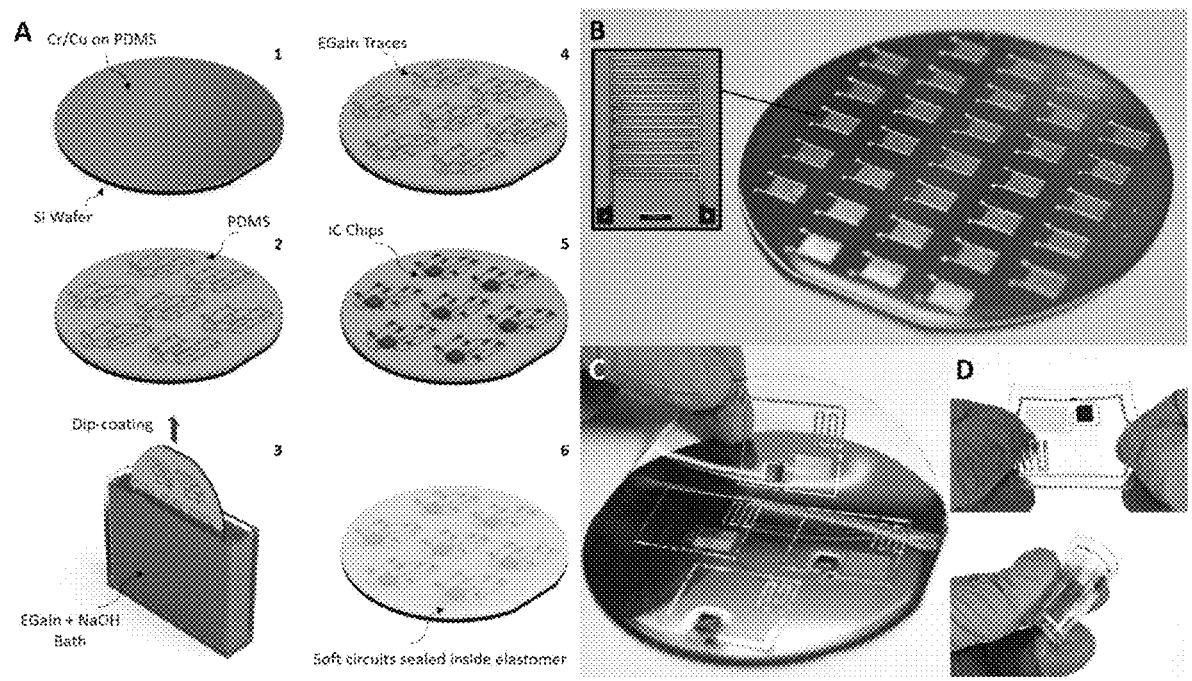
FIG. 24 illustrates a method of making a liquid metal circuit according to the present invention.

FIG. 24A shows a schematic diagram of the proposed liquid metal circuit fabrication method. The workflow for circuit fabrication comprises: (i) fabrication of copper wetting layer on an elastomer substrate, which is spin-coated on an Si wafer, using photolithography, (ii) liquid metal deposition through dip-coating, (iii) microelectronic component placement and interfacing, and (iv) elastomer sealing. The fabrication process starts with spin coating and curing of PDMS (Dow, Sylgard 184; 10:1 base-to-curing agent weight ratio) on a silanized 100 mm (4-inch) silicon wafer. Next, 20 nanometer thick Cr and 150 nanometer thick Cu are sputter deposited on the PDMS substrate. Cr is used to improve the adhesion between PDMS and Cu. Then a positive photoresist layer is spin coated and patterned using photolithography. Next Cu and Cr layers are wet etched to obtain the LM wetting layer for the desired circuit geometry. Following wet etching, the photoresist layer is stripped off from the metal surface. After the desired wetting layer geometry is obtained, the substrate is coated with LM by dipping it into a 3% w/v sodium hydroxide (NaOH) treated EGaIn bath using a custom experimental setup shown in FIG. 21. This may form the liquid metal trace. The experimental setup provides consistency for the LM dip-coating step by providing consistent immersion and withdrawal speeds as well as keeping the sample inside the bath for a specified amount of time. The dipping bath includes two immiscible layers: aqueous NaOH solution and EGaIn. The amount of EGaIn in the bath is sufficient to immerse the entire wafer. A thin layer of aqueous NaOH solution (3% w/v) floats on top of EGaIn to ensure removal of oxide from both the Cu wetting layer and the EGaIn, and to facilitate selective wetting of LM to the wetting layer on substrate. Keeping the sample inside the bath for a specified amount of time allows LM to completely wet the copper patterns. Dry spots on the wetting layer may form when the amount of time the substrate is kept inside the LM bath is too short. After LM coating, the sample is immersed horizontally into DI water and IPA to clean residual NaOH, respectively and then dried on a hot plate. This may form the liquid metal trace. Next, rigid components (if desired) are placed on the designated locations (e.g., on the liquid metal trace) and HCl vapor is applied to the component pins to create a low contact resistance electrical interface between the pins and LM interconnects. HCl treated samples are then immersed into deionized (DI) water and isopropyl alcohol (IPA) for cleaning and then dried on a hotplate at 60° C. for 10 min. Then, the sample surface is activated with oxygen plasma treatment and the sample is sealed by curing another layer of PDMS over the surface. The completed circuits are then peeled from the Si wafer.

Characterization of Liquid Metal Geometries

Representative images of a capacitor on the PDMS-coated wafer are shown in FIGS. 25A and 25B, before and after EGaIn deposition, respectively. The width of each capacitor finger is 200 micrometers with a finger-to-finger distance of 200 micrometers. The length of each finger is 5 mm and there are 10 pairs of fingers. The contact pads have a dimension of 1 mm by 1 mm. To evaluate geometrical repeatability, the profiles of capacitor fingers were measured using white light interferometry for all capacitors. To evaluate electrical repeatability, the capacitance of each capacitor was measured with an LCR meter. In total, four 4-inch wafer samples, each containing 31 LM capacitors, were fabricated with the same dip-coating parameters (see FIG. 24B). The layout of capacitors on the wafer is shown in FIG. 25C along with the direction of withdrawal from the EGaIn bath.

Geometrical and Electrical Results

Figure 25:
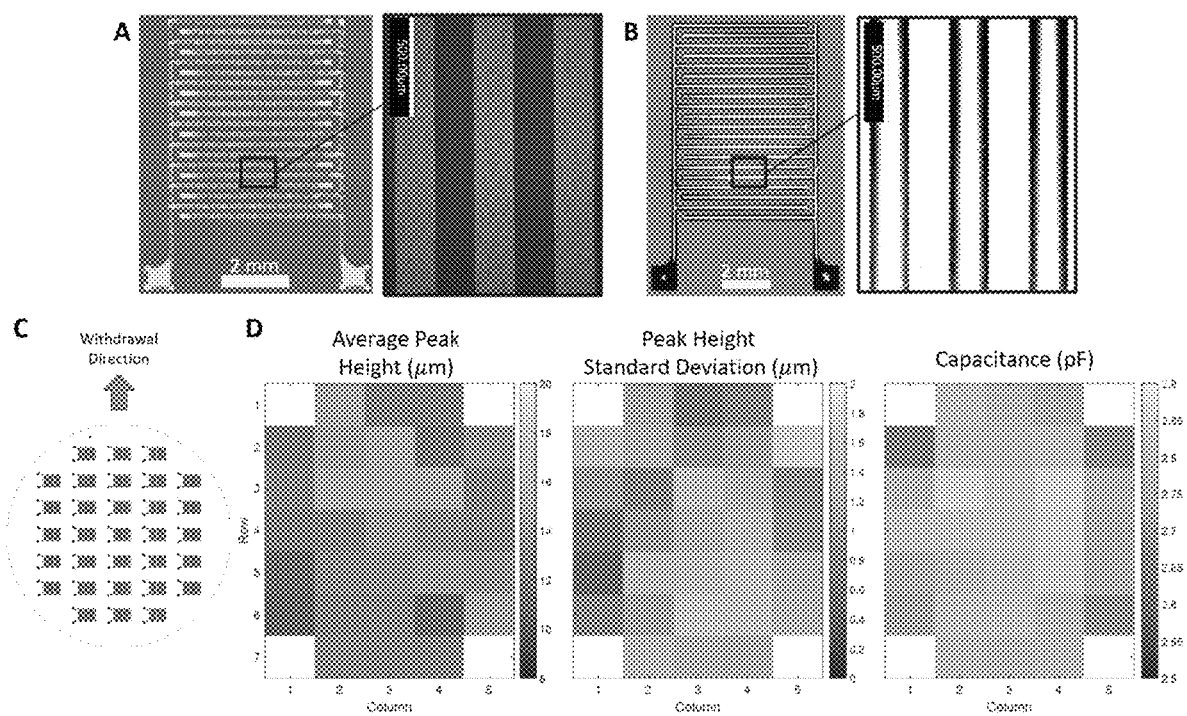
FIG. 25 illustrates liquid metal circuits according to the present invention and characteristics thereof.
Figure 26:
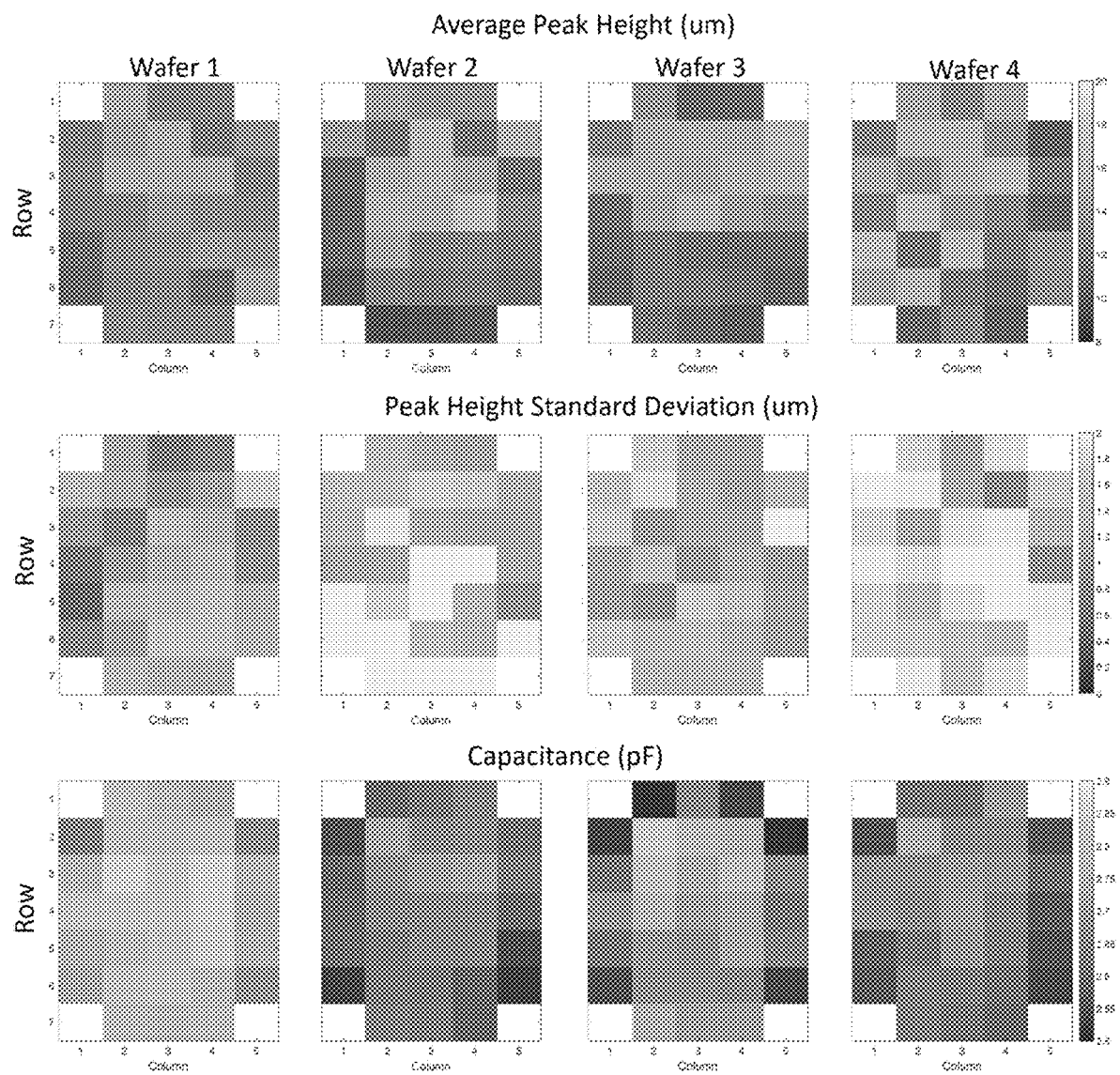
FIGS. 26 and 27 illustrate characteristics of liquid metal circuits according to the present invention.
Figure 27:
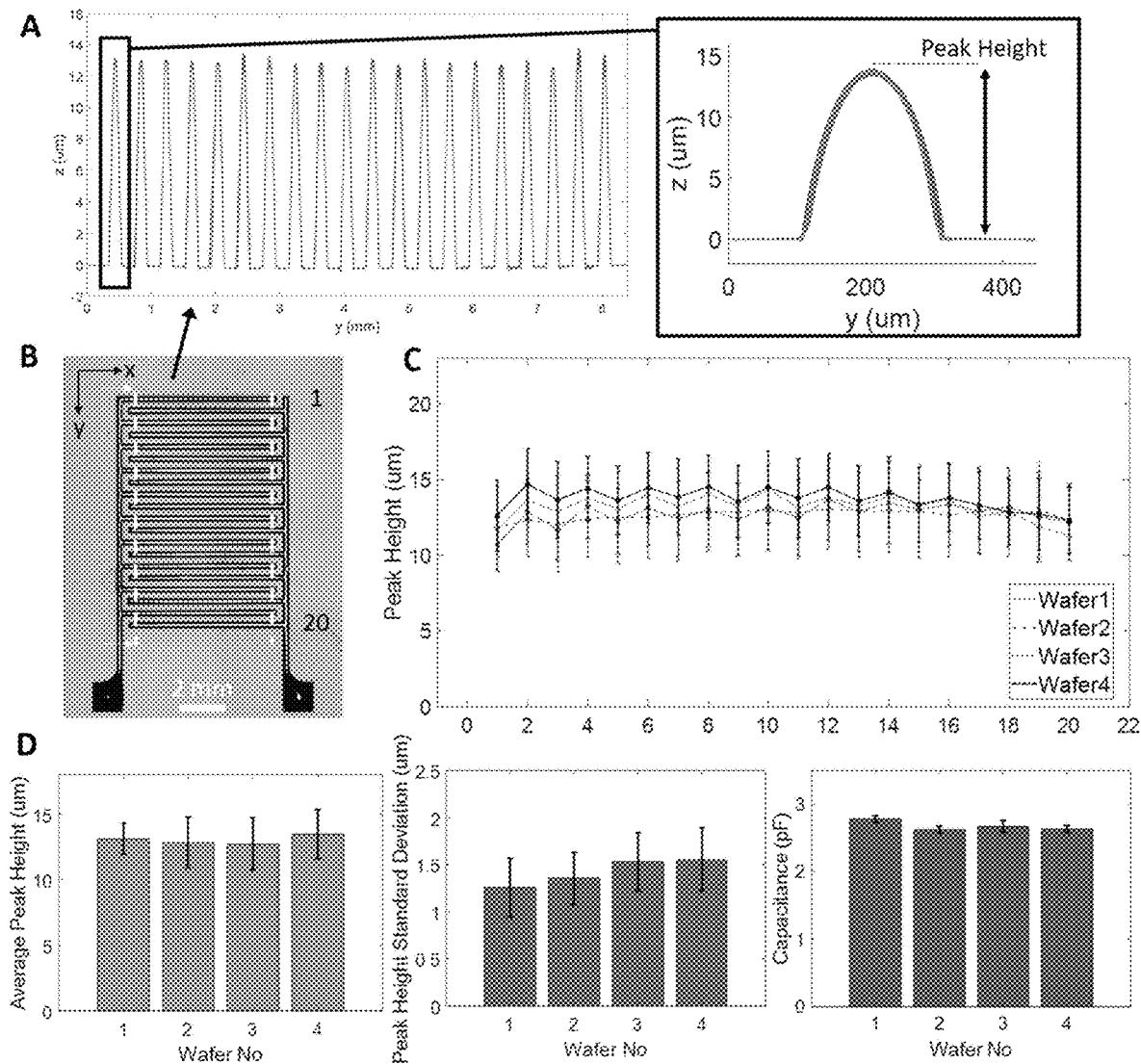

FIG. 25D shows contour plots for the average finger peak height, the standard deviation in the finger peak heights, and the capacitance values for each capacitor on one of the wafers. The contour plots for all four wafers are shown in FIG. 26. Each pixel of each contour plot corresponds to a capacitor and the colors correspond to either of the average finger height, standard deviation in the finger peak height or the capacitance. Note that white pixels on the corners are the pixels where there are no capacitors. The average finger peak height and the standard deviation in the finger peak heights per capacitor were calculated as follows: the surface profile of each finger on a capacitor was measured along the longitudinal axis of the finger (x-axis shown in FIG. 27B) leaving about 300 micrometers from both ends. Then the average of the peak points of y-axis cross-sections along finger length were computed for each finger. The mean and standard deviation of the average peak heights of 20 fingers are given in the contour plots. FIG. 27A shows the profile measurements of all fingers along the x-axis plotted on top of each other for the representative LM capacitor given in FIG. 27B. The inset shows a close-up view of the first finger profile. Referring back to FIG. 25 and FIG. 26, no clear spatial trend on the measured values was observed within the wafers. The peak height standard deviation within each LM capacitor was found to be less than 2 micrometers.

FIG. 27C shows the average peak height for each finger. Although within the error bands, we observed variations in peak heights between adjacent fingers from these results. Referring to FIG. 27C, the odd-numbered fingers appear to have slightly shorter peak heights on average than the even-numbered fingers do. Statistical evaluation of the peak height distributions of even- and odd-numbered fingers using Kolmogorov-Smirnov two-sample test revealed that the observed height difference was statistically significant (with a p-value smaller than 0.05) both when each wafer was tested separately and when all wafers tested together. Furthermore, when the peak heights of the fingers at the edges (fingers 1-3 and 18-20) were compared with those of the fingers at the center (fingers 8-12), a statistically significant ($p<0.05$) height difference was observed, independent from fingers being odd- or even-numbered. These results show that the amount of deposited LM may be affected (albeit slightly) by the interaction of wetting layer geometry and the withdrawal direction. Lastly, those differences in peak heights, depending on where each finger is, may account for some of the observed peak height standard deviation within each LM capacitor.

FIG. 27D shows the distribution of average peak height, peak height standard deviation, and capacitance values of capacitors within each wafer. The mean and standard deviation of the given contour plots were 13.13±1.18 micrometers for average peak height, 1.25±0.31 micrometers for peak height standard deviation and 2.78±0.05 pF for capacitance. Shapiro-Wilk normality test with 95% confidence interval was applied to understand if the measured geometrical and electrical values of the capacitors within each wafer followed a normal distribution. For average peak height all wafers except for wafer number 2 was found to have normal distributions. In terms of peak height standard deviation all wafers except wafer 4 was found to have normal distributions. Lastly, all wafers were found to follow a normal distribution for capacitance values.

Referring to FIG. 27D, no statistically significant difference between wafers was observed in terms of average peak height. The average peak height values were 13.13±1.18 micrometers, 12.83±1.94 micrometers and 13.48±1.86 micrometers for wafers 1, 3, and 4, respectively. Since wafer 2 did not follow a normal distribution we report the minimum, median and maximum average peak height values as 10.72 micrometers, 12.48 micrometers and 15.1 micrometers, respectively. Hence the geometrical repeatability was better than about 14% for the given process conditions. Considering the well-established rigid PCB manufacturing tolerances on thickness are ±10%, these results show potential for repeatable and reproducible manufacturing of LM-based electronics scalably. For peak height standard deviation statistical testing revealed that the peak height standard deviation measured for wafer 1 was different from that for wafers 3 and 4 (statistically significant with 95% confidence interval). The peak height standard deviation values for wafers 1, 2 and 3 were 1.25±0.31 micrometers, 1.35±0.27 micrometers, 1.52±0.31 micrometers, respectively. For wafer 4, which did not follow a normal distribution, the minimum, median and maximum peak height standard deviations are 0.9 micrometers, 1.41 micrometers and 1.8 micrometers, respectively. In general, the standard deviations were below 2 micrometers and in agreement with the variations seen in average peak height values. Lastly, the average capacitance values for samples were found as 2.78±0.05 pF, 2.62±0.05 pF, 2.67±0.09 pF, 2.63±0.05 pF, respectively. No statistically significant difference between wafers was observed for capacitance measurements except for wafer 1. Wafer 1 had a slightly higher mean capacitance value compared to the other wafers. Considering that wafer 1 had the lowest average geometrical variations, this higher average capacitance value of wafer 1 may be attributed to the smaller variations. Smaller geometrical variations likely result in a slightly better overlap between capacitor fingers and increase in the capacitance values. Overall, the LM deposition with dip-coating process resulted in consistent geometries and electrical properties within the same wafer and between different wafers. These results suggest that LM dip-coating is promising as a method for repeatable and reproducible mass manufacturing of LM circuits.

Demo Circuit Implementations

Figure 28:
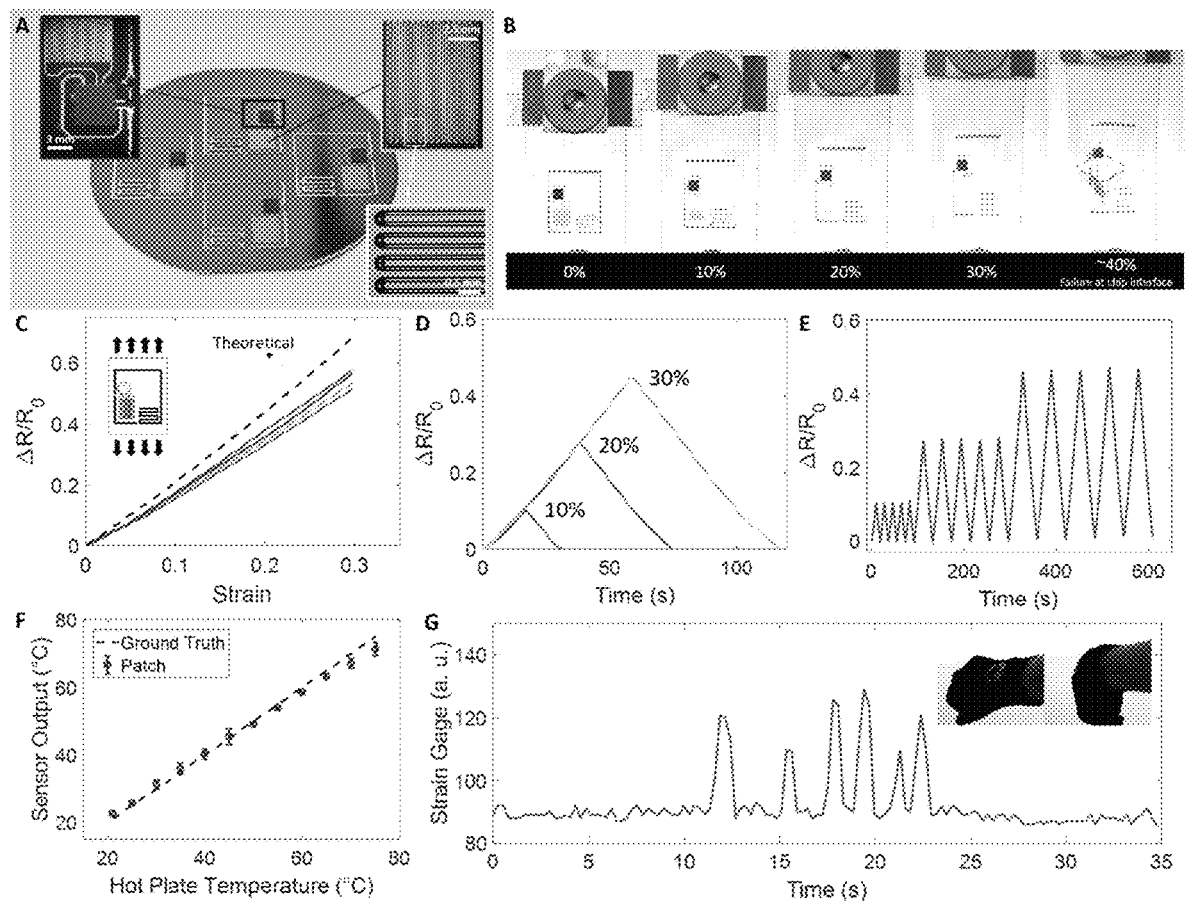
FIG. 28 illustrates liquid metal circuits according to the present invention and characteristics thereof.

To demonstrate the versatility of the proposed method, a stretchable LM hybrid UHF RFID patch was designed and fabricated as shown in FIGS. 24D and 28A. The UHF patch design included interconnects, a resistive strain gage and a UHF dipole antenna made of LM, and microelectronics components such as a tuning inductor and a UHF RFID chip (SL900A, AMS AG, Austria). The compact antenna design operated in the UHF band (860-960 MHz) to be used with EGaIn. The RFID chip used the EPCglobal Class 3 air interfacing protocol and contains an on-board 10-bit analog-to-digital converter (ADC). The design and the dimensions of the patch are given in FIG. 22. The LM UHF patch worked in a passive (battery-free) mode via power harvesting from RFID reader magnetic field and included a temperature sensor and a strain gauge. FIG. 28A shows four LM UHF patches successfully fabricated on a 4-inch Si wafer backing layer. The inset on the top left of the figure shows the connection between the UHF chip, tuning inductor, strain gage and antenna. The temperature sensor was embedded in the RFID chip while the resistive strain gage was made of a serpentine LM trace and connected to the ADC channel of the chip. The inset images on the top right and bottom right of FIG. 28A show the LM resistive strain gage on the patch. The line width and gap between lines on the strain gage was 130 micrometers while the total length and width of the strain gage are 11 mm and 8.2 mm, respectively. The sensor readings obtained from the patch were transmitted to an external computer wirelessly via an RFID reader (M6E, ThingMagic Inc, USA).

A set of tensile tests were conducted to quantify the electromechanical behavior of the resistive strain gage on the patch. The electrical response of the strain gage and the strain applied on the patch were simultaneously recorded during tensile loading. In order to properly attach the UHF patches to the materials testing system, they were embedded in a larger piece of PDMS (see FIG. 28B). Four samples (all from the same wafer) were tested them up to 30% strain. The results of this test are summarized in FIG. 28C along with the theoretical predictions (shown with dashed lines) based on Ohm's law and assuming no volume change during deformation (incompressible materials). The theoretical prediction for the normalized resistance change of the strain gauge may be expressed as $$\frac{\Delta R}{R_0} = \lambda^2 - 1 \quad (1)$$

where $\lambda$ is $L/L_0$, and $L$ and $L_0$ are the instantaneous length and unstretched length of strain gage, respectively. Referring to FIG. 28C, the theory and experimental results generally agreed, as well as consistent resistance vs. strain behavior between different patches. The slight deviation between the theory and experimental results is likely due to the change in contact resistance between the chip pins and the LM strain gage under deformation.

As shown in FIGS. 28D and 28E, the strain gage showed a reversible behavior for various amounts of deformation with negligible hysteresis. The patch was attached onto the wrist portion of a spandex glove with a silicone glue (Sil-Poxy, Smooth-on Inc., US) and obtained real-time data from the strain sensor induced by deformations of the device while the glove was worn. FIG. 28G show the signal obtained by the patch associated with wrist flexion and release for the device mounted on the spandex glove.

The samples were loaded uniaxially up to failure (FIG. 28B), failure occurred at the LM-component-elastomer interface. This failure location may be caused by the strain concentration at the circuit component/elastomer interfaces, as observed before by us and others. Lastly, the strain at failure was about 40% (38.8±3.2%) strain.

Figure 29:
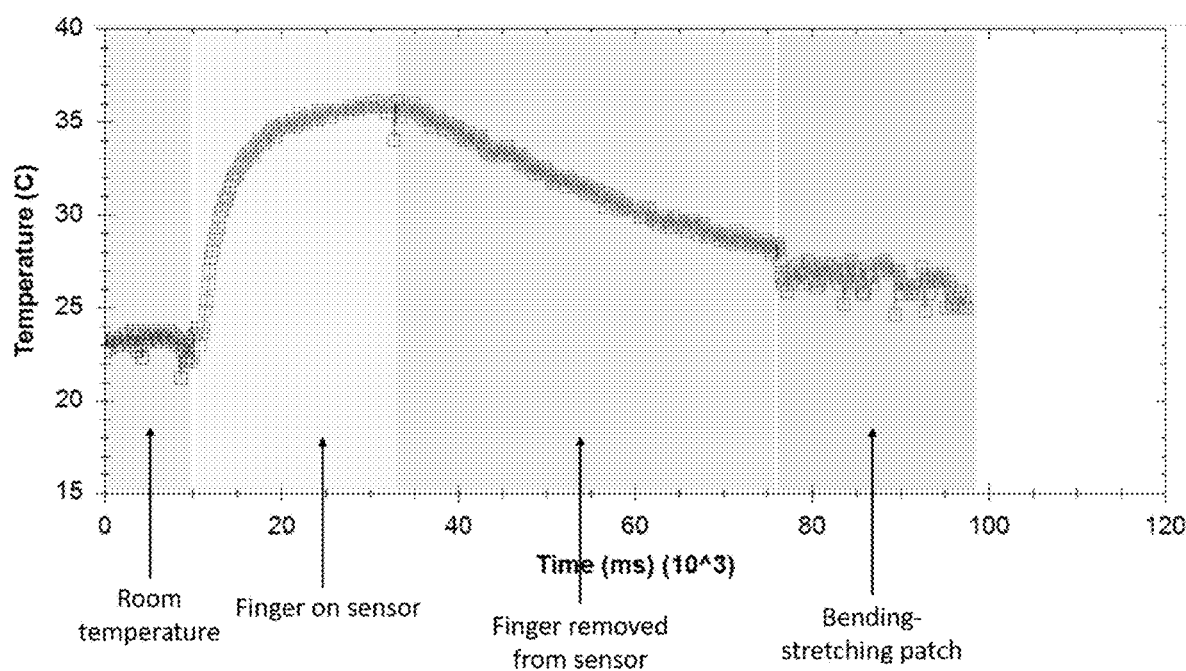
FIG. 29 illustrates characteristics of liquid metal circuits according to the present invention.

Next, the temperature sensor on the patch (integrated in the RFID chip) was characterized to demonstrate that it would operate within its specifications while mounted on a LM circuit. For this experiment, four samples from a single wafer were used. Each LM patch was placed directly at the center surface of a precision hot plate (HS40, Torrey Pines Scientific Inc, USA) and their temperatures were measured wirelessly. At the same time, the temperature of the hot plate was also recorded. The samples were tested between a range of 21° C. to 75° C. in 5° C. increments except for a 4° C. increment between 21° C. and 25° C. 15 minutes elapsed between each data recording to ensure that the temperature had reached equilibrium. As shown in FIG. 28F, the sensor closely followed the hot plate temperature up to 75° C. even though it was rated up to 58° C. by the manufacturer. The slight deviation after 65° C. was likely due to the fact that these temperatures were above the sensor's rated range. FIG. 29 show the real-time temperature measurement obtained from the patch wirelessly. At first, the patch was in room temperature at about 23° C. (see the first region in FIG. 29). When a finger was placed on the sensor the temperature rose to about 36° C. within about 25 seconds (the second region in FIG. 29). Next, the finger was removed and the measured temperature started to decrease towards the room temperature (the third region in FIG. 29). Lastly, bending and stretching was applied to the soft patch and observed that mechanical deformation created a slight noise in the readings within about 1.5° C. due to antenna deformation. As a result of these measurements, it is believed that the temperature sensor operated properly and may be used reliably in LM based RFID circuits. Although other circuit implementations may be possible with this technique, the LM UHF patch demonstrated here adequately captures the scalable fabrication capability of the proposed method in making multifunctional soft and stretchable electrical circuits with integrated microelectronics.

The present invention is directed to the following aspects:

Aspect 1. A high-throughput method of manufacturing a liquid metal circuit, the method comprising: applying a liquid metal to an alloying metal pattern on an elastic substrate to form the liquid metal circuit, wherein the high-throughput method of manufacturing the liquid metal circuit is characterized by at least one of wherein the elastic substrate comprises a surface area greater than 1 square inch, such as greater than 10 square inches (e.g., 16 square inches), greater than 100 square inches, greater than 144 square inches, greater than 256 square inches and greater than 400 square inches; and wherein the liquid metal circuit comprises a plurality of liquid metal circuits on the elastic substrate.

Aspect 2. The method of Aspect 1 comprising fabricating the alloying metal pattern using at least one of photolithography, stencil lithography, chemical etching, and laser micromachining.

Aspect 3. The method of Aspect 1 or Aspect 2 comprising providing a patterned adhesive surface on a surface of the elastic substrate by at least one of chemical surface modification, mechanical surface modification, and applying an adhesion material in a pattern to a surface of the elastic substrate by at least one of photolithography, stencil lithography, sputter deposition, physical vapor deposition, and chemical vapor deposition.

Aspect 4. The method of any of the preceding Aspects comprising applying an alloying metal material to the patterned adhesive surface by at least one of photolithography, stencil lithography, chemical etching, laser micromachining, chemical surface modification of the elastic substrate, and mechanical surface modification of the elastic substrate, wherein the alloying metal material adheres to the patterned adhesion surface to form the alloying metal pattern on the elastic substrate.

Aspect 5. The method of any of the preceding Aspects, wherein applying the liquid metal to the alloying metal pattern comprises exposing the alloying metal pattern to a liquid metal.

Aspect 6. The method of any of the preceding Aspects 5, wherein exposing the alloying metal pattern to the liquid metal comprises at least one of rolling the liquid metal, jetting the liquid metal, brushing the liquid metal, spray deposition, and dipping in a reservoir comprising the liquid metal.

Aspect 7. The method of any of the preceding Aspects, wherein applying the liquid metal to the alloying metal pattern comprises liquid-metal dip coating of the alloying metal pattern into a reservoir comprising the liquid metal.

Aspect 8. The method of any of the preceding Aspects, wherein the alloying metal pattern is immersed into and removed from the reservoir at a dipping orientation independently selected from up to 90 degrees with respect to the alloying metal pattern on a surface of the elastic substrate, such as 0-90 degrees, greater than zero up to 90 degrees, 0-45 degrees, and 45-90 degrees.

Aspect 9. The method of any of the preceding Aspects, wherein the reservoir comprises the liquid metal and an oxide-removing solvent comprising sodium hydroxide, hydrochloric acid, and mixtures thereof.

Aspect 10. The method of any of the preceding Aspects comprising agitating at least one of the reservoir, the liquid metal, and the elastic substrate when the alloying metal pattern is exposed to the liquid metal.

Aspect 11. The method of any of the preceding Aspects, wherein the liquid metal circuit comprises a liquid metal trace having a height to width ratio up to 1, such as 0.1-1, 0.25-1, 0.5-1, 0.75-1, 0.1-0.5, 0.25-0.75, less than 0.5, less than 0.25, wherein the liquid metal trace comprises the liquid metal.

Aspect 12. The method of any of the preceding Aspects, wherein the adhesion material comprises at least one of chromium, titanium and nickel, the alloying material comprises at least one of copper, gold, platinum, palladium, tin, zinc, and iridium, and the liquid metal comprises at least one of gallium, indium, and tin.

Aspect 13. The method of any of the preceding Aspects, wherein the liquid metal circuit comprises a self-healing liquid metal circuit.

Aspect 14. An integrated circuit comprising the liquid metal circuit manufactured according to any of the preceding Aspects.

Aspect 15. A high-throughput method of manufacturing a liquid metal circuit, the method comprising: forming a liquid metal trace on an elastic substrate by exposing an alloying metal pattern on the elastic substrate to a liquid metal; positioning a microelectronic component proximate to the liquid metal trace; and exposing the microelectronic component and the liquid metal trace to a solvent gas to remove oxide from at least one of the microelectronic component and the liquid metal trace, wherein the microelectronic component is substantially aligned with the liquid metal trace after exposing the microelectronic component and the liquid metal trace to the solvent gas; wherein the high-throughput method of manufacturing the liquid metal circuit is characterized by at least one of wherein the elastic substrate comprises a surface area greater than 1 square inch, such as greater than 10 square inches, greater than 100 square inches, greater than 144 square inches, greater than 256 square inches and greater than 400 square inches; and wherein the liquid metal circuit comprises a plurality of liquid metal circuits on the elastic substrate.

Aspect 16. The method of any of the preceding Aspects, wherein the solvent gas comprises at least one of hydrochloric acid, sodium hydroxide, sulfuric acid, and potassium hydroxide.

Aspect 17. The method of any of the preceding Aspects, wherein the microelectronic component comprises a vertical distance between the microelectronic component and the liquid metal trace that is reduced after exposing the microelectronic component and the liquid metal trace to the solvent gas.

Aspect 18. A high-throughput method of manufacturing a liquid metal circuit, the method comprising: liquid-metal dip coating an alloying metal pattern on an elastic substrate into a reservoir comprising a liquid metal, wherein the high-throughput method of manufacturing the liquid metal circuit is characterized by at least one of wherein the elastic substrate comprises a surface area greater than 1 square inch; and wherein the liquid metal circuit comprises a plurality of liquid metal circuits on the elastic substrate.

Aspect 19. The method of any of the preceding Aspects, wherein the alloying metal pattern comprises at least one of copper, gold, platinum, palladium, tin, zinc, and iridium, and the liquid metal comprises at least one of gallium, indium, and tin.

Aspect 20. The method of any of the preceding Aspects, wherein the liquid metal circuit comprises a liquid metal trace having a height to width ratio up to 1, such as 0.1-1, 0.25-1, 0.5-1, 0.75-1, 0.1-0.5, 0.25-0.75, less than 0.5, less than 0.25.

Aspect 21. The method of any of the preceding Aspects, wherein the high-throughput method of manufacturing the liquid metal circuit is characterized by a manufacturing time up to 1 hour, such as less than 60 minutes, less than 30 minutes, less than 15 minutes, less than 10 minutes, less than 5 minutes, less than 1 minute, 1-60 seconds and 1-15 seconds. For example, the high-throughput method of manufacturing the liquid metal circuit is characterized by at least 100 liquid metal circuits/minute, such as at least 200, at least 300, at least 400 and at least 500.

Aspect 22. The method of any of the preceding Aspects, wherein the liquid metal trace has a height of at least 1 micrometer, 2 micrometers, 5 micrometers, 10 micrometer, 15 micrometers, 18 micrometers, 20 micrometers and 25 micrometers.

References

M. D. Dickey, "Emerging applications of liquid metals featuring surface oxides," ACS Appl. Mater. Interfaces, vol. 6, no. 21, pp. 18369-18379, 2014.

Y. Zhang et al., "Experimental and theoretical studies of serpentine microstructures bonded to prestrained elastomers for stretchable electronics," Adv. Funct. Mater., vol. 24, no. 14, pp. 2028-2037, 2014.

M. L. Hammock, A. Chortos, B. C. K. Tee, J. B. H. Tok, and Z. Bao, "25th anniversary articles: The evolution of electronic skin (E-Skin): A brief history, design considerations, and recent progress," Adv. Mater., vol. 25, no. 42, pp. 5997-6038, 2013.

M. D. Dickey, R. C. Chiechi, R. J. Larsen, E. A. Weiss, D. A. Weitz, and G. M. Whitesides, "Eutectic gallium-indium (EGain): A liquid metal alloy for the formation of stable structures in microchannels at room temperature," Adv. Funct. Mater., vol. 18, no. 7, pp. 1097-1104, 2008.

M. Kaltenbrunner et al., "An ultra-lightweight design for imperceptible plastic electronics," Nature, vol. 499, no. 7459, pp. 458-63, 2013.

V. Martinez, F. Stauffer, M. O. Adagunodo, C. Forro, J. Vörös, and A. Larmagnac, "Stretchable Silver Nanowire-Elastomer Composite Microelectrodes with Tailored Electrical Properties," ACS Appt. Mater. Interfaces, vol. 7, no. 24, pp. 13467-13475, 2015.

T. Takahashi, K. Takei, A, G. Gillies, R. S. Fearing, and A. Javey, "Carbon nanotube active-matrix backplanes for conformal electronics and sensors," Nano Lett, vol. 11, no. 12, pp. 5408-5413, 2011.

K. B. Ozutemiz et al., "EGaIn-Metal Interfacing for Liquid Metal Circuitry and Microelectronics Integration," Adv. Mater. Interfaces 2018, 5, 1701596.

D. J. Lipomi et al., "Skin-like pressure and strain sensors based on transparent elastic films of carbon nanotubes," Nat. Nanotechnol., vol. 6, no. 12, pp. 788-92, 2011.

G. Abbati, E. Carone, L. D. Ilario, and A. Martinelli, "Polyurethane-Polyaniline Conducting Graft Copolymer with Improved Mechanical Properties," J. Appl. Polym. Sci., vol. 89, no. Dcc, pp. 2516-2521, 2003.

E. Carone, L. D'Ilario, and A. Martinelli, "New conducting thermoplastic elastomers. I. Synthesis and chemical characterization," J. Appl. Polym. Sci., vol. 83, no. 4, pp. 857-867, 2001.

H. Keum, M. Mccormick, P. Liu, Y. Zhang, and F. G. Omenetto, "RESEARCH ARTICLES Epidermal Electronics," Science (80-.)., vol. 333, no. September, pp. 838-844, 2011.

S. Xu et al., "Stretchabie batteries with self-similar serpentine interconnects and integrated wireless recharging systems," Nat Commun., vol. 4, p. 1543, 2013.

D.-H, Kim et al., "Materials and noncoplanar mesh designs for integrated circuits with linear elastic responses to extreme mechanical deformations," Proc. Natl. Acad. Sci. U.S.A., vol. 105, no. 48, pp. 18675-18680, 2008.

S. P. Lacour, J. Jones, S. Wagner, T. Li, and Z. Suo, "Stretchable Interconnects for Elastic Electronic Surfaces," Proc. IEEE, vol. 93, no. 8, pp. 1459-1466, 2005.

S. Zhu et al., "Ultrastretchable fibers with metallic conductivity using a liquid metal alloy core," Adv. Funct. Mater., vol. 23, no. 18, pp. 2308-2314, 2013.

T. Liu, P. Sen, C. C. J. Kim, and A. C. A. Measurements, "Characterization of Nontoxic Liquid-Metal Alloy Galinstan for Applications in Microdevices," vol. 21, no. 2, pp. 443-450, 2012.

Y. Lu et al., "Transformable liquid-metal nanomedicine," Nat. Commun., vol. 6, no. May, p. 10066, 2015.

Y. Zheng, Z.-Z. He, J. Yang, and J. Liu, "Personal electronics printing via tapping mode composite liquid metal ink delivery and adhesion mechanism," Sci. Rep., vol. 4, p. 4588, 2014.

Q. Wang, Y. Yu, J. Yang, and J. Liu, "Fast Fabrication of Flexible Functional Circuits Based on Liquid Metal Dual-Trans Printing," Adv. Mater., vol. 27, no. 44, pp. 7109-7116, 2015.

J. W. Boley, E. L. White, G. T. C. Chiu, and R. K. Kramer, "Direct writing of gallium-indium alloy forstretchable electronics," Adv. Funct. Mater., vol. 24, no. 23, pp. 3501-3507, 2014.

Y. Zheng, Z. He, Y. Gao, and J. Liu, "Direct desktop Printed-Circuits-on-Paper flexible electronics," Sci. Rep., vol. 3, p. 1786, 2013.

C. Ladd, J. H. So, J. Muth, and M. D. Dickey, "3D printing of free standing liquid metal microstructures," Adv. Mater., vol. 25, no. 36, pp. 5081-5085, 2013.

A. Gannarapu and B. A. Gozen, "Freeze-Printing of Liquid Metal Alloys for Manufacturing of 3D, Conductive, and Flexible Networks," Adv. Mater. Technol., 2016.

Y.-L. Park, C. Majidi, R. Kramer, P. Bérard, and R. J. Wood, "Hyperelastic pressure sensing with a liquid-embedded elastomer," J. Micromechanics Microengineering, vol. 20, no. 12, p. 125029, 2010.

A. Fassler and C. Majidi, "3D structures of liquid-phase Gain alloy embedded in PDMS with freeze casting.," Lab Chip, vol. 13, no. 22, pp. 4442-50, 2013.

A. Fassler and C. Majidi, "Soft-matter capacitors and inductors for hyperelastic strain sensing and stretchable electronics," Smart Mater. Struct, vol. 22, no. 5, p. 55023, 2013.

D. Kim, J. H. Yoo, Y. Lee, W. Choi, K. Yoo, and J. B. J. Lee, "Gallium-based liquid metal inkjet printing" Proc. IEEE Int. Conf. Micro Electro Mech. Syst., pp. 967-970, 2014.

G. Li, X. Wu, and D.-W. Lee, "A galinstan-based inkjet printing system for highly stretchable electronics with self-healing capability," Lab Chip, vol. 16, pp. 1366-1373, 2016.

T. Lu, L. Finkenauer, J. Wissman, and C. Majidi, "Rapid prototyping for soft-matter electronics," Adv. Funct Mater., vol. 24, no. 22, pp. 3351-3356, 2014.

A. Tabatabai, A. Fassler, C. Usiak, and C. Majidi, "Liquid-phase gallium-indium alloy electronics with microcontact printing," Langmuir, vol. 29, no. 20, pp. 6194-6200, 2013.

B. A. Gozen, A. Tabatabai, O. B. Ozdoganlar, and C. Majidi, "High-density soft-matter electronics with micron-scale line width," Adv. Mater., vol. 26, no. 30, pp. 5211-5216, 2014.

Y. R, Jeong et al., "A skin-attachable, stretchable integrated system based on liquid GaInSn for wireless human motion monitoring with multi-site sensing capabilities," NPG Asia Mater., vol. 9, no. 10, p. e443, 2017.

G. Li, X. Wu, and D.-W. Lee, "Selectively Plated Stretchable Liquid Metal Wires for Transparent Electronics," Sensors Actuators B Chem., vol. 221, pp, 1114-1119, 2015.

A. Hirsch, H. O. Michaud, A. P. Gerratt, S. de Mulatier, and S. P. Lacour, "Intrinsically Stretchable Biphasic (Solid-Liquid) Thin Metal Films," Adv. Mater., vol. 28, no. 22, pp. 4507-4512, 2016.

H. J. Kim, T. Maleki, P. Wei, and B. Ziaie, "A biaxial stretchable interconnect with liquid-alloy-covered joints on elastomeric substrate," J. Microelectromechanical Syst., vol. 18, no. 1, pp. 138-146, 2009.

R. K. Kramer, C. Majidi, and R. J. Wood, "Masked deposition of gallium-indium alloys for liquid-embedded elastomer conductors," Adj. Funct. Mater., vol. 23, no. 42, pp. 5292-5296, 2013.

M. G. Kim, H. Alrowais, S. Pavlidis, and O. Brand, "Size-Scalable and High-Density Liquid-Metal-Based Soft Electronic Passive Components and Circuits Using Soft Lithography," Adv. Funct Mater., vol. 27, no. 3, 2017.

Y. G. Moon et al., "Freely Deformable Liquid Metal Grids as Stretchable and Transparent Electrodes," IEEE Trans. Electron Devices, pp. 1-6, 2017.

S. H. Jeong, A. Hagman, K. Hjort, M. Jobs, J. Sundqvist, and Z. Wu, "Liquid alloy printing of microfluidic stretchable electronics," Lab Chip, vol. 12, no. 22, p. 4657, 2012.

J. Wissman, T. Lu, and C. Majidi, "Soft-matter electronics with stencil lithography," Proc. IEEE Sensors, pp. 3-6, 2013.

S. H. Jeong, K. Hjort, and Z. Wu, "Tape Transfer Atomization Patterning of Liquid Alloys for Microfluidic Stretchable Wireless Power Transfer," Sci. Rep., vol. 5, p. 8419, 2015.

M. R. Khan, J. Bell, and M. D. Dickey, "Localized Instabilities of Liquid Metal Films via In-Plane Recapiliarity," Adv. Mater. Interfaces, vol. 3, no. 23, 2016.

H. J. Koo, J. H. So, M. D. Dickey, and O. D. Velev, "Towards all-soft matter circuits: Prototypes of quasi-liquid devices with memristor characteristics," Adv. Mater., vol. 23, no. 31, pp. 3559-3564, 2011.

J. H. So, H. J. Koo, M. D. Dickey, and O. D. Velev, "Ionic current rectification in soft-matter diodes with liquid-metal electrodes," Adv. Funct. Mater., vol. 22, no. 3, pp. 625-631, 2012.

Y. Huang, Y. Wang, L. Xiao, H. Liu, W. Dong, and Z. Yin, "Microfluidic serpentine antennas with designed mechanical tunability," Lab Chip, vol. 14, no. 21, pp. 4205-12, 2014.

J. H. So, J. Thelen, A. Qusba, G. J. Hayes, G. Lazzi, and M. D. Dickey, "Reversibly deformable and mechanically tunable fluidic antennas," Adv. Funct. Mater., vol. 19, no. 22, pp. 3632-3637, 2009.

A. V Diebold et al., "Electrowetting-actuated liquid metal for RF applications," J. Micromechanics Microengineering, vol. 27, no. 2, p. 25010, 2017.

B. Zhang, Q. Dong, C. E. Korman, Z, Li, and M, E. Zaghloul, "Flexible packaging of solid-state integrated circuit chips with elastomeric microfluidics," Sci. Rep., vol. 3, p. 1098, 2013.

C. W. Park et al., "Photolithography-Based Patterning of Liquid Metal interconnects for Monoiithically Integrated Stretchable Circuits," ACS Appl. Mater. Interfaces, p. acsami.6b01896, 2016.

S. Cheng and Z, Wu, "Microfluidic stretchable RF electronics," Lab Chip, vol. 10, no. 23, pp. 3227-3234, 2010.

T. Lu, J. Wissman, Ruthika, and C. Majidi, "Soft anisotropic conductors as electric vias for Ga-based liquid metal circuits," ACS Appl. Mater. Interfaces, vol. 7, no. 48, pp. 26923-26929, 2015.

T. Lu, E. J. Markvicka, Y. Jin, and C. Majidi, "Soft-Matter Printed Circuit Board with UV Laser Micropatterning," ACS Appl. Mater. Interfaces, vol. 9, no. 26, pp. 22055-22062, 2017.

M. D. Dickey, "Stretchable and Soft Electronics using Liquid Metals," Adv. Mater., vol. 29, no. 27, pp. 1-19, 2017.

B. D. Gates, Q, Xu, M. Stewart, D. Ryan, C. G. Willson, and G. M. Whitesides, "New approaches to nanofabrication: Molding, printing, and other techniques," Chem. Rev., vol. 105, no. 4, pp. 1171-1196, 2005.

D. H. Kim, R. Ghaffari, N. Lu, and J. A. Rogers, "Flexible and Stretchable Electronics for Biointegrated Devices," Annu. Rev. Biomed. Eng., vol. 14, no. 1, pp. 113-128, 2012.

D. Y. Khang, J. A. Rogers, and H. H. Lee, "Mechanical buckling: Mechanics, metrology, and stretchable electronics," Adv. Funct. Mater., vol. 19, no. 10, pp. 1526-1536, 2009.

O. Krammer, "Modelling the self-alignment of passive chip components during reflow soldering," Microelectron. Reliab., vol. 54, no. 2, pp. 457-463, 2014.

All documents cited herein are incorporated herein by reference, but only to the extent that the incorporated material does not conflict with existing definitions, statements, or other documents set forth herein. To the extent that any meaning or definition of a term in this document conflicts with any meaning or definition of the same term in a document incorporated by reference, the meaning or definition assigned to that term in this document shall govern. The citation of any document is not to be construed as an admission that it is prior art with respect to this application.

While particular embodiments have been illustrated and described, it would be obvious to those skilled in the art that various other changes and modifications may be made without departing from the spirit and scope of the invention. Those skilled in the art will recognize or be able to ascertain using no more than routine experimentation, numerous equivalents to the specific apparatuses and methods described herein, including alternatives, variants, additions, deletions, modifications and substitutions. This application including the appended claims is therefore intended to cover all such changes and modifications that are within the scope of this application.

What is claimed is:

1. A high-throughput method of manufacturing a liquid metal circuit, the method comprising:
   providing an alloying metal on a circuit pattern on a surface of an elastic substrate to form an alloying metal pattern on the elastic substrate;
   submerging the elastic substrate having the alloying metal pattern into a liquid bath for a dwell time to alloy the liquid metal with the alloying metal pattern, wherein the liquid bath comprises a top layer of an oxide reducing agent and a bottom layer of a liquid metal in an oxide-free state, and wherein the alloying metal pattern contacts the oxide reducing agent before contacting the liquid metal; and withdrawing the elastic substrate from the liquid bath at a removal speed to form the liquid metal circuit having the circuit pattern defined by the alloying metal pattern and a deposition height correlated with the removal speed, wherein the liquid metal is not deposited on the elastic substrate at locations lacking the alloying metal pattern, and wherein the liquid metal deposited on the alloying metal pattern contacts the reducing agent immediately prior to complete removal of the elastic substrate from the liquid bath.

2. The method of claim 1, wherein providing the alloying metal comprises:

depositing the alloying metal on the circuit pattern on the surface of the elastic substrate.

3. The method of claim 1 comprising:

fabricating the circuit pattern from the alloying metal on the surface of the elastic substrate using photolithography, stencil printing, selective deposition, rolling, or contact printing.

4. The method of claim 1 comprising:

agitating the liquid bath when submerging the elastic substrate.

5. The method of claim 1 comprising:

positioning a microelectronic component proximate to the liquid metal circuit.

6. The method of claim 1, wherein the removal speed is from $10^{-1}$ to $10^3$ mm/s.

7. The method of claim 1, wherein the liquid metal circuit comprises:

a height up to 100 micrometers, a width up to 500 micrometers, and a height-to-width ratio from 0.1-100.

8. The method of claim 1, wherein the liquid metal circuit has a height-to-width ratio from 0.1-100.

9. The method of claim 1, wherein the liquid metal circuit has a height-to-width ratio from 0.1-1.

10. The method of claim 1, wherein the removal speed is from $10^{-1}$ to $10^3$ mm/s, and the liquid metal circuit comprises a height up to 100 micrometers and a height-to-width ratio from 0.1-100.

11. The method of claim 1, wherein the elastic substrate comprises a surface area greater than 1 square inch.

12. The method of claim 1, wherein the elastic substrate comprises a plurality of the liquid metal circuits.

13. The method of claim 1, wherein the alloying metal is copper, gold, platinum, palladium, tin, zinc, iridium, or any combinations thereof.

14. The method of claim 1, wherein the liquid metal is gallium, indium, tin, or any combinations thereof.

15. The method of claim 1, wherein the liquid metal is a gallium-indium alloy or a gallium-indium-tin alloy.

16. The method of claim 1, wherein the reducing agent is potassium hydroxide, sodium hydroxide, hydrochloric acid, or any combinations thereof.

17. A high-throughput method of manufacturing a liquid metal circuit, the method comprising:

providing an alloying metal on a circuit pattern on a surface of an elastic substrate to form an alloying metal pattern on the elastic substrate, wherein the alloying metal is copper, gold, platinum, palladium, tin, zinc, iridium, or any combinations thereof;

submerging the elastic substrate having the alloying metal pattern into a liquid bath for a dwell time to alloy the liquid metal with the alloying metal pattern, wherein the liquid bath comprises a top layer of an oxide reducing agent and a bottom layer of a liquid metal in an oxide-free state, wherein the alloying metal pattern contacts the oxide reducing agent before contacting the liquid metal, wherein the reducing agent is potassium hydroxide, sodium hydroxide, hydrochloric acid, or any combinations thereof, and wherein the liquid metal is gallium, indium, tin, or any combinations thereof; and withdrawing the elastic substrate from the liquid bath at a removal speed to form the liquid metal circuit having the circuit pattern defined by the alloying metal pattern and a deposition height correlated with the removal speed, wherein the removal speed is from $10^{-1}$ to $10^3$ mm/s, and the liquid metal circuit comprises a height up to 100 micrometers and a height-to-width ratio from 0.1-100, wherein the liquid metal is not deposited on the elastic substrate at locations lacking the alloying metal pattern, wherein the liquid metal deposited on the alloying metal pattern contacts the reducing agent immediately prior to complete removal of the elastic substrate from the liquid bath.

* * * * *

UNITED STATES PATENT AND TRADEMARK OFFICE
CERTIFICATE OF CORRECTION

| | |
|---|---|
| PATENT NO. | : 11,805,597 B2 |
| APPLICATION NO. | : 16/817176 |
| DATED | : October 31, 2023 |
| INVENTOR(S) | : O Burak Ozdoganlar et al. |

It is certified that error appears in the above-identified patent and that said Letters Patent is hereby corrected as shown below:

In the Specification

On Column 1, Line 13, before TECHNICAL FIELD, please replace the existing paragraph with the following paragraph:
GOVERNMENT RIGHTS
This invention was made with United States government support under N00014-16-2301, N00014-14-10778, and N00014-18-1-2843 awarded by the Office of Naval Research. The U.S. government has certain rights in the invention.

Signed and Sealed this
First Day of October, 2024

Katherine Kelly Vidal
*Director of the United States Patent and Trademark Office*